(12) United States Patent
Yabuki

(10) Patent No.: US 11,594,551 B2
(45) Date of Patent: Feb. 28, 2023

(54) SEMICONDUCTOR MEMORY DEVICE AND METHOD FOR MANUFACTURING SEMICONDUCTOR MEMORY DEVICE

(71) Applicant: Kioxia Corporation, Tokyo (JP)

(72) Inventor: Moto Yabuki, Bunkyo Tokyo (JP)

(73) Assignee: Kioxia Corporation, Tokyo (JP)

( * ) Notice: Subject to any disclaimer, the term of this patent is extended or adjusted under 35 U.S.C. 154(b) by 157 days.

(21) Appl. No.: 17/001,232

(22) Filed: Aug. 24, 2020

(65) Prior Publication Data

US 2021/0091111 A1 Mar. 25, 2021

(30) Foreign Application Priority Data

Sep. 20, 2019 (JP) .............................. JP2019-171712

(51) Int. Cl.
| | |
|---|---|
| *H01L 27/11582* | (2017.01) |
| *H01L 27/11565* | (2017.01) |
| *G11C 7/18* | (2006.01) |
| *G11C 8/14* | (2006.01) |
| *H01L 27/1157* | (2017.01) |

(52) U.S. Cl.
CPC .......... *H01L 27/11582* (2013.01); *G11C 7/18* (2013.01); *G11C 8/14* (2013.01); *H01L 27/1157* (2013.01); *H01L 27/11565* (2013.01)

(58) Field of Classification Search
CPC ................................................ H01L 27/11582
See application file for complete search history.

(56) References Cited

U.S. PATENT DOCUMENTS

| | | | |
|---|---|---|---|
| 8,957,495 B2 | 2/2015 | Sakui | |
| 9,257,552 B2 | 2/2016 | Mizushima | |
| 9,397,110 B2 | 7/2016 | Lue | |
| 9,431,412 B1 | 8/2016 | Kato et al. | |
| 2008/0299773 A1 | 12/2008 | Watanabe | |
| 2013/0207225 A1* | 8/2013 | Sakui ................ | H01L 27/11519 257/E27.081 |

(Continued)

FOREIGN PATENT DOCUMENTS

| | | |
|---|---|---|
| JP | 4551913-62 | 9/2010 |
| JP | 2012-190900 A | 10/2012 |

(Continued)

*Primary Examiner* — Christopher A Johnson
(74) *Attorney, Agent, or Firm* — Foley & Lardner LLP

(57) ABSTRACT

A semiconductor memory device according to an embodiment includes: a stacked body alternately stacking first insulating layers and gate electrode layers in a first direction; first to third semiconductor layers in the stacked body extending in the first direction; first to third charge accumulation layers; and a second insulating layer in the stacked body extending in the first direction, the second insulating layer contacting the first semiconductor layer or the first charge accumulation layer in a plane perpendicular to the first direction. A first distance between two end surfaces of the gate electrode layer monotonically increases in the first direction in a first cross section parallel to the first direction. A second distance between two end surfaces of the gate electrode layer monotonically increases in the first direction, decreases, and then monotonically increases in a second cross section parallel to the first direction different from the first cross section.

9 Claims, 84 Drawing Sheets

(56) References Cited

U.S. PATENT DOCUMENTS

| | | | |
|---|---|---|---|
| 2014/0239376 A1* | 8/2014 | Zhang | H01L 27/1052 438/591 |
| 2014/0284686 A1 | 9/2014 | Murakami | |
| 2018/0019257 A1* | 1/2018 | Son | H01L 23/5283 |
| 2018/0175054 A1 | 6/2018 | Baraskar | |
| 2019/0198522 A1 | 6/2019 | Takekida | |
| 2020/0098767 A1 | 3/2020 | Morooka | |

FOREIGN PATENT DOCUMENTS

| | | |
|---|---|---|
| JP | 2014-187329 A | 10/2014 |
| JP | 2015-053336 A | 3/2015 |
| JP | 2018-163981 A | 10/2018 |
| JP | 2020-047819 A | 3/2020 |
| TW | 201703233 A | 1/2017 |
| TW | 201937708 A | 9/2019 |

* cited by examiner

FIG.2  AA' CROSS SECTION

FIG.3    BB' CROSS SECTION

FIG.5A  CC' CROSS SECTION
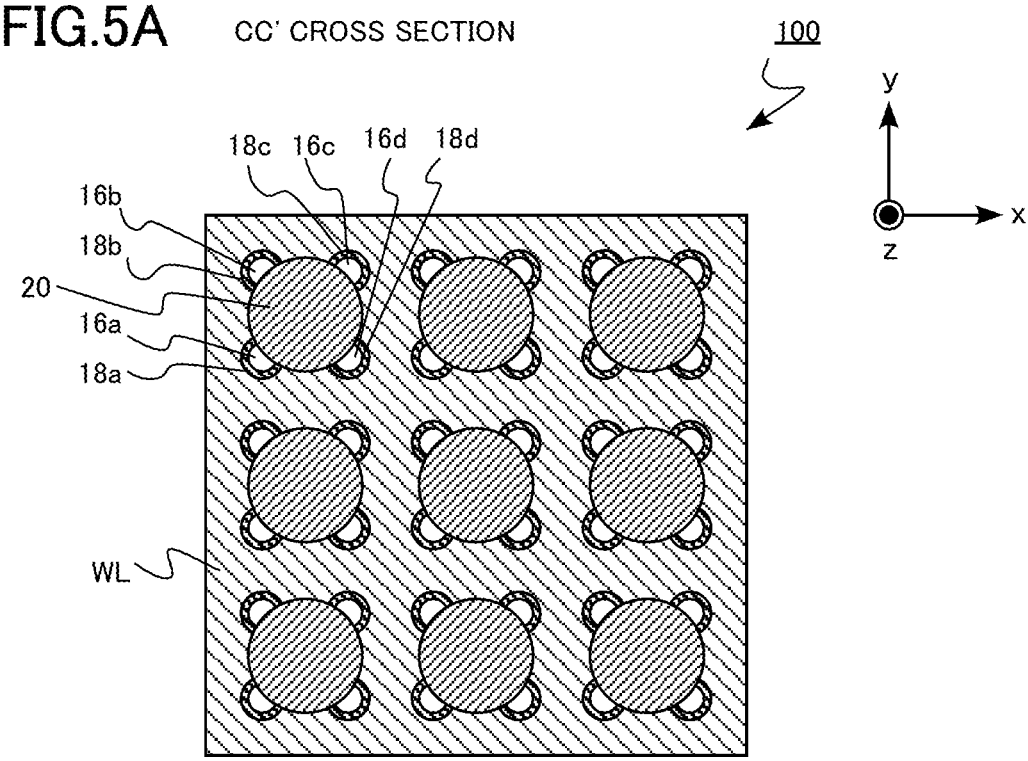
FIG.5B
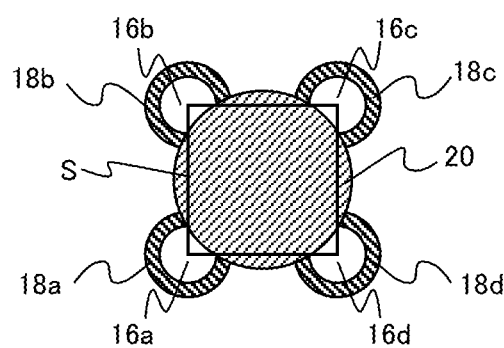
FIG.5C
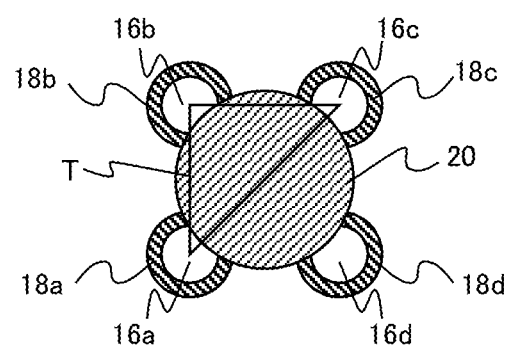

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

FIG. 30  AA' CROSS SECTION

FIG.31  BB' CROSS SECTION

CC' CROSS SECTION: FIRST PLANE P1

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

AA' CROSS SECTION

FIG.57   BB' CROSS SECTION

FIG.60  AA' CROSS SECTION

FIG.61 BB' CROSS SECTION

CC' CROSS SECTION

FIG.65    AA' CROSS SECTION

FIG. 66  BB' CROSS SECTION

FIG. 67  AA' CROSS SECTION

FIG. 68    BB' CROSS SECTION

FIG. 70  AA' CROSS SECTION

FIG.71  BB' CROSS SECTION

FIG.72  AA' CROSS SECTION

FIG. 73    BB' CROSS SECTION

FIG.75    AA' CROSS SECTION

FIG. 76  BB' CROSS SECTION

FIG.77  AA' CROSS SECTION

FIG.78 BB' CROSS SECTION

FIG. 79  AA' CROSS SECTION

FIG.80  BB' CROSS SECTION

SEMICONDUCTOR MEMORY DEVICE AND METHOD FOR MANUFACTURING SEMICONDUCTOR MEMORY DEVICE

CROSS-REFERENCE TO RELATED APPLICATION

This application is based upon and claims the benefit of priority from Japanese Patent Application No. 2019-171712, filed on Sep. 20, 2019, the entire contents of which are incorporated herein by reference.

FIELD

Embodiments described herein relate generally to a semiconductor memory device and a method for manufacturing a semiconductor memory device.

BACKGROUND

A three-dimensional NAND flash memory in which memory cells are three-dimensionally arranged increases the degree of integration and reduces manufacturing costs. The three-dimensional NAND flash memory may be manufactured, for example, by alternately stacking a plurality of insulating layers and a plurality of gate electrode layers to form a stacked body, forming memory holes penetrating through the stacked body, and forming charge accumulation layers and semiconductor layers in the memory holes to form memory strings in which a plurality of memory cells are connected in series to each other. The capacity of the three-dimensional NAND flash memory may be further increased by increasing the number of gate electrodes stacked in the stacked body or scaling-down the size of the memory hole.

BRIEF DESCRIPTION OF THE DRAWINGS

FIGS. 5A, 5B, and 5C are views schematically illustrating a portion of the memory cell array of the semiconductor memory device according to the first embodiment;

DETAILED DESCRIPTION

Figure 1:
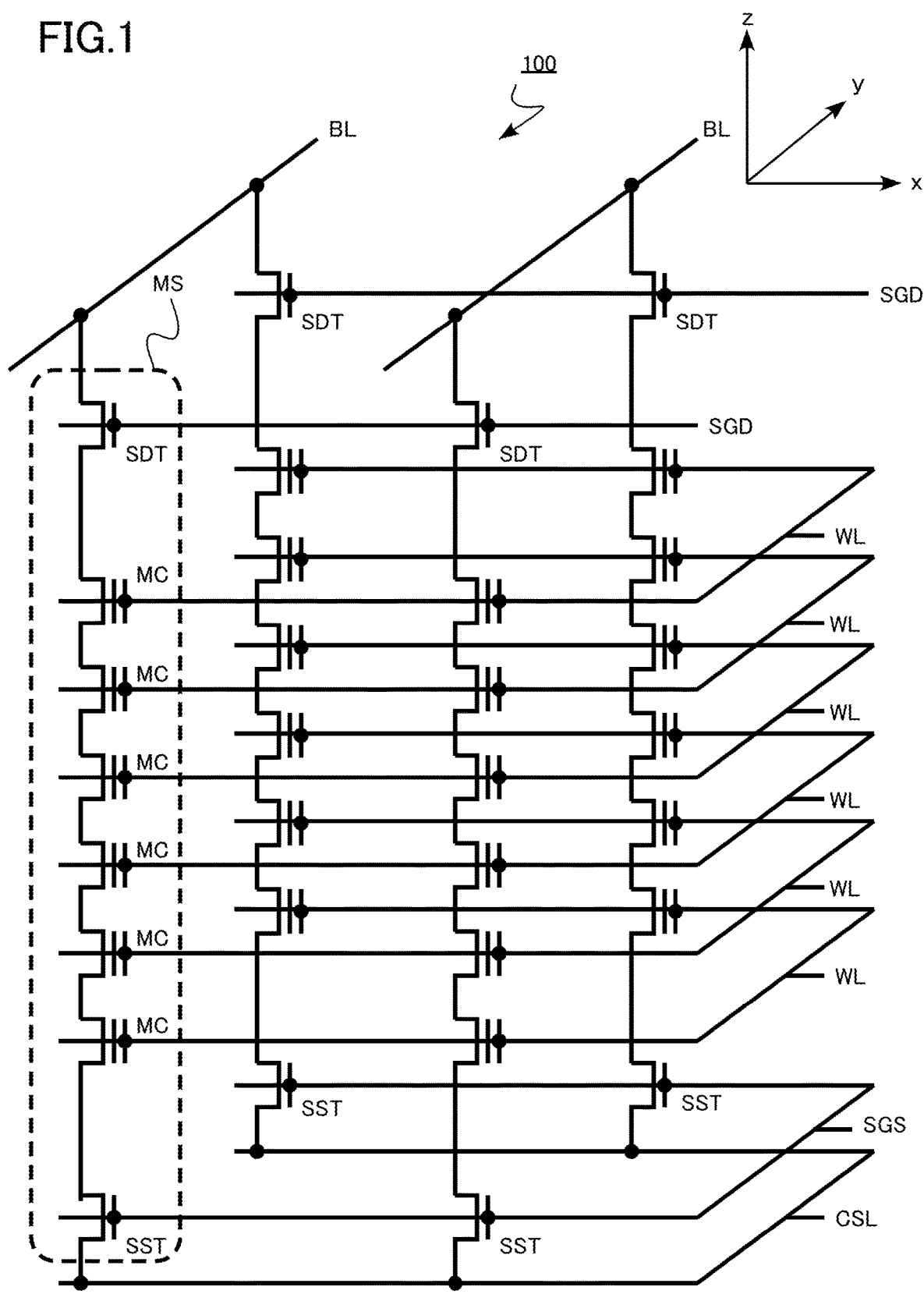
FIG. 1 is a circuit diagram illustrating a memory cell array of a semiconductor memory device according to a first embodiment.

A semiconductor memory device according to an embodiment includes: a stacked body including a plurality of first insulating layers and a plurality of gate electrode layers alternately stacked in a first direction; a first semiconductor layer provided in the stacked body, the first semiconductor layer extending in the first direction; a second semiconductor layer provided in the stacked body, the second semiconductor layer extending in the first direction; a third semiconductor layer provided in the stacked body, the third semiconductor layer extending in the first direction; a first charge accumulation layer provided between the gate electrode layers and the first semiconductor layer; a second charge accumulation layer provided between the gate electrode layers and the second semiconductor layer; a third charge accumulation layer provided between the gate electrode layers and the third semiconductor layer; and a second insulating layer provided in the stacked body, the second insulating layer extending in the first direction, the second insulating layer being in contact with the first semiconductor layer or the first charge accumulation layer in a plane perpendicular to the first direction, the second insulating layer being in contact with the second semiconductor layer or the second charge accumulation layer in the plane, and the second insulating layer being in contact with the third semiconductor layer or the third charge accumulation layer in the plane, the plane including one of the gate electrode layers, wherein a first distance between two end surfaces of the gate electrode layers having the second insulating layer interposed therebetween monotonically increases from a first gate electrode layer among the gate electrode layers to a second gate electrode layer among the gate electrode layers in a first cross section parallel to the first direction, the second gate electrode layer being separated from the first gate electrode layer in the first direction, the first cross section including the second insulating layer, and a second distance between two end surfaces of the gate electrode layers having the second insulating layer interposed therebetween monotonically increases from the first gate electrode layer in the first direction, decreases, and monotonically increases toward the second gate electrode layer in a second cross section parallel to the first direction, the second cross section including the second insulating layer, the second cross section being different from the first cross section.

Hereinafter, embodiments will be described with reference to the drawings. In the following description, for example, the same or similar members are denoted by the same reference numerals and the description of the members that have been described once will be appropriately omitted.

In the specification, in some cases, the term "upper" or "lower" may be used for convenience. The term "upper" or "lower" indicates a relative positional relationship in the drawings and does not define a positional relationship with respect to gravity.

Qualitative analysis and quantitative analysis for the chemical composition of members forming the semiconductor memory device in the specification can be performed by, for example, secondary ion mass spectroscopy (SIMS) or energy dispersive X-ray spectroscopy (EDX). In addition, for example, the thickness of the members forming the semiconductor memory device and the distance between the members can be measured using, for example, images acquired by a scanning electron microscope (SEM) or a transmission electron microscope (TEM).

First Embodiment

A semiconductor memory device according to a first embodiment includes: a stacked body including a plurality of first insulating layers and a plurality of gate electrode layers alternately stacked in a first direction; a first semiconductor layer provided in the stacked body, the first semiconductor layer extending in the first direction; a second semiconductor layer provided in the stacked body, the second semiconductor layer extending in the first direction; a third semiconductor layer provided in the stacked body, the third semiconductor layer extending in the first direction; a first charge accumulation layer provided between the gate electrode layers and the first semiconductor layer; a second charge accumulation layer provided between the gate electrode layers and the second semiconductor layer; a third charge accumulation layer provided between the gate electrode layers and the third semiconductor layer; and a second insulating layer provided in the stacked body, the second insulating layer extending in the first direction, the second insulating layer being in contact with the first semiconductor layer or the first charge accumulation layer in a plane perpendicular to the first direction, the second insulating layer being in contact with the second semiconductor layer or the second charge accumulation layer in the plane, and the second insulating layer being in contact with the third semiconductor layer or the third charge accumulation layer in the plane, the plane including one of the gate electrode layers. A first distance between two end surfaces of the gate electrode layer having the second insulating layer interposed therebetween monotonically increases from a first gate electrode layer among the gate electrode layers to a second gate electrode layer among the gate electrode layers in a first cross section parallel to the first direction, the second gate electrode layer being separated from the first gate electrode layer in the first direction, the first cross section including the second insulating layer. A second distance between two end surfaces of the gate electrode layer having the second insulating layer interposed therebetween monotonically increases from the first gate electrode layer in the first direction, decreases, and monotonically increases toward the second gate electrode layer in a second cross section parallel to the first direction, the second cross section including the second insulating layer, the second cross section being different from the first cross section.

The semiconductor memory device according to the first embodiment is a three-dimensional NAND flash memory. In the semiconductor memory device according to the first embodiment, a charge accumulation layer of a memory cell MC has a stacked structure of insulating films. In the semiconductor memory device according to the first embodiment, the memory cell MC is a so-called metal-oxide-nitride-oxide-semiconductor (MONOS) memory cell.

FIG. 1 is a circuit diagram illustrating a memory cell array of the semiconductor memory device according to the first embodiment.

As illustrated in FIG. 1, a memory cell array 100 of the three-dimensional NAND flash memory according to the first embodiment includes a plurality of word lines WL (gate electrode layer), a common source line CSL, a source select gate line SGS, a plurality of drain select gate lines SGD, a plurality of bit lines BL, and a plurality of memory strings MS.

The plurality of word lines WL are disposed so as to be stacked in the z direction. The plurality of memory strings MS extend in the z direction. The plurality of bit lines BL extend in, for example, the y direction.

Hereinafter, the x direction is defined as a second direction, the y direction is defined as a third direction, and the z direction is defined as a first direction. For example, the x direction, the y direction, and the z direction are perpendicular to each other.

As illustrated in FIG. 1, the memory string MS includes a source select transistor SST, a plurality of memory cells MC, and a drain select transistor SDT connected in series to each other between the common source line CSL and the bit line BL. One bit line BL and one drain select gate line SGD are selected to select one memory string MS and one word line WL is selected to select one memory cell MC. The word line WL is a gate electrode of a memory cell transistor forming the memory cell MC.

Figure 2:
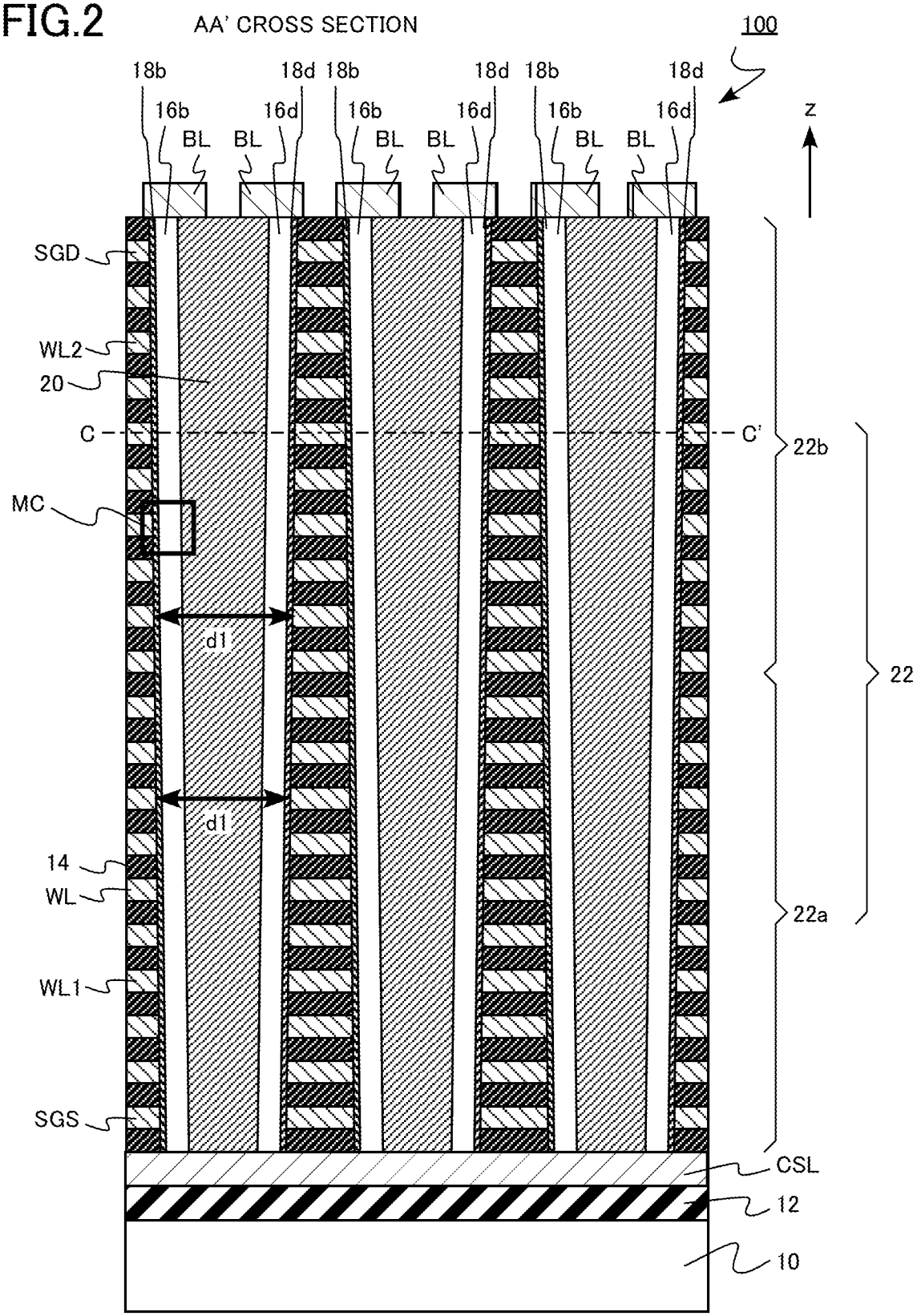
FIG. 2 is a view schematically illustrating a portion of the memory cell array of the semiconductor memory device according to the first embodiment.
Figure 3:
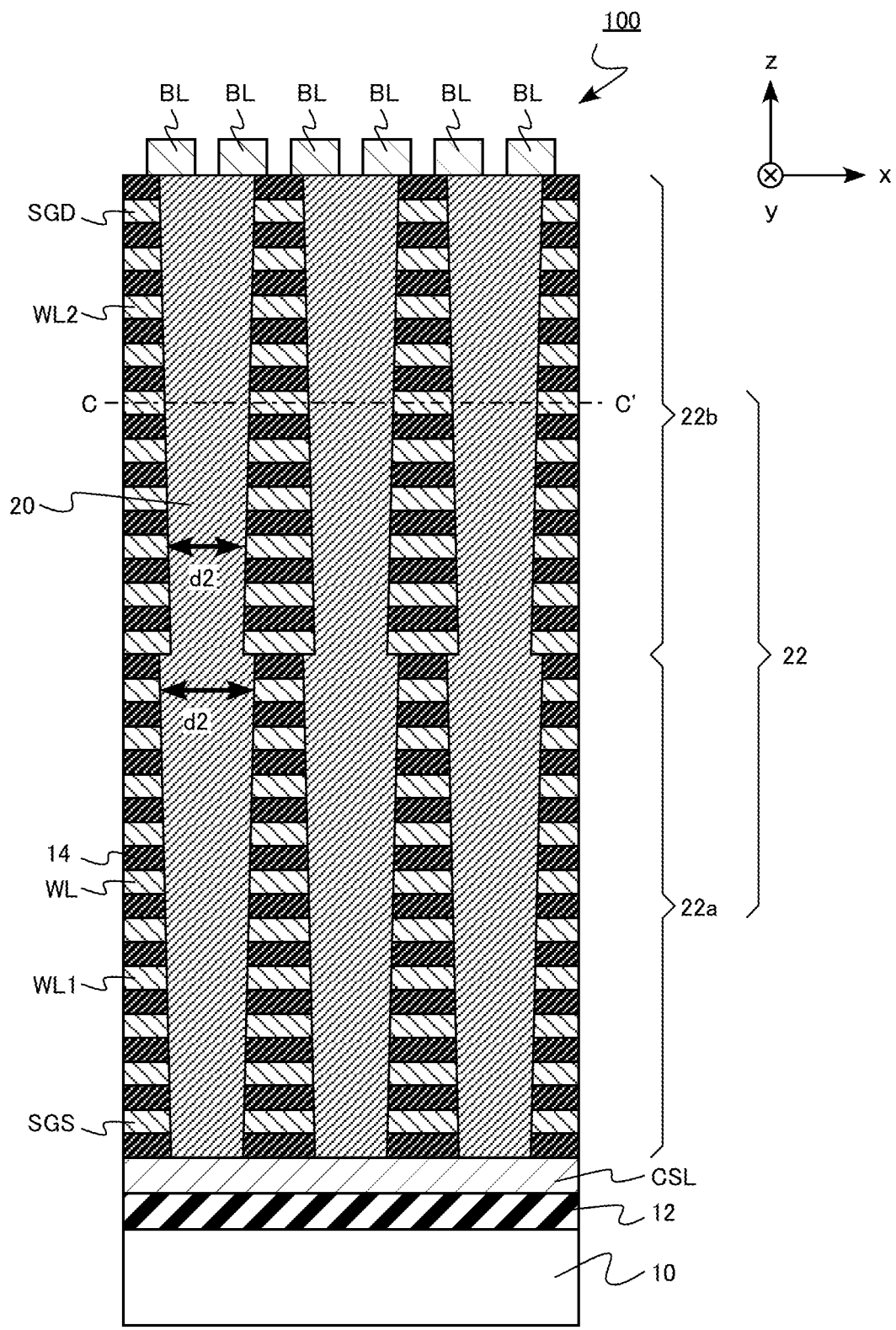
FIG. 3 is a view schematically illustrating a portion of the memory cell array of the semiconductor memory device according to the first embodiment.
Figure 4:
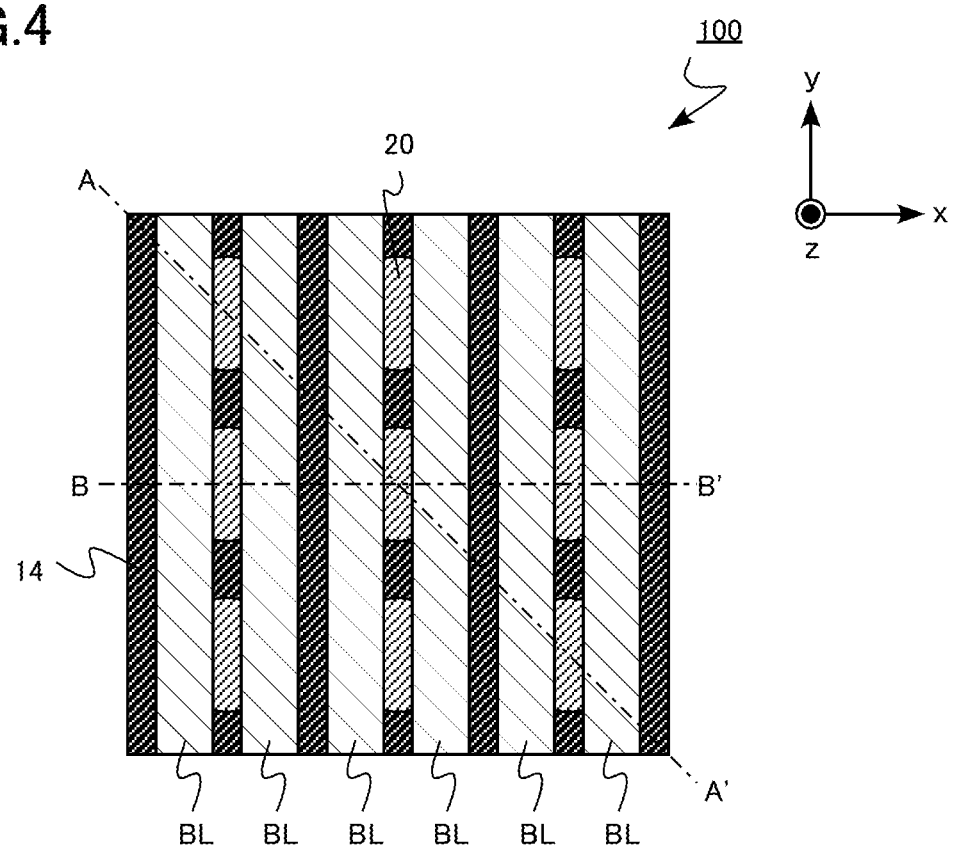
FIG. 4 is a view schematically illustrating a portion of the memory cell array of the semiconductor memory device according to the first embodiment.

FIG. 2, FIG. 3, FIG. 4, FIG. 5A, FIG. 5B, and FIG. 5C are views schematically illustrating a portion of the memory cell array of the semiconductor memory device according to the first embodiment. FIG. 2, FIG. 3, FIG. 5A, FIG. 5B, and FIG. 5C are cross-sectional views and FIG. 4 is a top view.

FIG. 2 illustrates a cross section of the memory cell array 100 parallel to the z direction. FIG. 2 illustrates the cross section taken along the line AA' of FIG. 4. FIG. 2 illustrates an example of a first cross section. In FIG. 2, a region surrounded by a rectangle is one memory cell MC.

FIG. 3 illustrates a cross section of the memory cell array 100 parallel to the x direction and the z direction. FIG. 3 illustrates the xz cross section of the memory cell array 100. FIG. 3 illustrates the cross section taken along the line BB' of FIG. 4. FIG. 3 illustrates an example of a second cross section.

FIG. 4 is a top view illustrating the memory cell array 100. FIGS. 5A to 5C illustrate the cross sections of the memory cell array 100 parallel to the x direction and the y direction. FIG. 5A illustrates the cross section of the memory cell array 100 perpendicular to the z direction. FIG. 5A illustrates the cross section taken along the line CC' of FIG. 2 and FIG. 3. FIGS. 5A to 5C illustrate the cross sections perpendicular to the z direction (first direction), the cross sections including the word line WL (gate electrode layer). FIG. 5B and FIG. 5C are enlarged views illustrating a portion of FIG. 5A.

Figure 6:
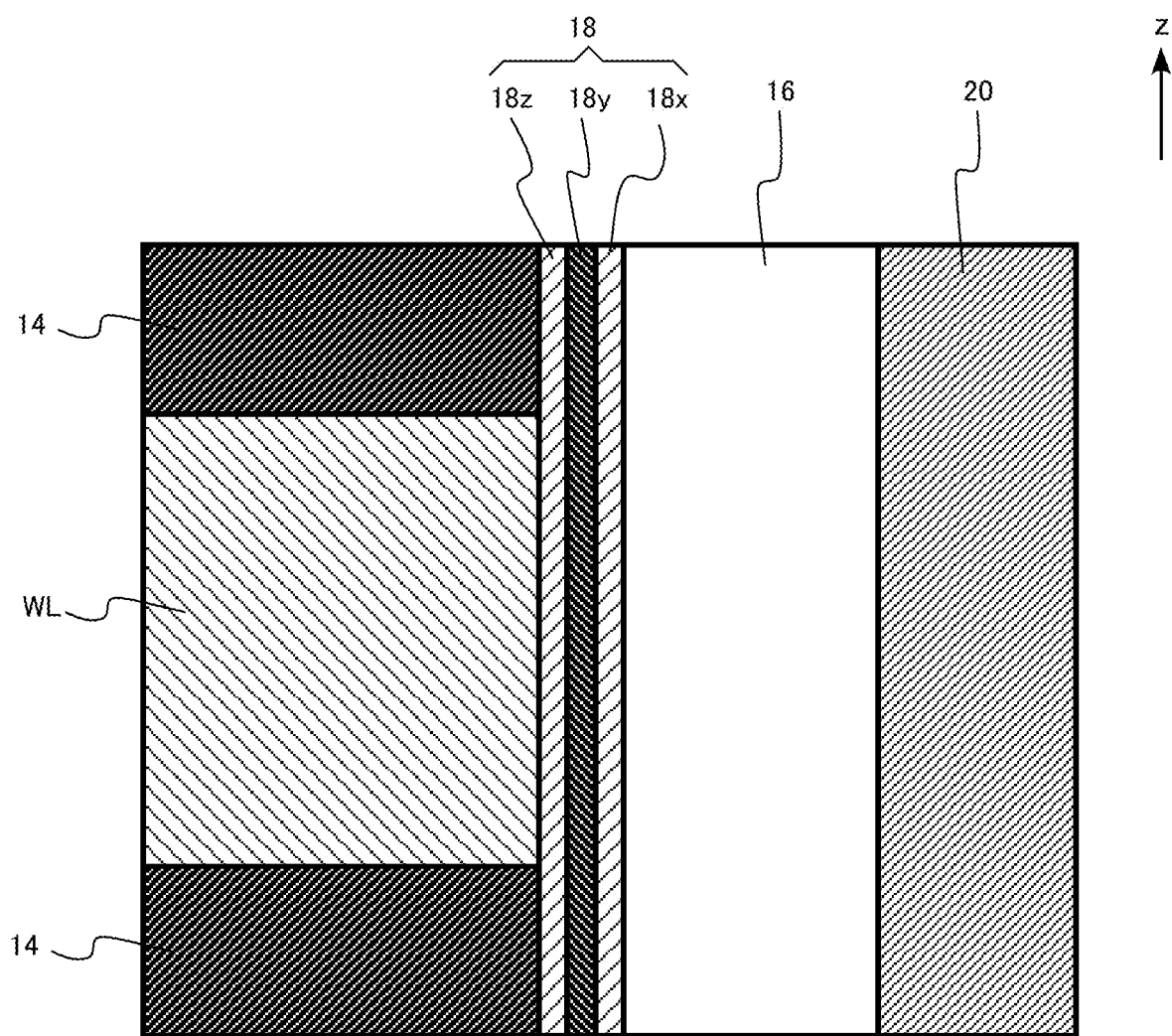
FIG. 6 is a cross-sectional view schematically illustrating a memory cell of the semiconductor memory device according to the first embodiment.

FIG. 6 is a cross-sectional view schematically illustrating the memory cell of the semiconductor memory device according to the first embodiment. FIG. 6 is a cross-sectional view illustrating the memory cell MC. FIG. 6 illustrates a cross section of the memory cell MC parallel to the z direction. FIG. 6 corresponds to the region (MC in FIG. 2) surrounded by the rectangle in FIG. 2.

As illustrated in FIG. 2, FIG. 3, FIG. 4, FIG. 5A, FIG. 5B, and FIG. 5C, the memory cell array 100 includes a semiconductor substrate 10, a substrate insulating layer 12, the common source line CSL, the source select gate line SGS, the drain select gate line SGD, the plurality of word lines WL (gate electrode layers), a plurality of interlayer insulating layers 14 (first insulating layers), a first channel layer 16a (first semiconductor layer), a second channel layer 16b (second semiconductor layer), a third channel layer 16c (third semiconductor layer), a fourth channel layer 16d (fourth semiconductor layer), a first charge accumulation layer 18a, a second charge accumulation layer 18b, a third charge accumulation layer 18c, a fourth charge accumulation layer 18d, a central insulating layer 20 (second insulating layer), and the plurality of bit lines BL.

In the following description, in some cases, the first channel layer 16a (first semiconductor layer), the second channel layer 16b (second semiconductor layer), the third channel layer 16c (third semiconductor layer), and the fourth channel layer 16d (fourth semiconductor layer) are generically referred to as channel layers 16. In addition, in some cases, the first charge accumulation layer 18a, the second charge accumulation layer 18b, the third charge accumulation layer 18c, and the fourth charge accumulation layer 18d are generically referred to as charge accumulation layers 18.

A stacked body 22 includes the plurality of word lines WL and the plurality of interlayer insulating layers 14. The stacked body 22 has a first region 22a and a second region 22b. The second region 22b is located in the z direction (first direction) with respect to the first region 22a.

The semiconductor substrate 10 is, for example, a silicon substrate.

The substrate insulating layer 12 is provided on the semiconductor substrate 10. The substrate insulating layer 12 is made of, for example, silicon oxide.

The common source line CSL is provided on the substrate insulating layer 12. The common source line CSL is made of, for example, metal or a semiconductor.

The stacked body 22 is provided on the common source line CSL.

The interlayer insulating layer 14 and the word line WL, the source select gate line SGS, or the drain select gate line SGD are alternately stacked above the semiconductor substrate 10 in the z direction (first direction). Among the word line WL, the source select gate line SGS, and the drain select gate line SGD alternately stacked in the z direction (first direction), a layer closest to the semiconductor substrate 10 is the source select gate line SGS and a layer farthest from the semiconductor substrate 10 is the drain select gate line SGD. The word line WL is provided between the source select gate line SGS and the drain select gate line SGD. The word line WL, the source select gate line SGS, and the drain select gate line SGD are disposed so as to be separated from each other in the z direction. The stacked body 22 includes the plurality of word lines WL, the source select gate line SGS, the drain select gate line SGD, and the plurality of interlayer insulating layers 14.

The word line WL, the source select gate line SGS, and the drain select gate line SGD are, for example, plate-shaped conductors. The word line WL, the source select gate line SGS, and the drain select gate line SGD include, for example, metal, metal nitride, metal carbide, or a semiconductor. For example, tungsten (W), titanium (Ti), or tantalum (Ta) can be used as the metal. For example, polysilicon can be used as the semiconductor. The word line WL, the source select gate line SGS, the drain select gate line SGD may include barrier metal such as titanium nitride or tantalum nitride.

The word line WL functions as a control electrode of a transistor in the memory cell MC. The word line WL is an example of the gate electrode layer.

The interlayer insulating layer 14 separates the word lines WL from each other, separates the source select gate line SGS from the word line WL, and separates the drain select gate line SGD from the word line WL. The inter layer insulating layer 14 can be made of, for example, oxide, oxynitride, or nitride. The interlayer insulating layer 14 includes, for example, silicon oxide.

The channel layer 16 is provided in the stacked body 22. The channel layer 16 extends in the z direction. The first channel layer 16a is provided in the stacked body 22 and extends in the z direction. The second channel layer 16b is provided in the stacked body 22 and extends in the z direction. The third channel layer 16c is provided in the stacked body 22 and extends in the z direction. The fourth channel layer 16d is provided in the stacked body 22 and extends in the z direction. In addition, the direction in which the channel layer 16 extends may not be necessarily completely aligned with the first direction. For example, the direction in which the channel layer 16 extends may be in the range of 5 degrees with respect to the first direction.

The channel layer 16 is made of, for example, a polycrystalline semiconductor. For example, polysilicon is used as the polycrystalline semiconductor. The channel layer 16 functions as a channel region of a transistor in the memory cell MC.

The charge accumulation layer 18 is provided between the word line WL and the channel layer 16. The first charge accumulation layer 18a is provided between the word line WL and the first channel layer 16a. The second charge accumulation layer 18b is provided between the word line WL and the second channel layer 16b. The third charge accumulation layer 18c is provided between the word line WL and the third channel layer 16c. The fourth charge accumulation layer 18d is provided between the word line WL and the fourth channel layer 16d.

As illustrated in FIG. 6, for example, the charge accumulation layer 18 has a tunnel insulating film 18x, a charge trap film 18y, and a block insulating film 18z. The charge trap film 18y is provided between the tunnel insulating film 18x and the block insulating film 18z. For example, a silicon oxide film, a silicon nitride film, and a silicon oxide film are used as the tunnel insulating film 18x, the charge trap film 18y, and the block insulating film 18z, respectively.

The tunnel insulating film 18x has a function of selectively transmitting charge. The charge trap film 18y has a function of trapping and accumulating charge. The block insulating film 18z has a function of blocking a current flowing between the charge trap film 18y and the word line WL. The memory cell MC is a so-called MONOS memory cell.

The charge accumulation layer 18 is provided along a side surface of the channel layer 16. The charge accumulation layer 18 may also be provided between the channel layer 16 and the interlayer insulating layer 14. The charge accumulation layer 18 may be provided between the memory cells MC adjacent to each other in the z direction without being divided.

A threshold voltage of the transistor in the memory cell MC changes depending on the amount of charge accumulated in the charge accumulation layer 18. The use of the change in the threshold voltage makes it possible to store data in one memory cell MC.

For example, when the threshold voltage of the transistor in the memory cell MC changes, the on-voltage of the transistor changes. For example, when a state in which the threshold voltage is high is defined as data "0" and a state in which the threshold voltage is low is defined as data "1", the memory cell MC can store 1-bit data of "0" or "1".

The central insulating layer 20 is provided in the stacked body 22. The central insulating layer 20 extends in the z direction. The central insulating layer 20 penetrates through, for example, the stacked body 22.

The central insulating layer 20 is an insulator. The central insulating layer 20 is made of, for example, oxide, oxynitride, or nitride. The central insulating layer 20 is made of, for example, silicon oxide.

As illustrated in FIG. 5A, FIG. 5B, and FIG. 5C, the central insulating layer 20 comes into contact with a plurality of channel layers 16 or a plurality of charge accumulation layers 18 in a plane perpendicular to the z direction, the plane including the word line WL. The plurality of channel layers 16 and the plurality of charge accumulation layers 18 are provided outside the central insulating layer 20. The plurality of channel layers 16 and charge accumulation layers 18 are provided so as to surround the central insulating layer 20.

As illustrated in FIG. 5A, FIG. 5B, and FIG. 5C, four channel layers 16 are disposed around the central insulating layer 20. The central insulating layer 20 is surrounded by the four channel layers 16.

As illustrated in FIG. 5A, FIG. 5B, and FIG. 5C, the central insulating layer 20 comes into contact with the first channel layer 16a or the first charge accumulation layer 18a, the second channel layer 16b or the second charge accumulation layer 18b, the third channel layer 16c or the third charge accumulation layer 18c, and the fourth channel layer 16d or the fourth charge accumulation layer 18d in the plane perpendicular to the z direction, the plane including the word line WL. In particular, FIG. 5A, FIG. 5B, and FIG. 5C illustrate a case where the central insulating layer 20 comes into contact with the first channel layer 16a and the first charge accumulation layer 18a, the second channel layer 16b and the second charge accumulation layer 18b, the third channel layer 16c and the third charge accumulation layer 18c, and the fourth channel layer 16d and the fourth charge accumulation layer 18d.

As illustrated in FIG. 5B, the central insulating layer 20 is located in a region (a region S in FIG. 5B) surrounded by a line segment connecting the first channel layer 16a and the second channel layer 16b, a line segment connecting the second channel layer 16b and the third channel layer 16c, a line segment connecting the third channel layer 16c and the fourth channel layer 16d, and a line segment connecting the fourth channel layer 16d and the first channel layer 16a in the plane perpendicular to the z direction, the plane including the word line WL. In addition, as illustrated in FIG. 5C, the central insulating layer 20 is located in a region (a region T in FIG. 5C) surrounded by a line segment connecting the first channel layer 16a and the second channel layer 16b, a line segment connecting the second channel layer 16b and the third channel layer 16c, and a line segment connecting the third channel layer 16c and the first channel layer 16a in the plane perpendicular to the z direction, the plane including the word line WL.

As illustrated in FIG. 2, a first distance (d1 in FIG. 2) between two end surfaces of the same word line WL, between which the central insulating layer 20 is interposed, monotonically increases, for example, from a first word line WL1 to a second word line WL2 in the z direction in a first cross section parallel to the z direction, the first cross section including the central insulating layer 20. In other words, the first distance d1 monotonically increases from the first region 22a to the second region 22b of the stacked body 22 in the z direction. The first distance d1 monotonically increases from the semiconductor substrate 10 to the bit line BL.

In contrast, as illustrated in FIG. 3, a second distance (d2 in FIG. 3) between two end surfaces of the same word line WL, between which the central insulating layer 20 is interposed, monotonically increases, for example, from the first word line WL1, decreases, and then monotonically increases toward the second word line WL2 in the z direction in a second cross section parallel to the z direction, the second cross section including the central insulating layer 20, and the second cross section being different from the first cross section. In the first region 22a of the stacked body 22, the second distance d2 monotonically increases. In addition, in the second region 22b of the stacked body 22, the second distance d2 monotonically increases.

However, a change in the second distance d2 between the first region 22a and the second region 22b is discontinuous. The second distance d2 decreases once between the first region 22a and the second region 22b.

The second distance d2 between two end surfaces of the lowermost word line WL in the second region 22b is less than the second distance d2 between two end surfaces of the uppermost word line WL in the first region 22a. For example, the second distance d2 between two end surfaces of the lowermost word line WL in the second region 22b is equal to or less than 90% of the second distance d2 between two end surfaces of the uppermost word line WL in the first region 22a.

The first cross section includes at least one of the first channel layer 16a, the second channel layer 16b, the third channel layer 16c, and the fourth channel layer 16d. In addition, the second cross section does not include any of the first channel layer 16a, the second channel layer 16b, the third channel layer 16c, and the fourth channel layer 16d.

A plurality of bit lines BL are provided on the stacked body 22. The bit lines BL extend in the y direction. The bit line BL includes, for example, metal, metal nitride, metal carbide, or a semiconductor. For example, tungsten (W), titanium (Ti), or tantalum (Ta) can be used as the metal. For example, polysilicon can be used as the semiconductor. The bit line BL may include barrier metal such as titanium nitride or tantalum nitride.

Next, an example of a method for manufacturing the semiconductor memory device according to the first embodiment will be described. FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, FIG. 25, and FIG. 26 are views schematically illustrating the method for manufacturing the semiconductor memory device according to the first embodiment. FIG. 7, FIG. 8, FIG. 10, FIG. 11, FIG. 12, FIG. 13, FIG. 14, FIG. 16, FIG. 17, FIG. 18, FIG. 20, FIG. 21, FIG. 23, FIG. 24, FIG. 25, and FIG. 26 are cross-sectional views illustrating a cross section corresponding to FIG. 2. FIG. 9, FIG. 15, FIG. 19, and FIG. 22 are top views corresponding to FIG. 8, FIG. 14, FIG. 18, and FIG. 21, respectively.

Figure 7:
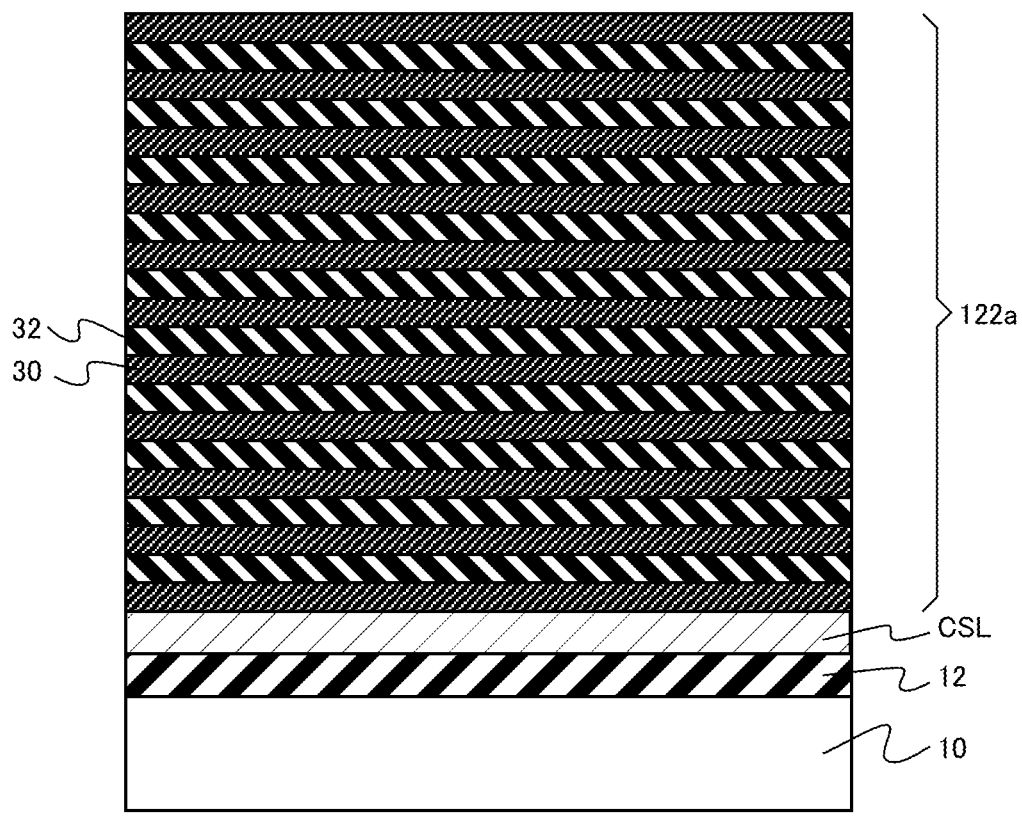
FIG. 7 is a view schematically illustrating a method for manufacturing the semiconductor memory device according to the first embodiment.

First, the substrate insulating layer 12 and the common source line CSL are formed on the semiconductor substrate 10. The substrate insulating layer 12 is, for example, a silicon oxide layer. Then, silicon oxide layers 30 (first layers) and silicon nitride layers 32 (second layers) are alternately stacked on the common source line CSL (FIG. 7). The silicon oxide layers 30 and the silicon nitride layers 32 form a first region 122a of a stacked body 122.

The silicon oxide layers 30 and the silicon nitride layers 32 are formed by, for example, a chemical vapor deposition method (CVD method). A portion of the silicon oxide layer 30 finally becomes the interlayer insulating layer 14.

The silicon nitride layer 32 is a sacrifice layer. The silicon nitride layers 32 are finally substituted with conductive layers and become the word line WL, the source select gate line SGS, and the drain select gate line SGD.

Figure 8:
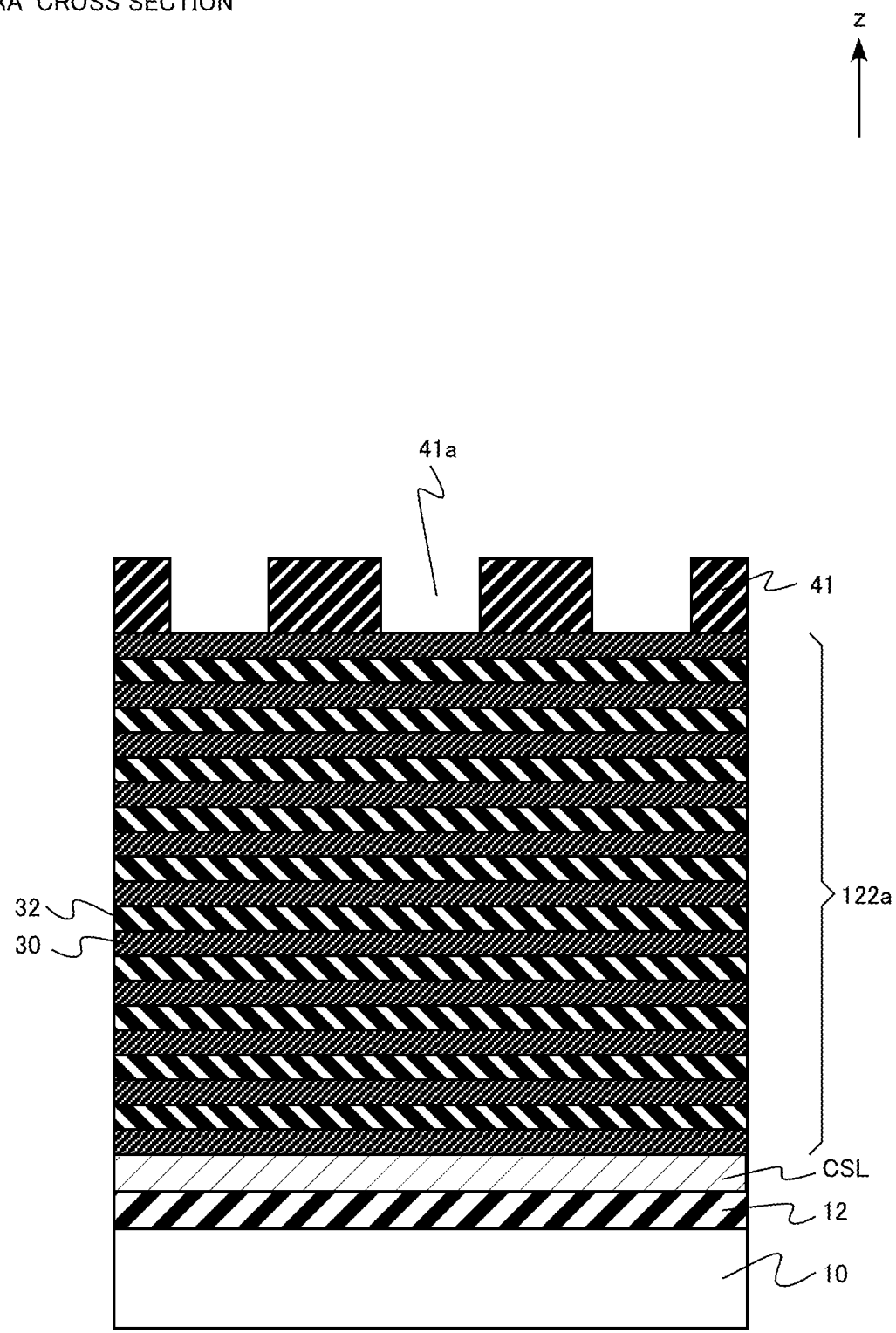
FIG. 8 is a view schematically illustrating the method for manufacturing the semiconductor memory device according to the first embodiment.
Figure 9:
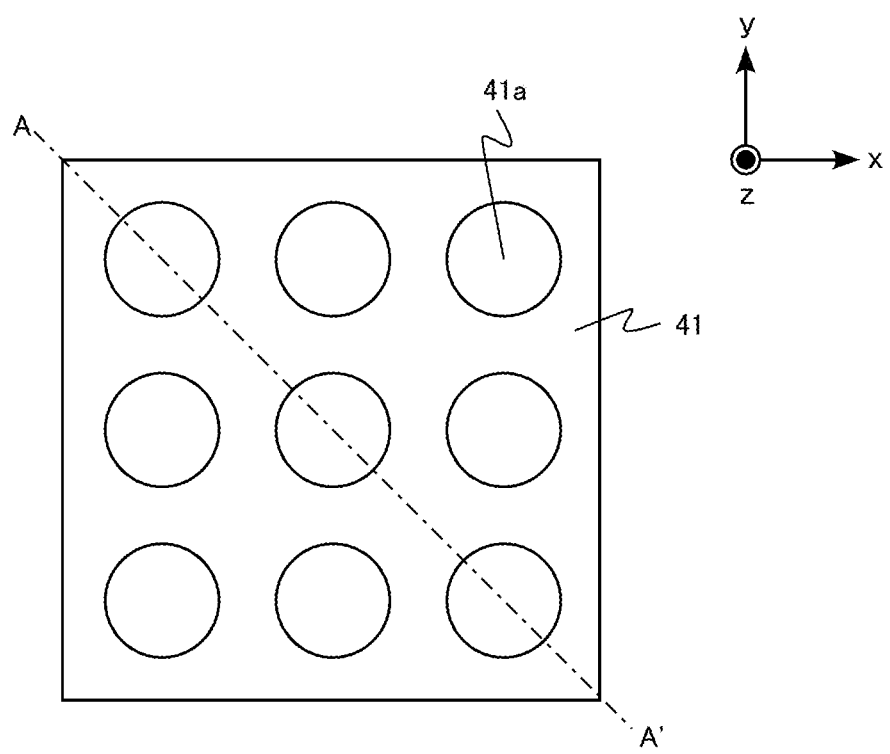
FIG. 9 is a view schematically illustrating the method for manufacturing the semiconductor memory device according to the first embodiment.

Then, a first processing mask 41 is formed on the first region 122a of the stacked body 122 (FIG. 8). For example, a photoresist or a carbon film is used as the first processing mask 41. The first processing mask 41 has central opening portions 41a with a circular shape (FIG. 9).

Figure 10:
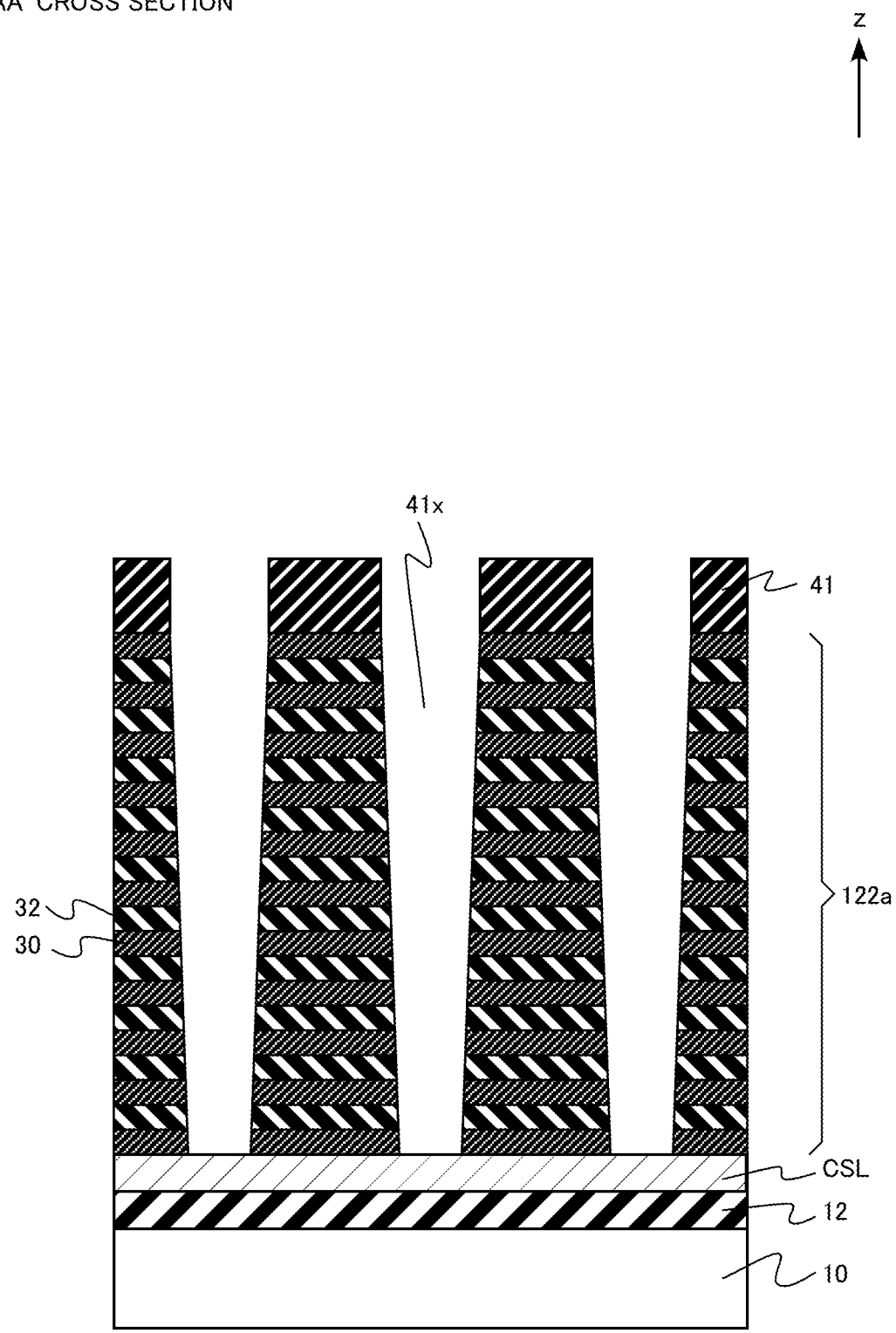
FIG. 10 is a view schematically illustrating the method for manufacturing the semiconductor memory device according to the first embodiment.

Then, the silicon oxide layers 30 and the silicon nitride layers 32 are etched using the first processing mask 41 as a mask to form central holes 41x penetrating through the first region 122a (FIG. 10). The central hole 41x reaches the common source line CSL. The central hole 41x is formed by, for example, a reactive ion etching method (RIE method).

Figure 11:
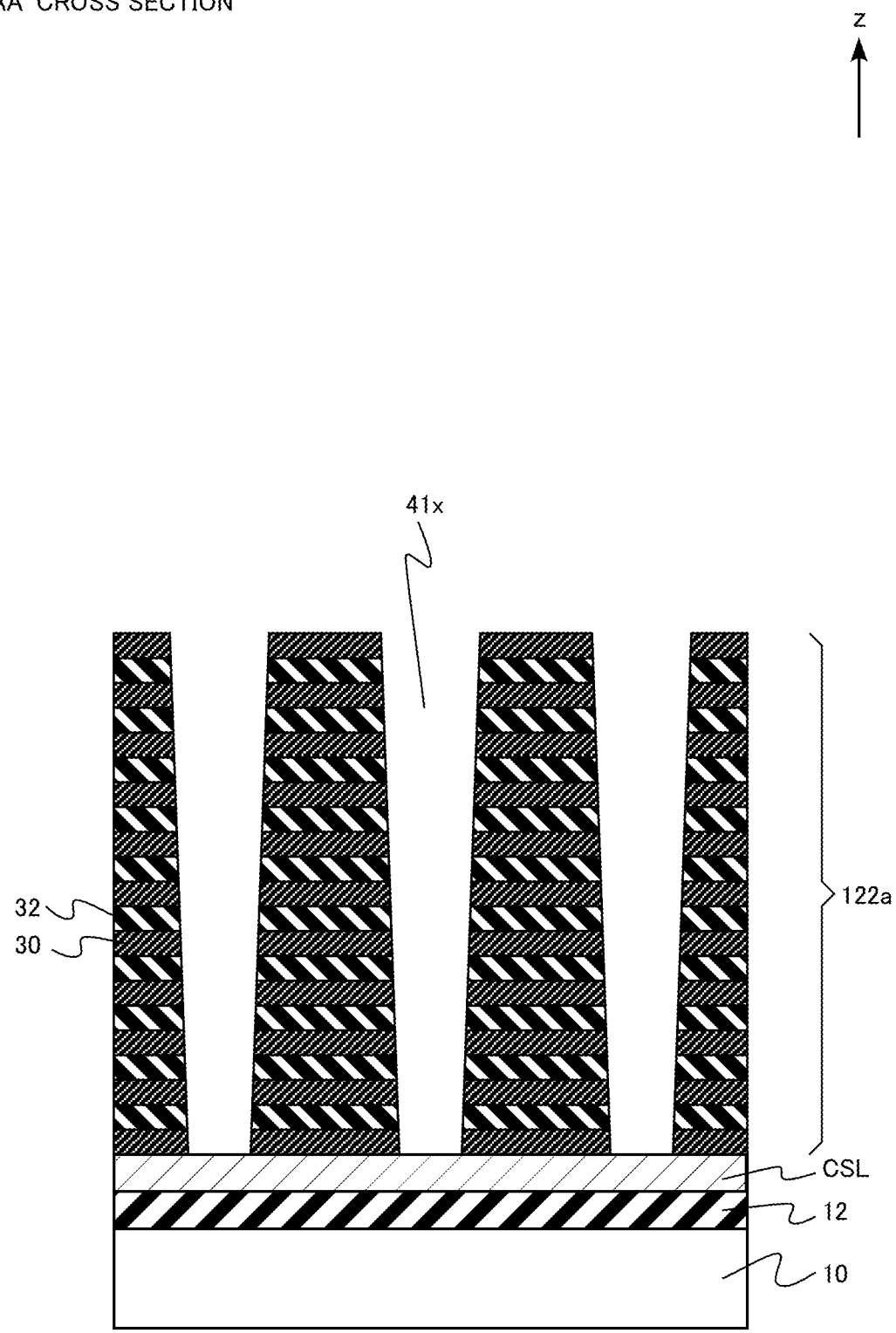
FIG. 11 is a view schematically illustrating the method for manufacturing the semiconductor memory device according to the first embodiment.

Then, the first processing mask 41 is removed (FIG. 11).

Figure 12:
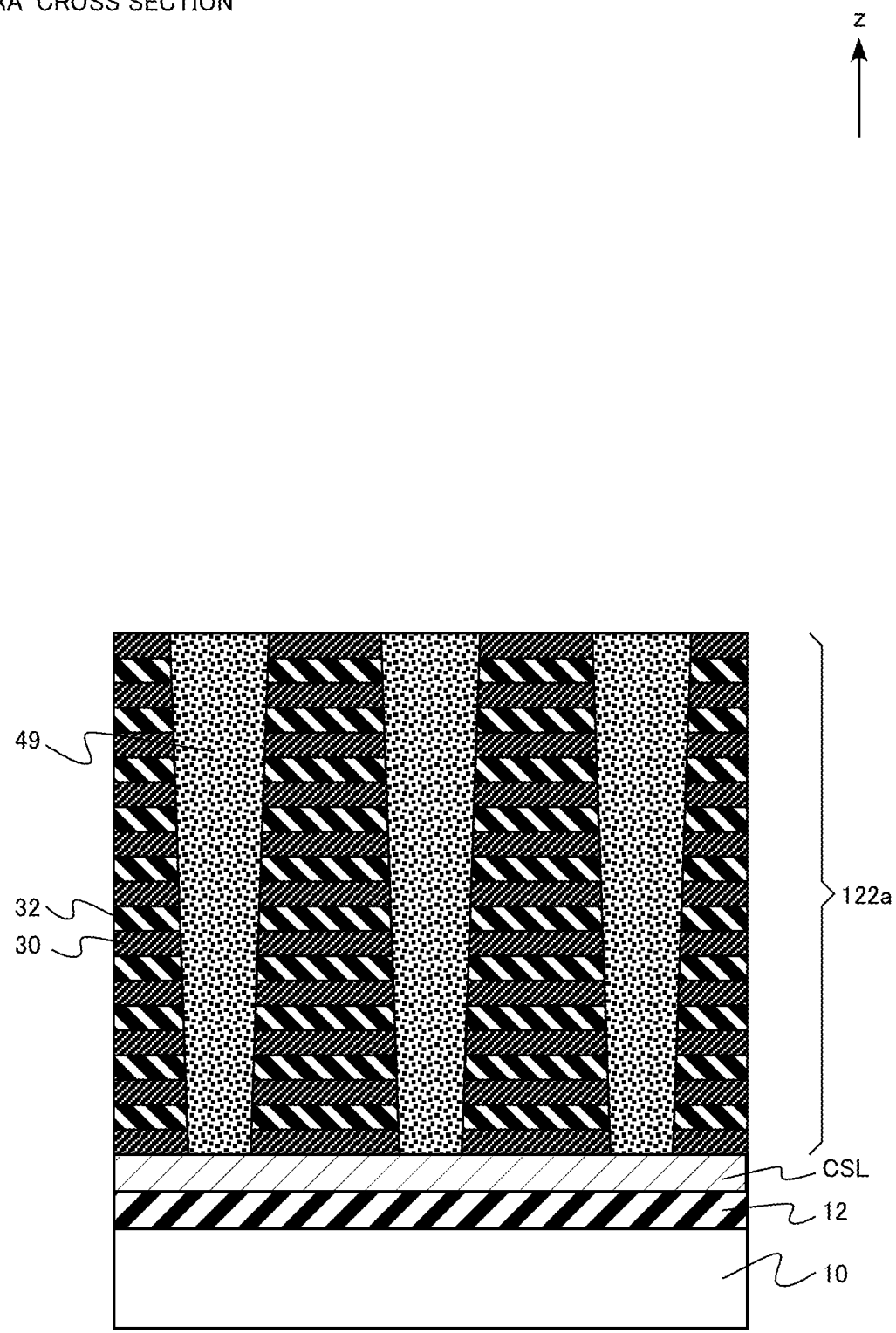
FIG. 12 is a view schematically illustrating the method for manufacturing the semiconductor memory device according to the first embodiment.

Then, the central hole 41x is filled with spin-on-glass 49 (SOG) (FIG. 12).

Figure 13:
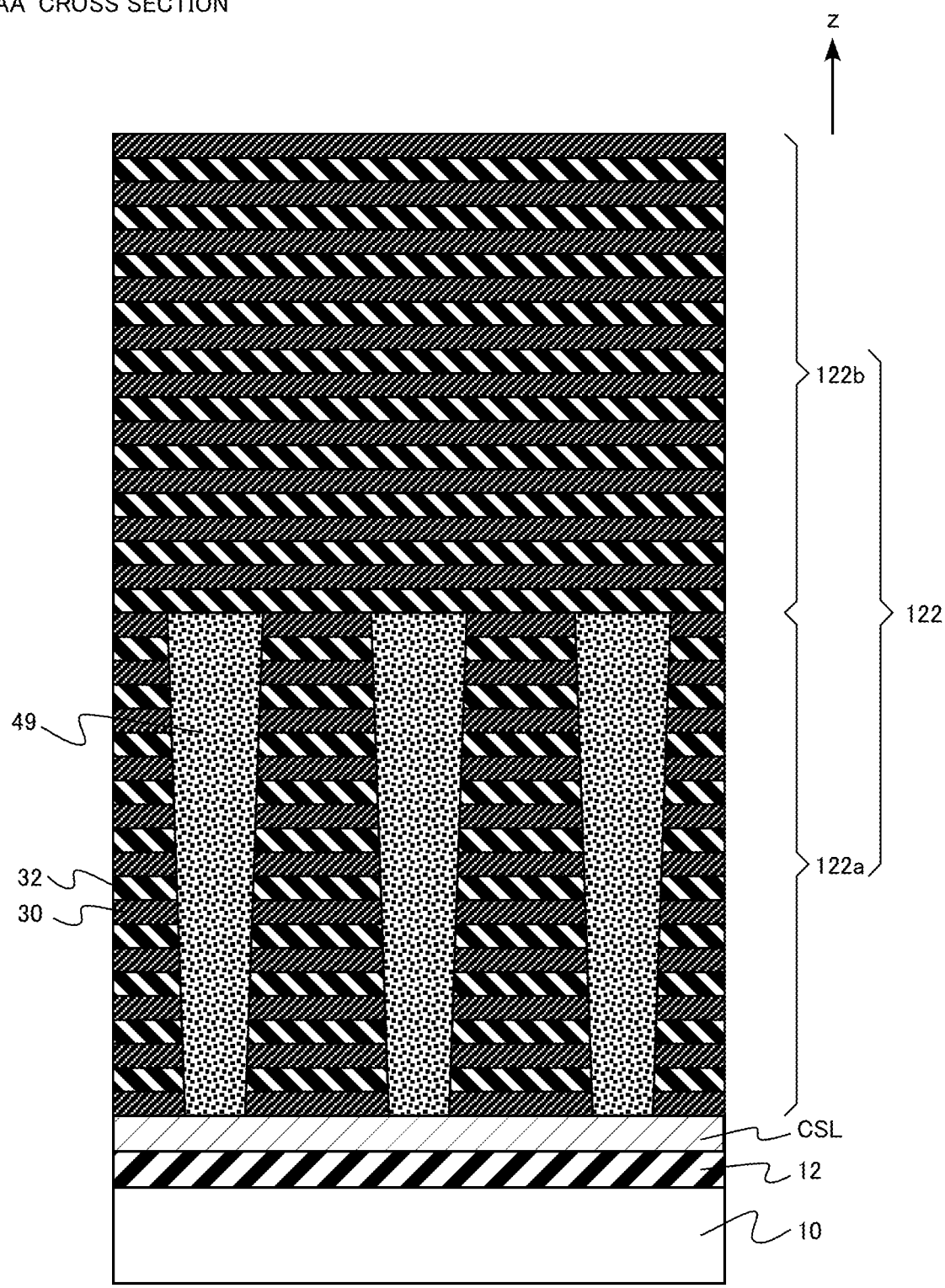
FIG. 13 is a view schematically illustrating the method for manufacturing the semiconductor memory device according to the first embodiment.

Then, the silicon oxide layers 30 and the silicon nitride layers 32 are alternately stacked on the first region 122a (FIG. 13). A second region 122b of the stacked body 122 is formed.

Figure 14:
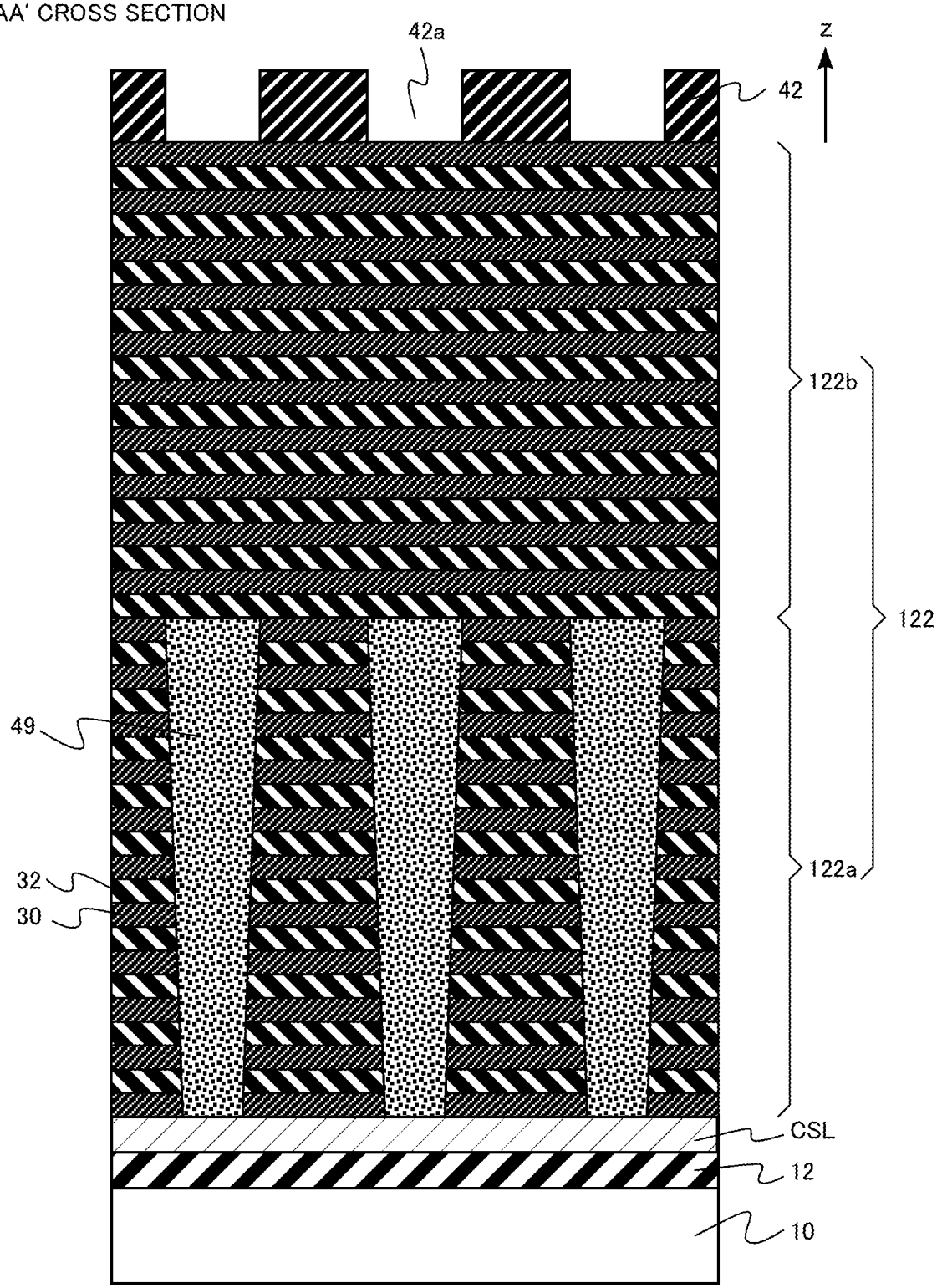
FIG. 14 is a view schematically illustrating the method for manufacturing the semiconductor memory device according to the first embodiment.
Figure 15:
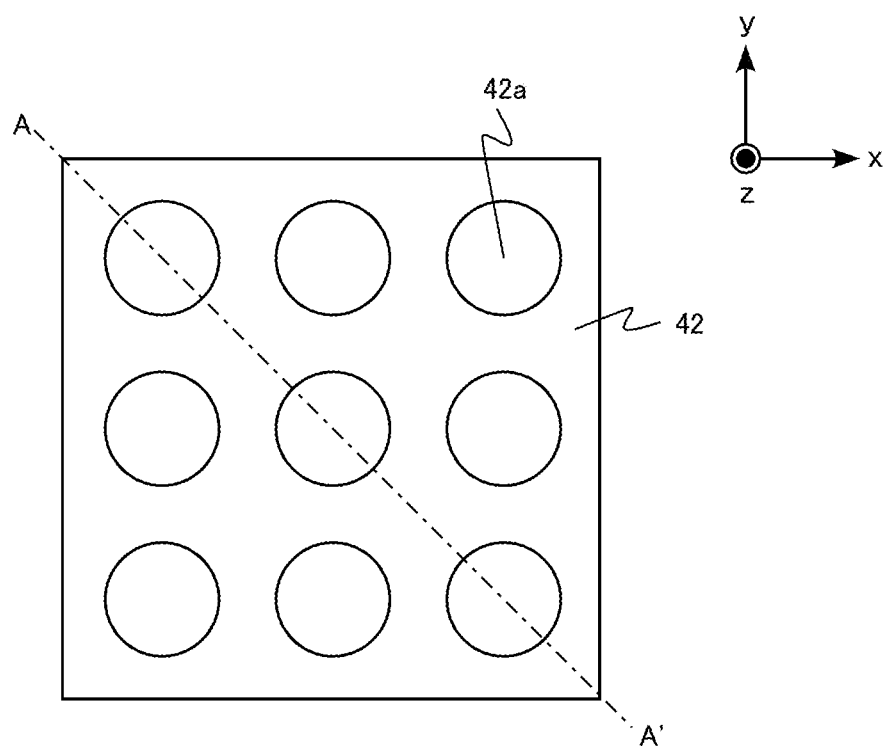
FIG. 15 is a view schematically illustrating the method for manufacturing the semiconductor memory device according to the first embodiment.

Then, a second processing mask 42 is formed on the second region 122b of the stacked body 122 (FIG. 14). For example, a photoresist or a carbon film is used as the second processing mask 42. The second processing mask 42 has central opening portions 42a with a circular shape (FIG. 15).

Figure 16:
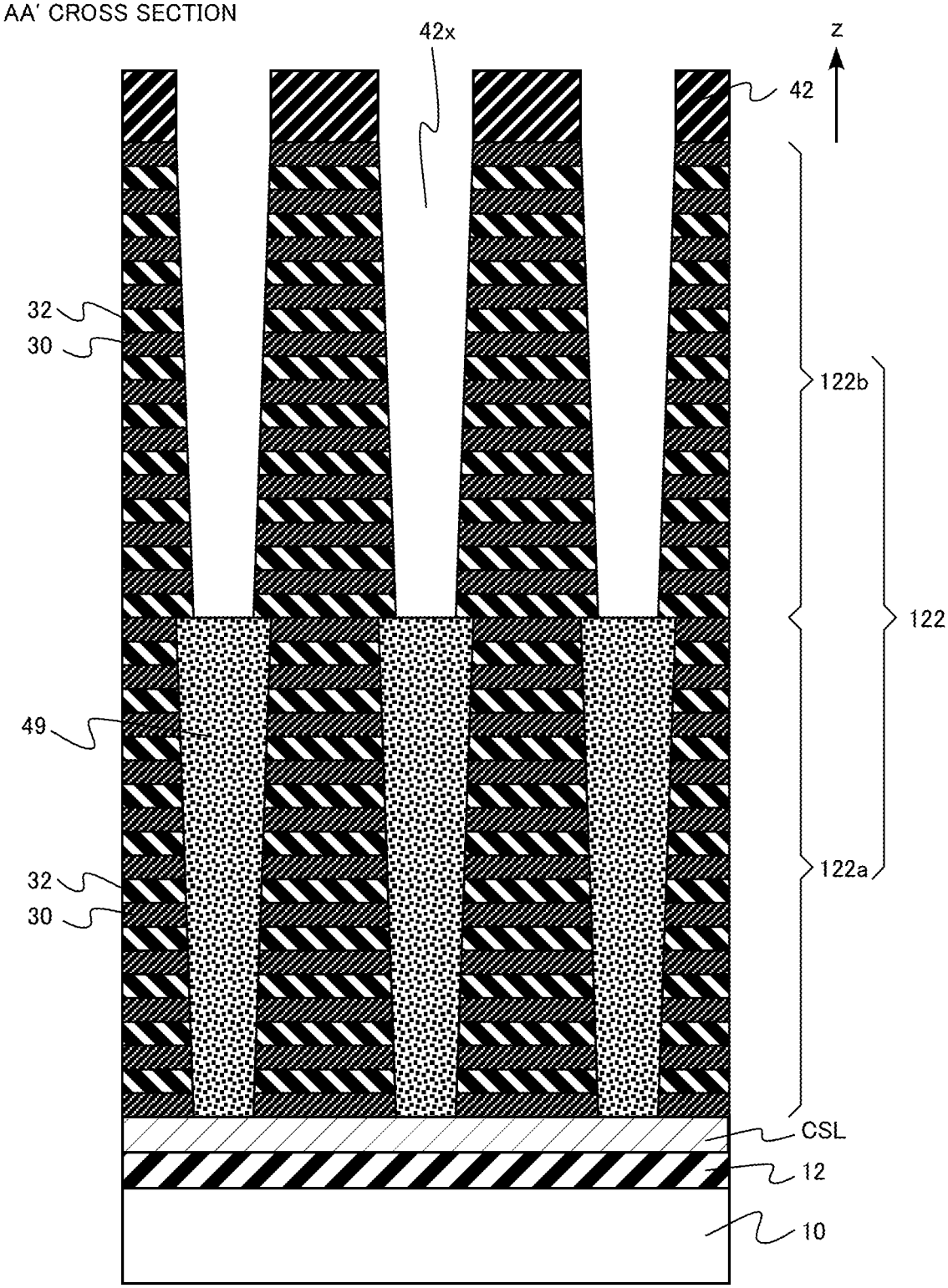
FIG. 16 is a view schematically illustrating the method for manufacturing the semiconductor memory device according to the first embodiment.

Then, the silicon oxide layers 30 and the silicon nitride layers 32 are etched using the second processing mask 42 as a mask to form central holes 42x penetrating through the second region 122b (FIG. 16). The central hole 42x reaches the spin-on-glass 49. The central hole 42x is formed by, for example, the RIE method.

Figure 17:
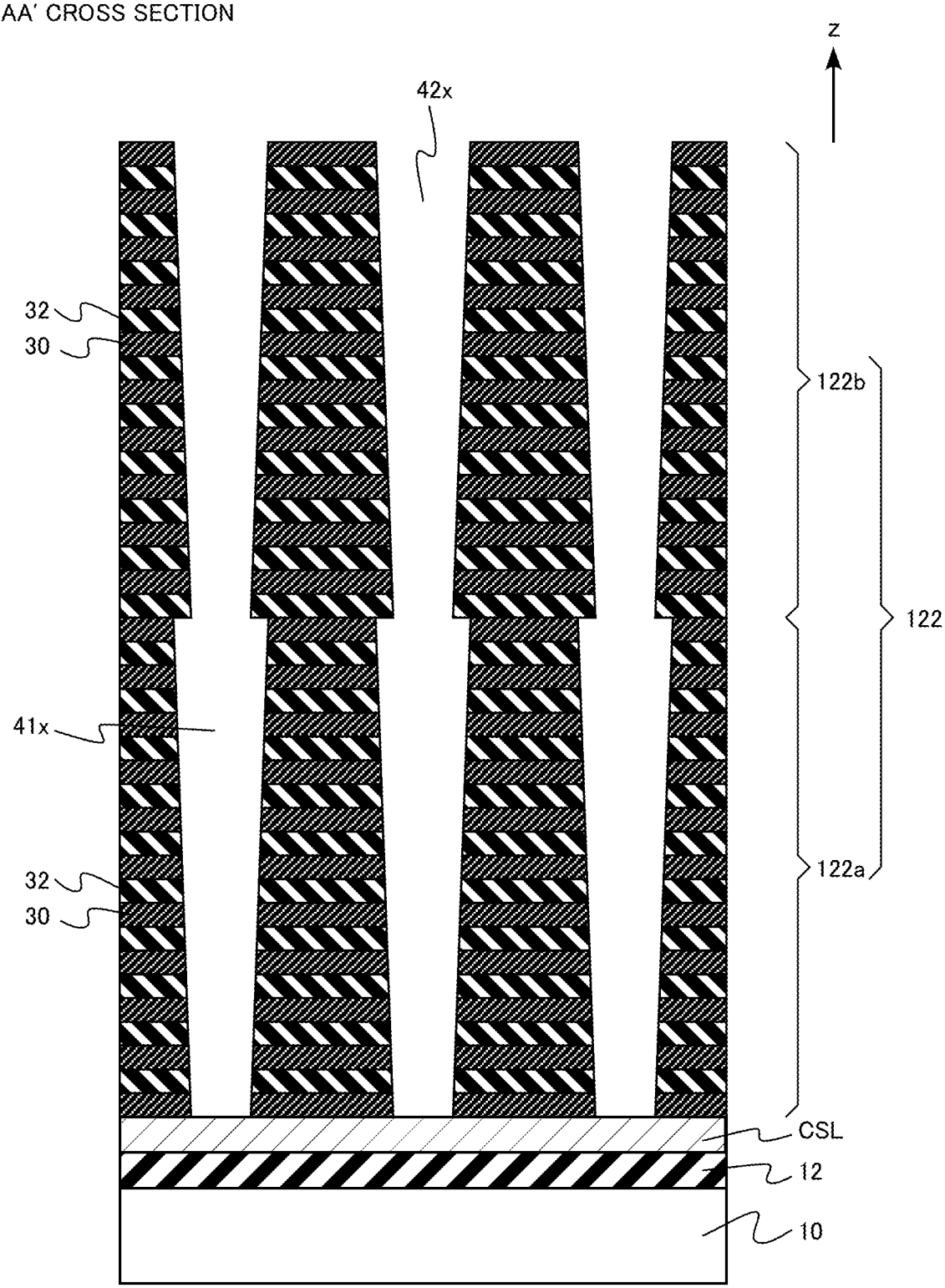
FIG. 17 is a view schematically illustrating the method for manufacturing the semiconductor memory device according to the first embodiment.

Then, the second processing mask 42 and the spin-on-glass 49 are removed (FIG. 17). The spin-on-glass 49 is removed by, for example, wet etching.

Figure 18:
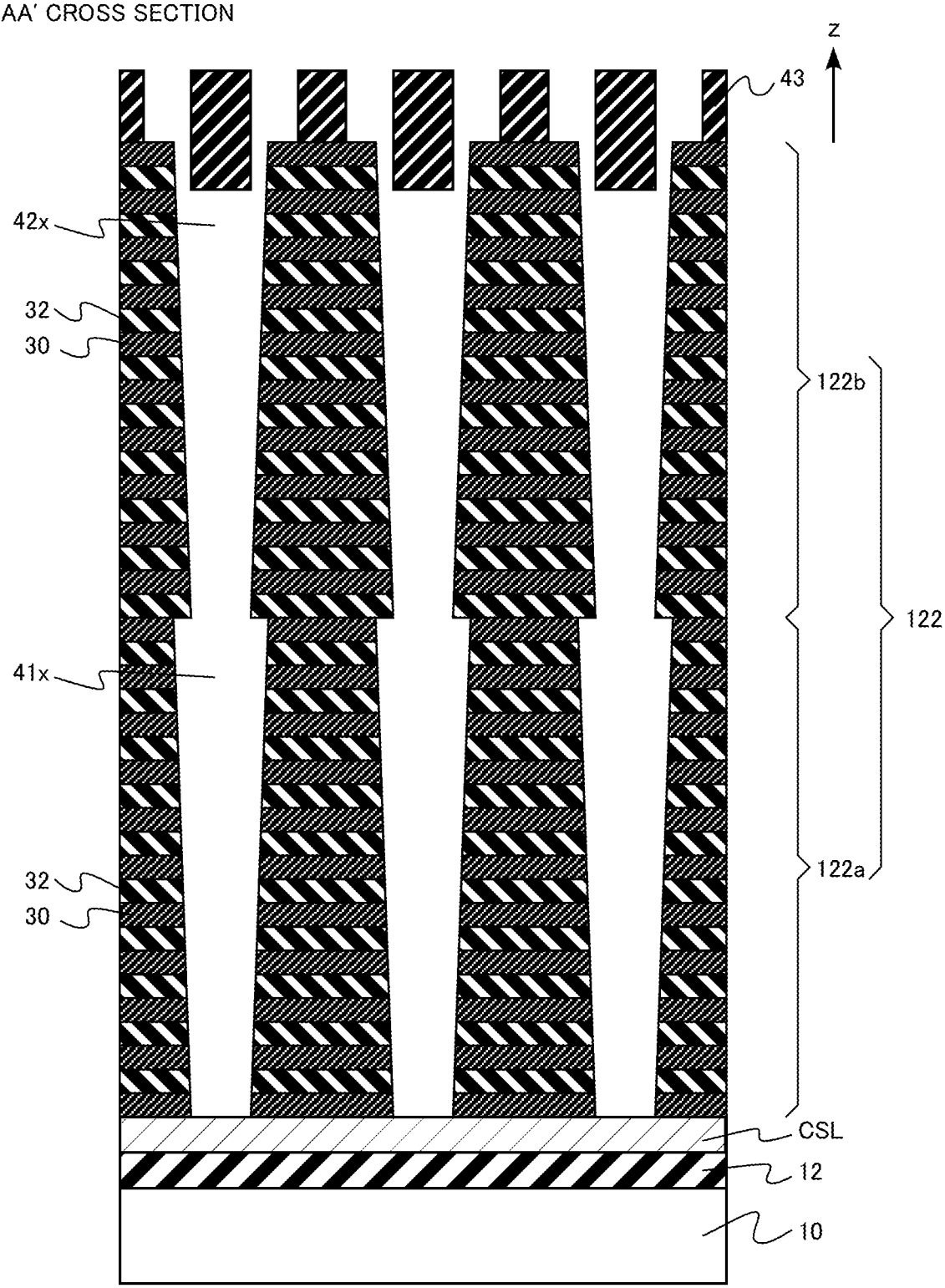
FIG. 18 is a view schematically illustrating the method for manufacturing the semiconductor memory device according to the first embodiment.
Figure 19:
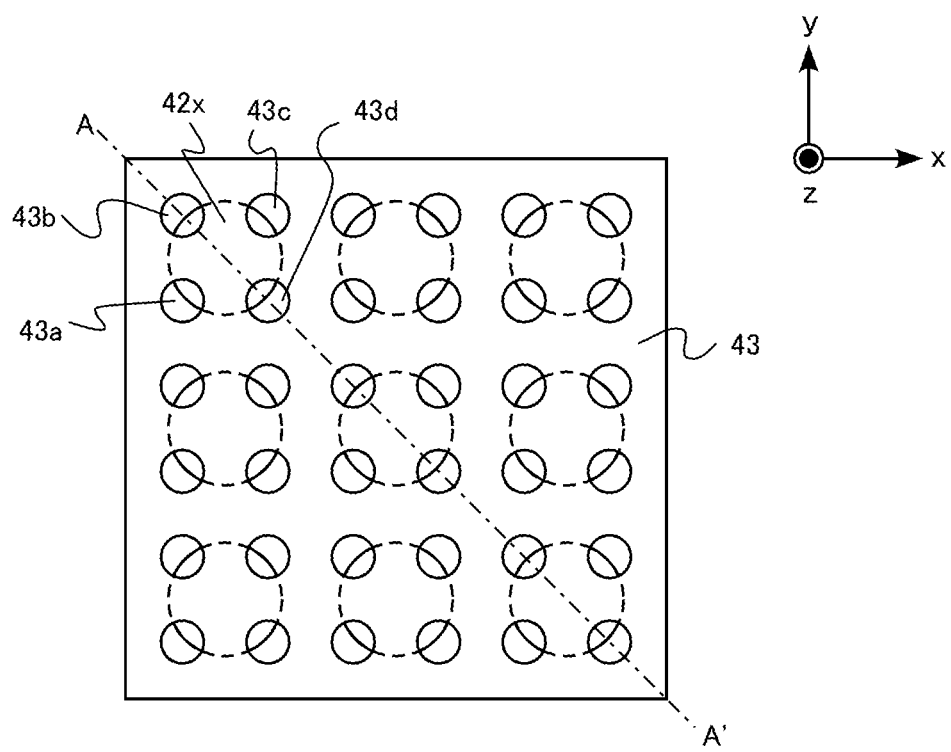
FIG. 19 is a view schematically illustrating the method for manufacturing the semiconductor memory device according to the first embodiment.

Then, a third processing mask 43 is formed (FIG. 18). The third processing mask 43 has a first opening portion 43a partially overlapping the central hole 42x, a second opening portion 43b partially overlapping the central hole 42x, a third opening portion 43c partially overlapping the central hole 42x, and a fourth opening portion 43d partially overlapping the central hole 42x (FIG. 19). In FIG. 19, a dashed circle indicates the central hole 42x.

Figure 20:
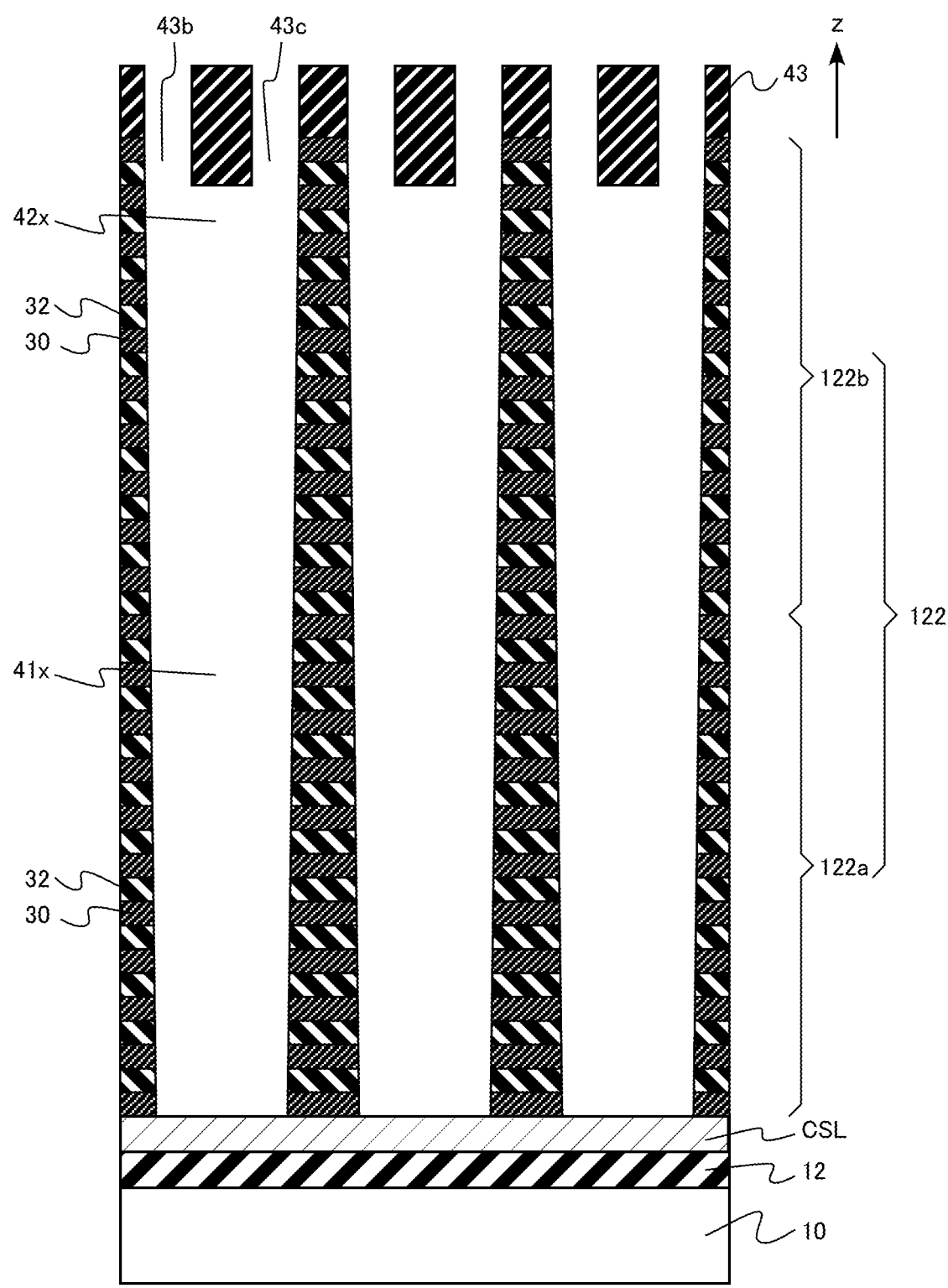
FIG. 20 is a view schematically illustrating the method for manufacturing the semiconductor memory device according to the first embodiment.

Then, the silicon oxide layers 30 and the silicon nitride layers 32 are etched using the third processing mask 43 as a mask (FIG. 20). A first memory hole 43p (first hole), a second memory hole 43q (second hole), a third memory hole 43r (third hole), and a fourth memory hole 43s (fourth hole) penetrating through the stacked body 122 are formed around the central hole 41x and the central hole 42x by the etching. The silicon oxide layers 30 and the silicon nitride layers 32 are etched by, for example, the RIE method. Substantially, the central hole 41x, the central hole 42x, the first memory hole 43p, the second memory hole 43q, the third memory hole 43r, and the fourth memory hole 43s are not a plurality of independent holes, but are one connected hole. That is, the central hole 41x, the central hole 42x, the first memory hole 43p, the second memory hole 43q, the third memory hole 43r, and the fourth memory hole 43s may be referred to as a central hole portion 41x, a central hole portion 42x, a first memory hole portion 43p (first hole portion), a second memory hole portion 43q (second hole portion), a third memory hole portion 43r (third hole portion), and a fourth memory hole portion 43s (fourth hole portion) of one hole, respectively.

Figure 21:
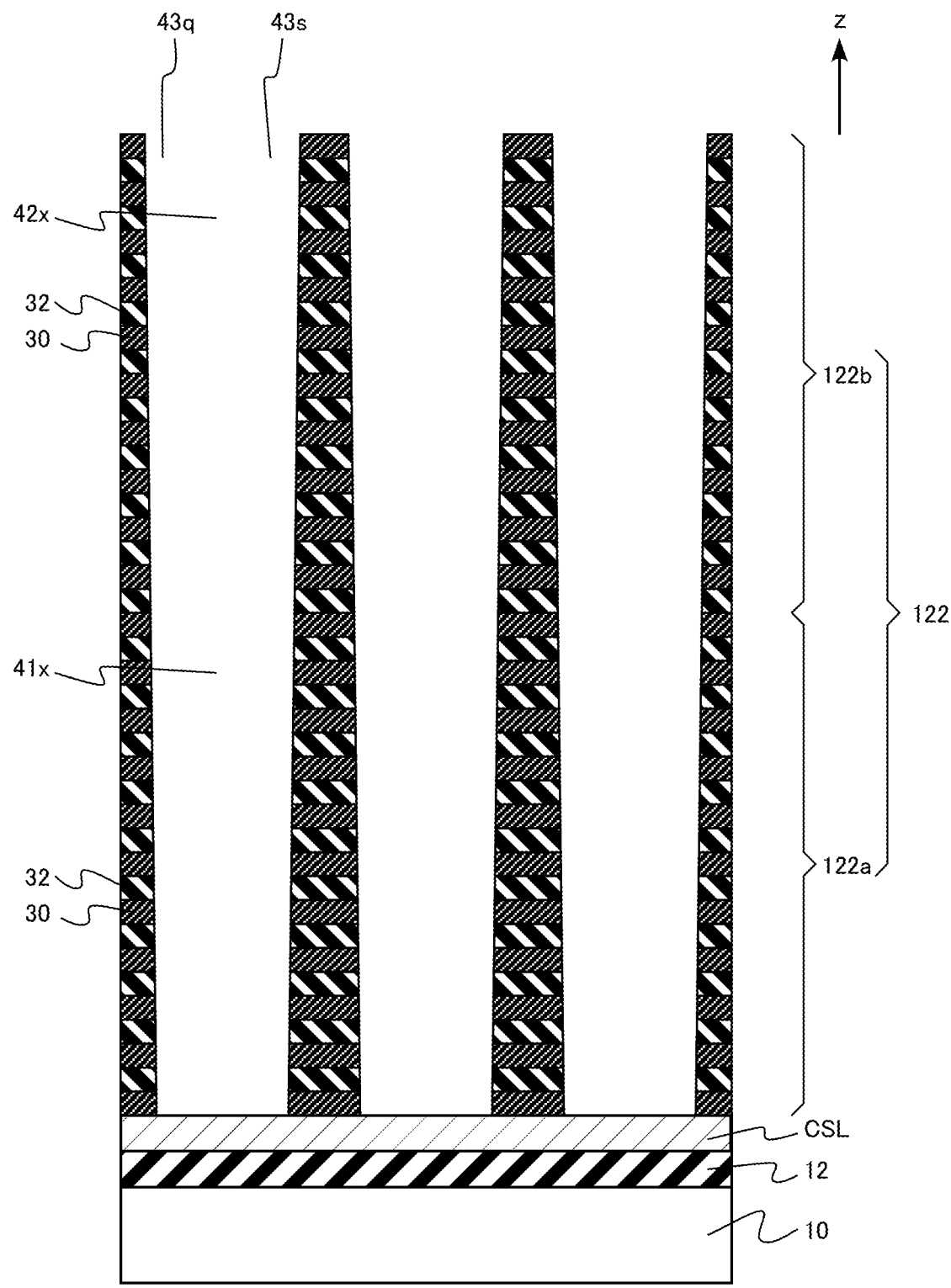
FIG. 21 is a view schematically illustrating the method for manufacturing the semiconductor memory device according to the first embodiment.
Figure 22:
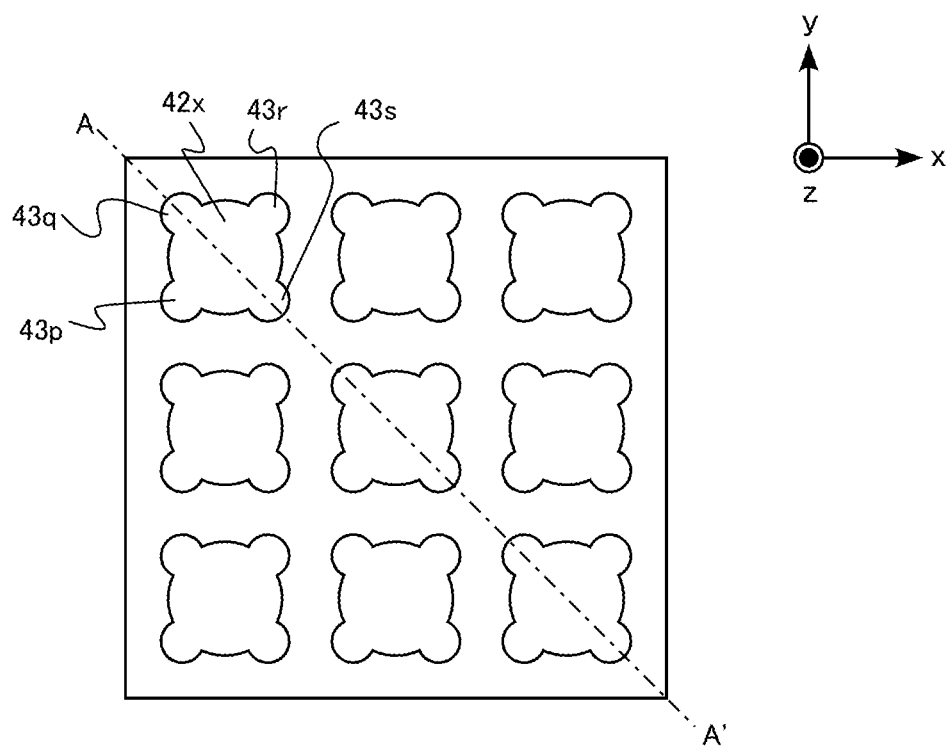
FIG. 22 is a view schematically illustrating the method for manufacturing the semiconductor memory device according to the first embodiment.

Then, the third processing mask 43 is removed (FIG. 21). The first memory hole 43p (first hole), the second memory hole 43q (second hole), the third memory hole 43r (third hole), and the fourth memory hole 43s (fourth hole) are formed around the central hole 41x and the central hole 42x (FIG. 22).

Figure 23:
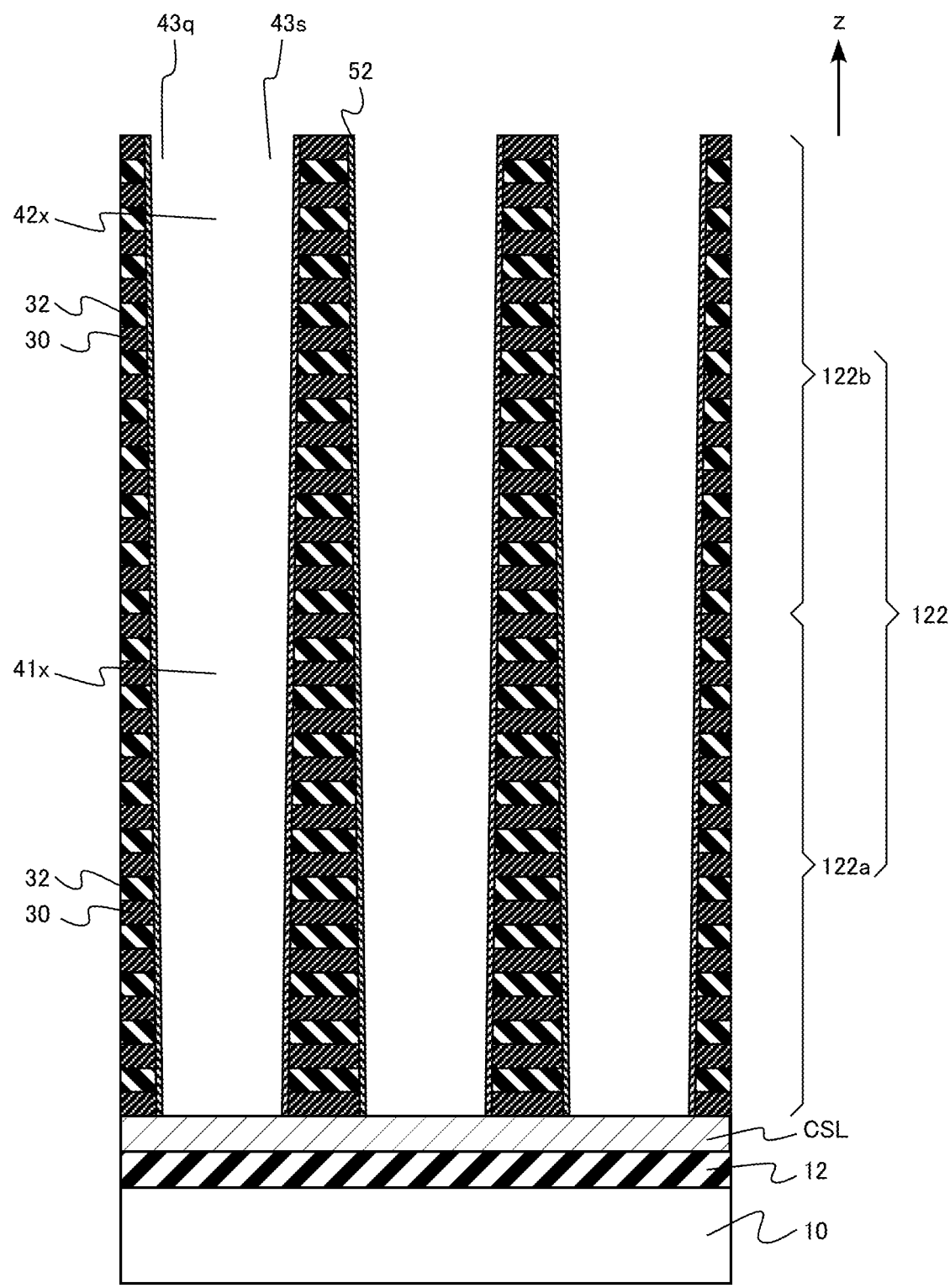
FIG. 23 is a view schematically illustrating the method for manufacturing the semiconductor memory device according to the first embodiment.

Then, a stacked film 52 of a silicon oxide film, a silicon nitride film, and a silicon oxide film is formed in the first memory hole 43p (first hole), the second memory hole 43q (second hole), the third memory hole 43r (third hole), and the fourth memory hole 43s (fourth hole) (FIG. 23). The stacked film 52 comes into contact with the silicon nitride layer 32. The stacked film 52 is formed by, for example, the CVD method. At least a portion of the stacked film 52 finally becomes the charge accumulation layer 18. In addition, the stacked film 52 is formed on the surface of the second region 122b and an exposed portion of the common source line CSL, but is removed by an etch-back method.

Figure 24:
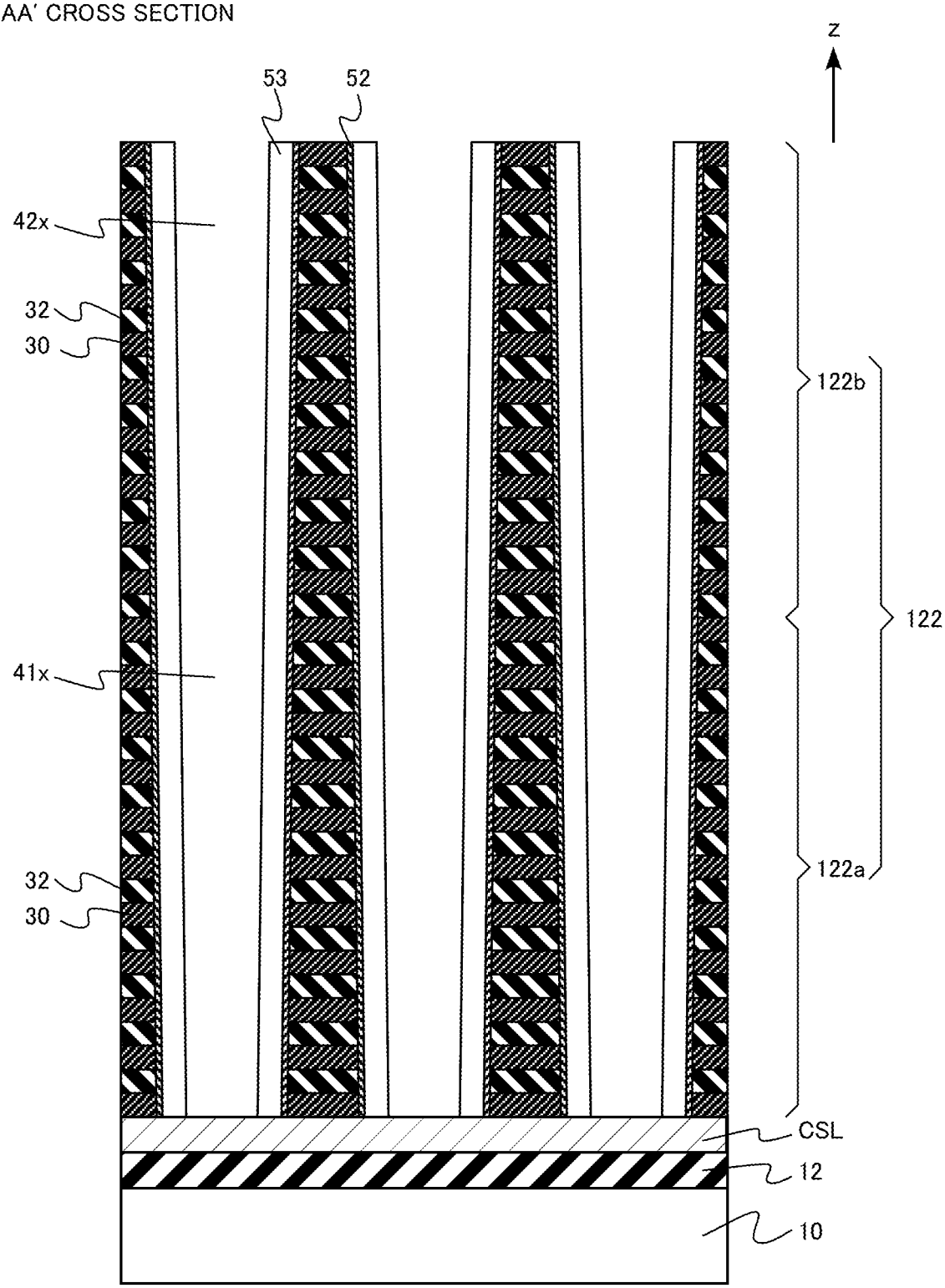
FIG. 24 is a view schematically illustrating the method for manufacturing the semiconductor memory device according to the first embodiment.

Then, anamorphous silicon film 53 is formed in the first memory hole 43p (first hole), the second memory hole 43q (second hole), the third memory hole 43r (third hole), and the fourth memory hole 43s (fourth hole) (FIG. 24). The amorphous silicon film 53 is heated in the subsequent process and finally becomes the channel layer 16 using polysilicon. In addition, the amorphous silicon film 53 is formed on the surface of the second region 122b and an exposed portion of the common source line CSL and in the central hole 41x and the central hole 42x. The amorphous silicon film 53 formed in regions other than the first memory hole 43p (first hole), the second memory hole 43q (second hole), the third memory hole 43r (third hole), and the fourth memory hole 43s (fourth hole) may be removed by, for example, an isotropic dry etching method in order to separate the channel layer 16.

For example, the amorphous silicon film 53 formed on the surface of the second region 122b and the inner surfaces of the central hole 41x and the central hole 42x may be removed by the isotropic dry etching method in order to separate the channel layer 16. Further, the stacked film 52 is formed in the central hole 41x and the central hole 42x. A portion of the stacked film 52 may be removed by the isotropic dry etching method.

Figure 25:
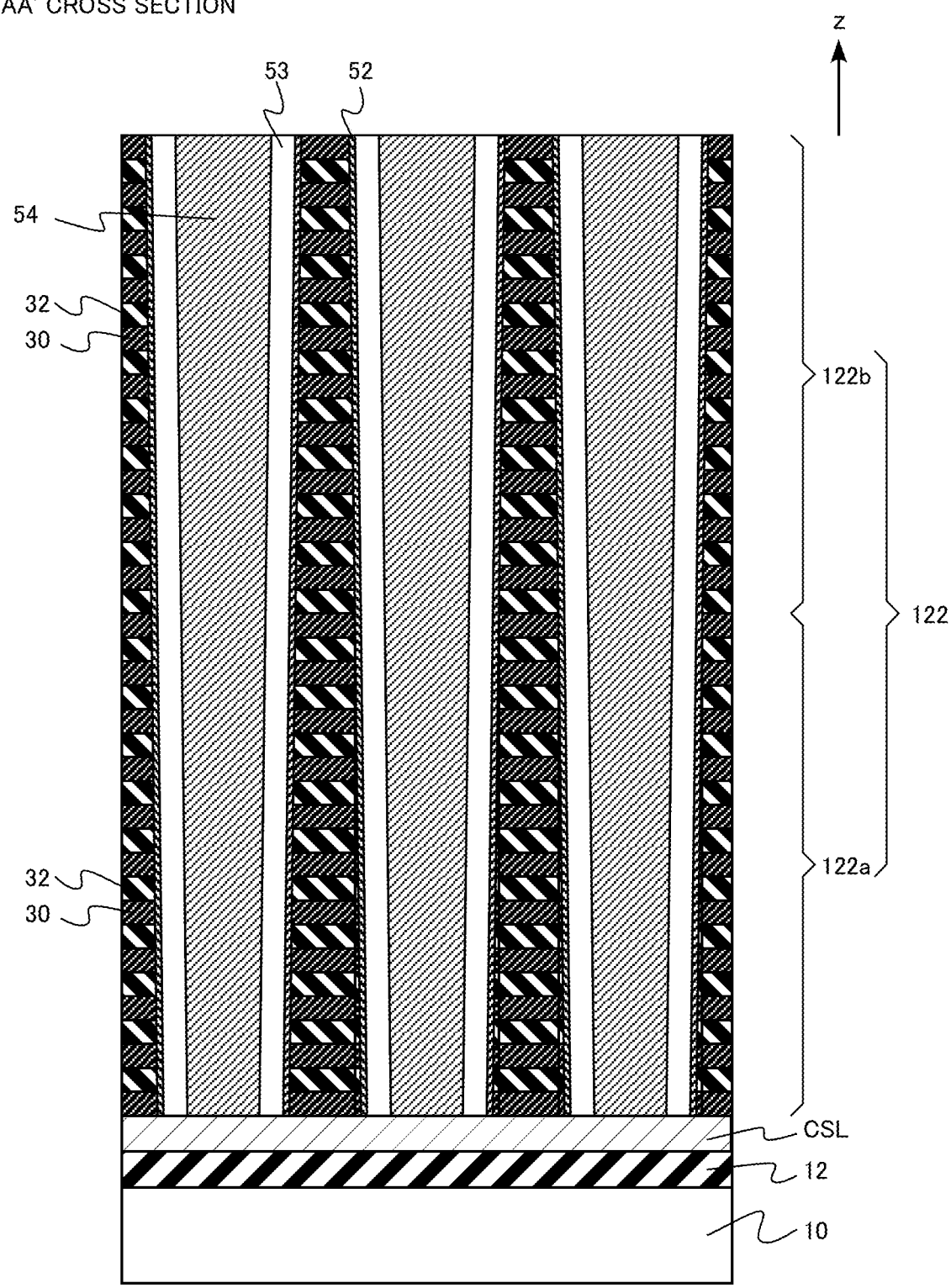
FIG. 25 is a view schematically illustrating the method for manufacturing the semiconductor memory device according to the first embodiment.

Then, the central hole 41x and the central hole 42x are filled with a silicon oxide film 54 (FIG. 25). The silicon oxide film 54 finally becomes the central insulating layer 20. The silicon oxide film 54 is formed by, for example, the CVD method.

Figure 26:
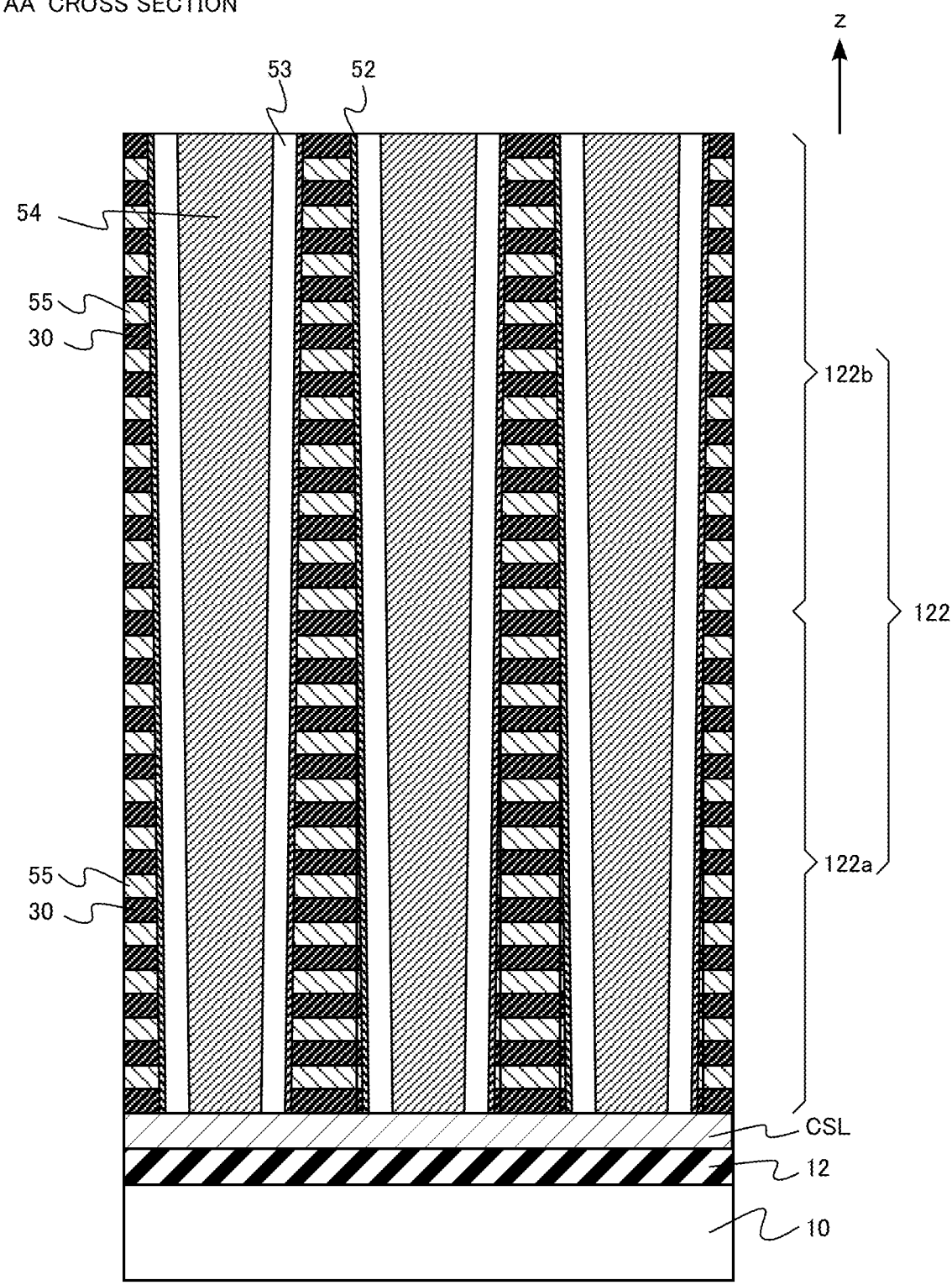
FIG. 26 is a view schematically illustrating the method for manufacturing the semiconductor memory device according to the first embodiment.

Then, the silicon nitride layer 32 is selectively removed by wet etching using an etching groove (not illustrated). The silicon nitride layer 32 is selectively etched with respect to the silicon oxide layer 30 using, for example, a phosphoric acid solution in the wet etching. Then, for example, a tungsten film 55 is formed in a region obtained by removing the silicon nitride layer 32 (FIG. 26). The silicon nitride layer 32 is substituted with the tungsten film 55. The tungsten films 55 finally become the word line WL, the source select gate line SGS, and the drain select gate line SGD.

Then, a plurality of bit lines BL are formed on the stacked body 122 by a known process technique.

The memory cell array 100 of the semiconductor memory device according to the first embodiment is manufactured by the above-mentioned manufacturing method.

In addition, when the stacked body 122 is formed, a second layer may be a conductive layer.

Next, the function and effect of the semiconductor memory device and the semiconductor memory device manufacturing method according to the first embodiment will be described.

The three-dimensional NAND flash memory in which the memory cells are three-dimensionally arranged increases the degree of integration and reduces costs. The three-dimensional NAND flash memory may be manufactured, for example, by alternately stacking a plurality of insulating layers and a plurality of gate electrode layers to forma stacked body, forming memory holes penetrating through the stacked body, and forming charge accumulation layers and semiconductor layers in the memory holes to form memory strings in which a plurality of memory cells are connected in series to each other. The capacity of the three-dimensional NAND flash memory may be further increased by increasing the number of gate electrodes stacked in the stacked body or scaling-down the size of the memory hole.

When the number of gate electrodes stacked in the stacked body is increased or when the size of the memory hole is scaled-down, the aspect ratio (depth/width) of the memory hole increases. Therefore, it is difficult to form the memory hole using etching. When the aspect ratio of the memory hole increases, an etching rate may be reduced or etching may be stopped during an etching using the RIE method.

In the memory cell array 100 of the semiconductor memory device according to the first embodiment, a plurality of channel layers 16 are provided around the central insulating layer 20 extending in the z direction in the stacked body 22. The adoption of this structure makes it possible to easily form a memory hole with a high aspect ratio. As a result, the capacity of the three-dimensional NAND flash memory further increases.

When the memory cell array 100 is manufactured, the central holes 41x and 42x with a large diameter and a lower aspect ratio are formed in the stacked body 122 before the memory holes with a small diameter are formed. Then, as illustrated in FIG. 22, the first memory hole 43p, the second memory hole 43q, the third memory hole 43r, and the fourth memory hole 43s are formed so as to partially overlap the central hole 41x and the central hole 42x, which makes it possible to etch the memory holes with a small diameter in a state in which the effective aspect ratio is low. Therefore, when the memory holes with a small diameter and a high aspect ratio are formed, it is possible to reduce the possibility that the etching rate will be reduced or etching will be stopped.

In addition, when the number of gate electrodes stacked in the stacked body is further increased, it may be difficult to perform etching even for the central hole having a larger diameter and a higher aspect ratio than the memory hole. In the memory cell array 100 of the semiconductor memory device according to the first embodiment, the central hole can be manufactured so as to be divided into two upper and lower central holes, that is, the central hole 41x and the central hole 42x. Therefore, it is easy to perform etching for the central holes and it is possible to form a memory hole with a small diameter and a high aspect ratio.

Since the central hole is formed so as to be divided into the upper and lower holes, vertical misalignment or dimensional deviation is likely to occur. However, since the memory holes can be collectively formed, the channel layer 16 can be continuously formed from the bottom to the top of the stacked body 22 without any deviation.

As described above, according to the semiconductor memory device of the first embodiment, it is possible to form a memory hole with a high aspect ratio. Therefore, it is possible to provide a semiconductor memory device capable of increasing capacity.

Second Embodiment

A semiconductor memory device according to a second embodiment is different from the semiconductor memory device according to the first embodiment in that the first charge accumulation layer, the second charge accumulation layer, and the third charge accumulation layer have a tunnel insulating film, a semiconductor film between the tunnel insulating film and a gate electrode layer, and a block insulating film between a semiconductor film and the gate electrode layer, respectively. Hereinafter, in some cases, a portion of the description of the same content as that in the first embodiment will be omitted.

Figure 27:
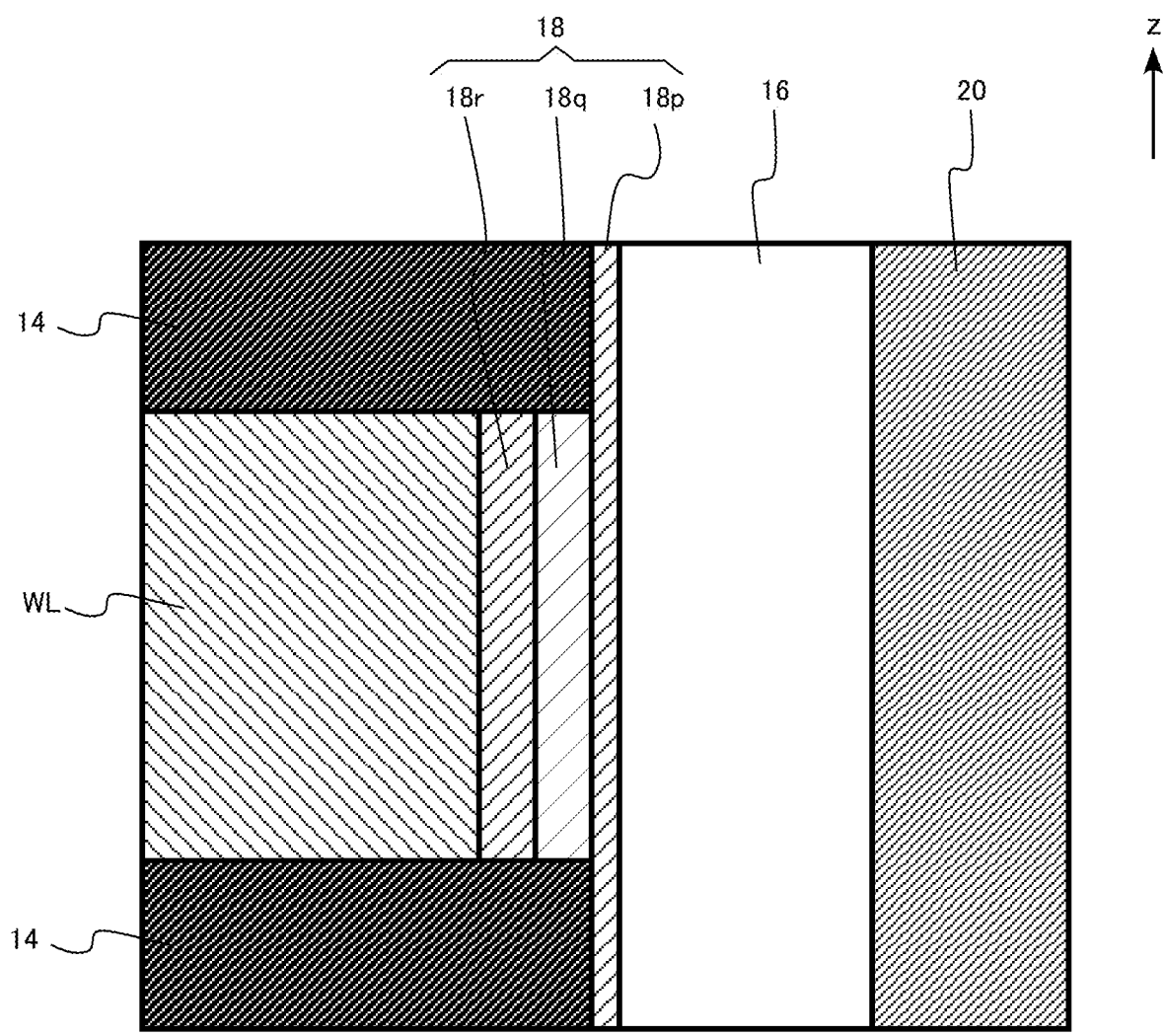
FIG. 27 is a cross-sectional view schematically illustrating a memory cell of a semiconductor memory device according to a second embodiment.

FIG. 27 is a cross-sectional view schematically illustrating a memory cell of the semiconductor memory device according to the second embodiment. FIG. 27 is a cross-sectional view illustrating a memory cell MC. FIG. 27 illustrates a cross section of the memory cell MC parallel to the z direction. FIG. 27 corresponds to the region (MC in FIG. 2) surrounded by the rectangle in FIG. 2.

As illustrated in FIG. 27, for example, a charge accumulation layer 18 includes a tunnel insulating film 18p, a semiconductor film 18q, and a block insulating film 18r. The semiconductor film 18q is provided between the tunnel insulating film 18p and the block insulating film 18r. For example, a silicon oxide film, a polysilicon film, and a silicon oxide film are used as the tunnel insulating film 18p, the semiconductor film 18q, and the block insulating film 18r, respectively.

The tunnel insulating film 18p has a function of selectively transmitting charge. The semiconductor film 18q has a function of accumulating charge. The block insulating film 18r has a function of blocking a current flowing between the semiconductor film 18q and the word line WL. The memory cell MC of the semiconductor memory device according to the second embodiment is a so-called floating-gate memory cell.

The channel layer 16 or the tunnel insulating film 18p comes into contact with the interlayer insulating layer 14. In other words, the semiconductor film 18q is divided between the memory cells MC adjacent to each other in the z direction. Further, the semiconductor film 18q is divided among the first charge accumulation layer 18a, the second charge accumulation layer 18b, the third charge accumulation layer 18c, and the fourth charge accumulation layer 18d.

As described above, according to the semiconductor memory device of the second embodiment, similarly to the first embodiment, it is possible to form a memory hole with a high aspect ratio. Therefore, it is possible to provide a semiconductor memory device capable of increasing capacity.

Third Embodiment

A semiconductor memory device according to a third embodiment is different from the semiconductor memory device according to the first embodiment in that the number of semiconductor layers disposed around the second insulating layer or the positional relationship between the second insulating layer and the semiconductor layers disposed around the second insulating layer. Hereinafter, in some cases, a portion of the description of the same content as that in the first embodiment will be omitted.

FIG. 28A, FIG. 28B, FIG. 28C, and FIG. 28D are views schematically illustrating the semiconductor memory device according to the third embodiment. FIG. 28A, FIG. 28B, FIG. 28C, and FIG. 28D illustrate only a central insulating layer 20, channel layers 16, and charge accumulation layers 18 in a memory cell array.

Figure 28A:
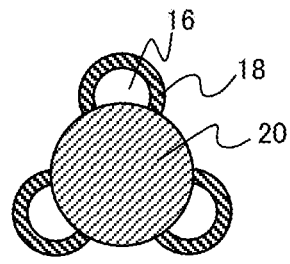
FIGS. 28A, 28B, 28C, and 28D are views schematically illustrating a semiconductor memory device according to a third embodiment.

FIG. 28A illustrates a case where three channel layers 16 and three charge accumulation layers 18 are disposed around the central insulating layer 20. FIG. 28B illustrates a case where six channel layers 16 and six charge accumulation layers 18 are disposed around the central insulating layer 20. FIG. 28C illustrates a case where eight channel layers 16 and eight charge accumulation layers 18 are disposed around the central insulating layer 20.

For example, in the case of FIG. 28C in which the central insulating layer 20 has a larger size than that in the case of FIG. 28A, when the memory holes are formed, a central hole can have a larger size than that in the case of FIG. 28A. Therefore, in the case of FIG. 28C, a stacked body 22 having a larger number of stacked layers than that in the case of FIG. 28A can be processed at once.

In the semiconductor memory device according to the first embodiment, four channel layers 16 are disposed around the central insulating layer 20. In the semiconductor memory device according to the third embodiment, three, six, or eight channel layers 16 are disposed around the central insulating layer 20. However, the number of channel layers 16 disposed around the central insulating layer 20 may be other numbers.

Figure 28D:
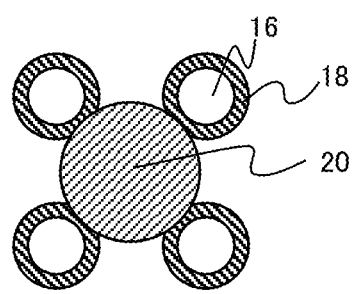
Figure 28B:
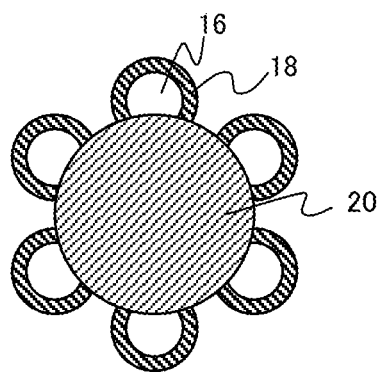
Figure 28C:
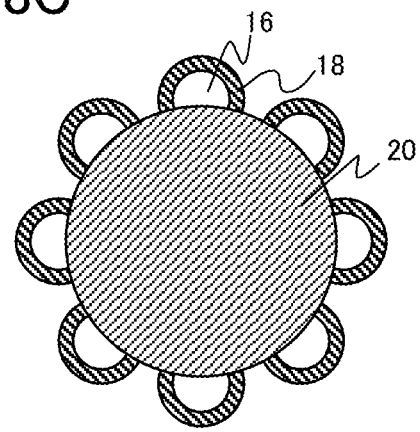

FIG. 28D illustrates an aspect in which the central insulating layer 20 and the channel layer 16 do not come into contact with each other. In the aspect illustrated in FIG. 28D, only four charge accumulation layers 18 come into contact with the central insulating layer 20.

As described above, according to the semiconductor memory device of the third embodiment, similarly to the first embodiment, it is possible to form a memory hole with a high aspect ratio. Therefore, it is possible to provide a semiconductor memory device capable of increasing capacity.

Fourth Embodiment

A semiconductor memory device according to a fourth embodiment includes: a stacked body including a plurality of first insulating layers and a plurality of gate electrode layers alternately stacked in a first direction; a first semiconductor layer provided in the stacked body, the first semiconductor layer extending in the first direction; a second semiconductor layer provided in the stacked body, the second semiconductor layer extending in the first direction; a third semiconductor layer provided in the stacked body, the third semiconductor layer extending in the first direction; a first charge accumulation layer provided between the gate electrode layers and the first semiconductor layer; a second charge accumulation layer provided between the gate electrode layers and the second semiconductor layer; a third charge accumulation layer provided between the gate electrode layers and the third semiconductor layer; and a second insulating layer provided in the stacked body, the second insulating layer extending in the first direction, the second insulating layer being in contact with the first semiconductor layer or the first charge accumulation layer in a plane perpendicular to the first direction, the second insulating layer being in contact with the second semiconductor layer or the second charge accumulation layer in the plane, and the second insulating layer being in contact with the third semiconductor layer or the third charge accumulation layer in the plane, the plane including the gate electrode layers. The second insulating layer is not included in a first plane perpendicular to the first direction, the first plane including the first semiconductor layer. The second insulating layer is included in a second plane located in the first direction with respect to the first plane, the second plane being perpendicular to the first direction, the second plane including the first semiconductor layer.

The semiconductor memory device according to the fourth embodiment is different from the semiconductor memory device according to the first embodiment in that the second insulating layer does not penetrate through the stacked body. Hereinafter, in some cases, a portion of the description of the same content as that in the first embodiment will be omitted.

The semiconductor memory device according to the fourth embodiment is a three-dimensional NAND flash memory. In the semiconductor memory device according to the fourth embodiment, the charge accumulation layer of the memory cell MC has a stacked structure of insulating films. The memory cell MC in the semiconductor memory device according to the fourth embodiment is a so-called metal-oxide-nitride-oxide-semiconductor (MONOS) memory cell.

Figure 29:
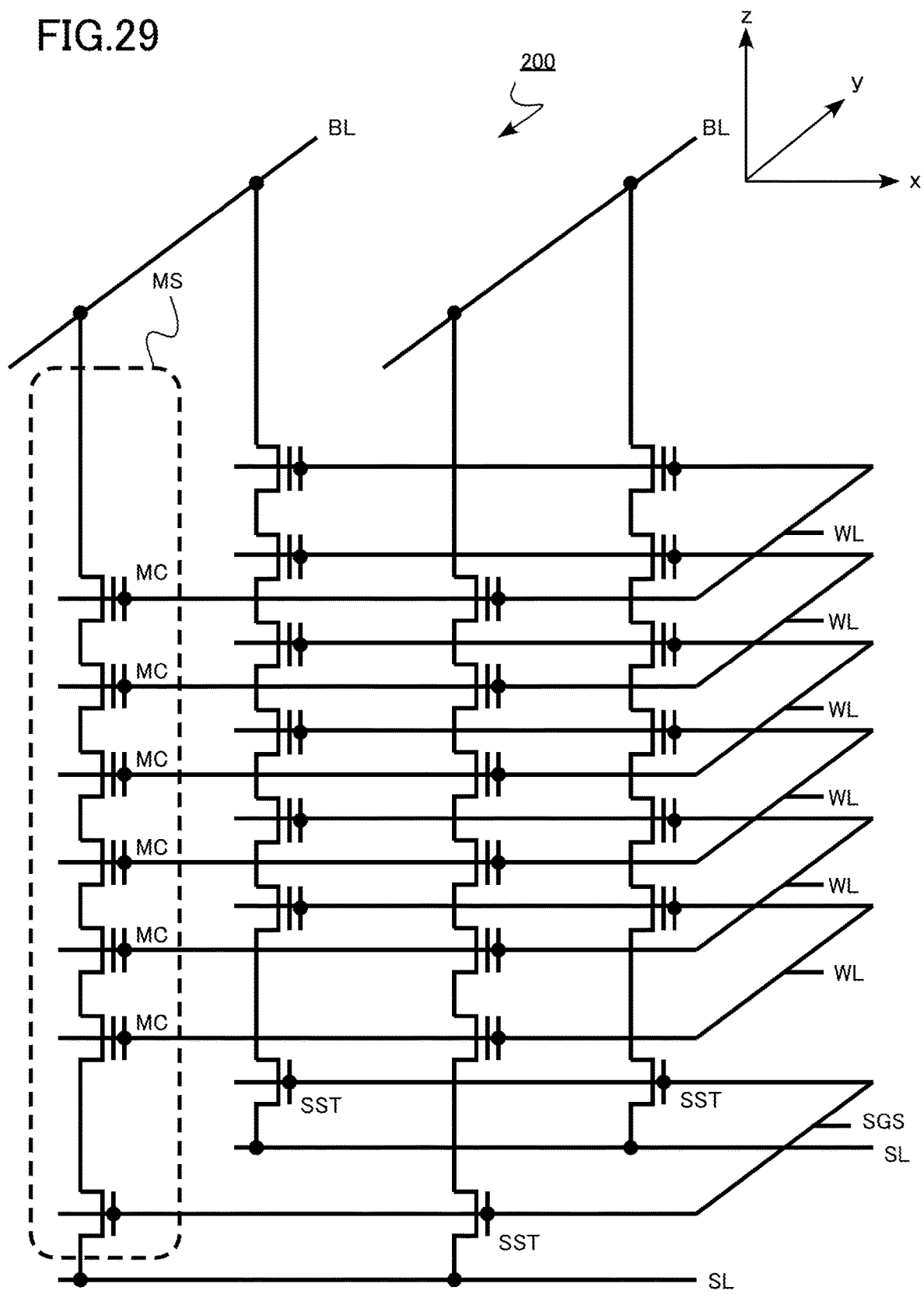
FIG. 29 is a circuit diagram illustrating a memory cell array of a semiconductor memory device according to a fourth embodiment.

FIG. 29 is a circuit diagram illustrating a memory cell array of the semiconductor memory device according to the fourth embodiment.

As illustrated in FIG. 29, a memory cell array 200 of the three-dimensional NAND flash memory according to the fourth embodiment includes a plurality of word lines WL (gate electrode layers), a plurality of source lines SL, a source select gate line SGS, a plurality of bit lines BL, and a plurality of memory strings MS.

The plurality of word lines WL are disposed so as to be stacked in the z direction. The plurality of memory strings MS extend in the z direction. The plurality of bit lines BL extend in, for example, the y direction.

Hereinafter, the x direction is defined as a second direction, the y direction is defined as a third direction, and the z direction is defined as a first direction. For example, the x direction, the y direction, and the z direction are perpendicular to each other.

As illustrated in FIG. 29, the memory string MS includes a source select transistor SST and a plurality of memory cells MC connected in series to each other between the source line SL and the bit line BL. One source line SL and one bit line BL are selected to select one memory string MS and one word line WL is selected to be able to select one memory cell MC. The word line WL is a gate electrode of a memory cell transistor forming the memory cell MC.

Figure 30:
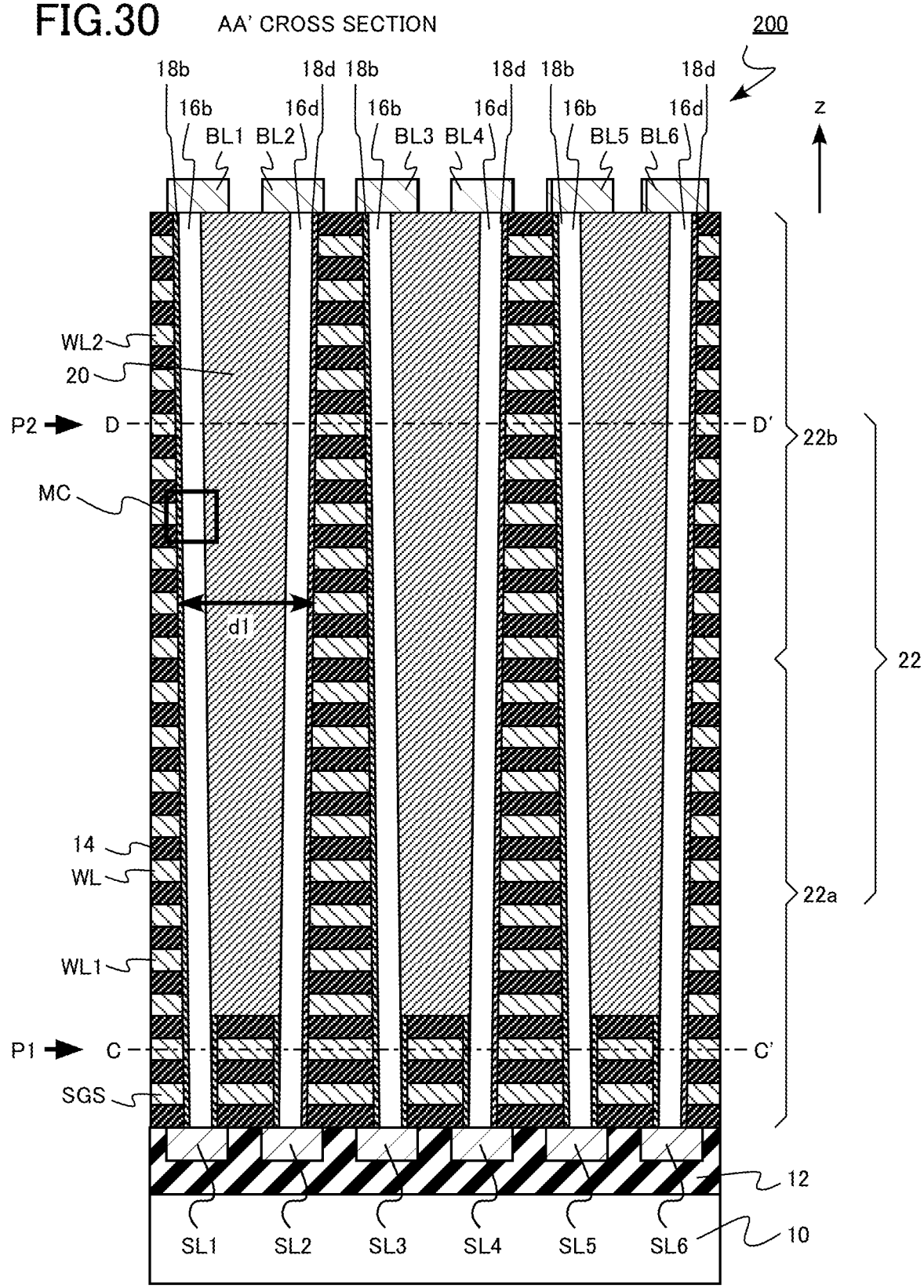
FIG. 30 is a view schematically illustrating a portion of the memory cell array of the semiconductor memory device according to the fourth embodiment.
Figure 31:
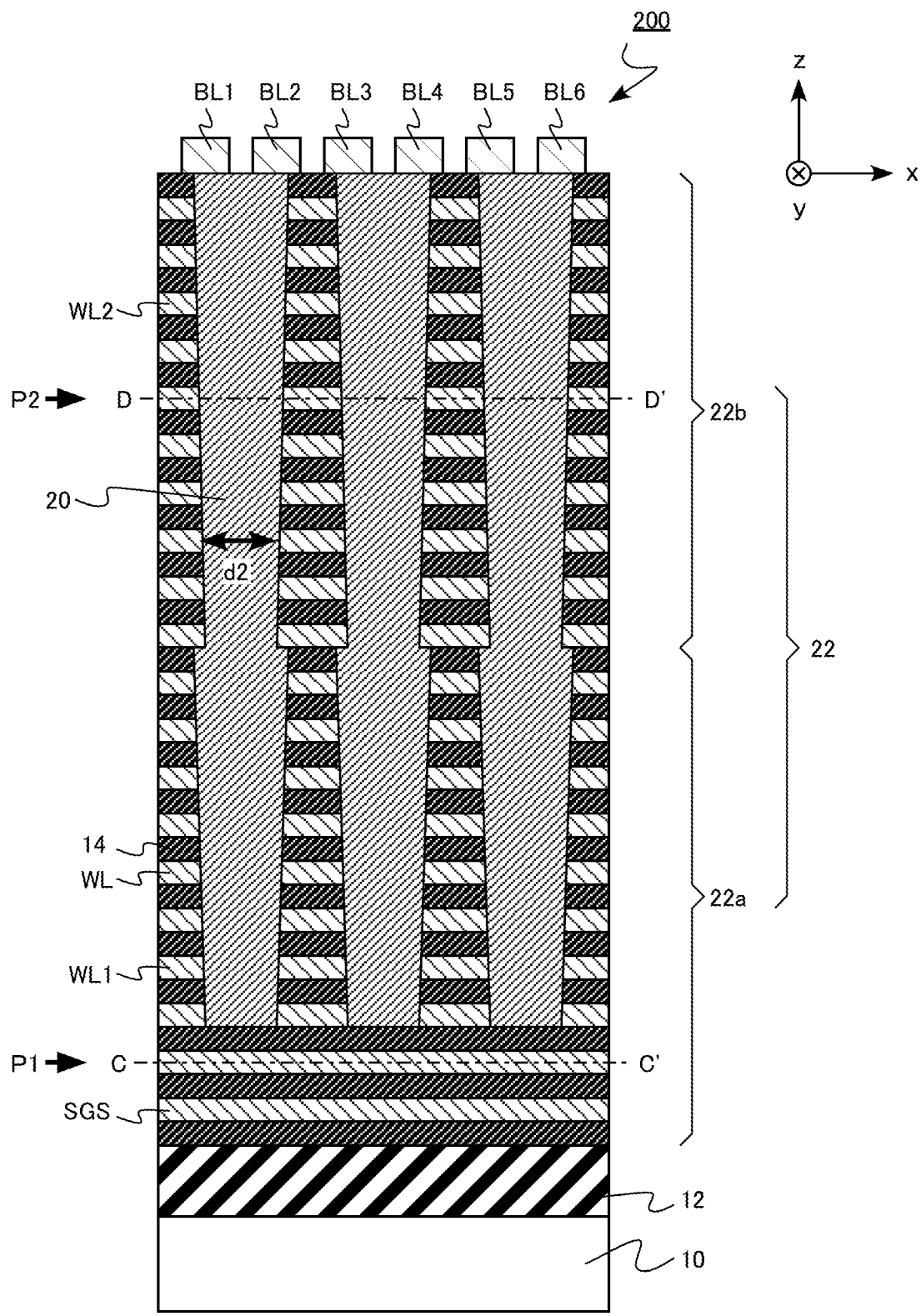
FIG. 31 is a view schematically illustrating a portion of the memory cell array of the semiconductor memory device according to the fourth embodiment.
Figure 32:
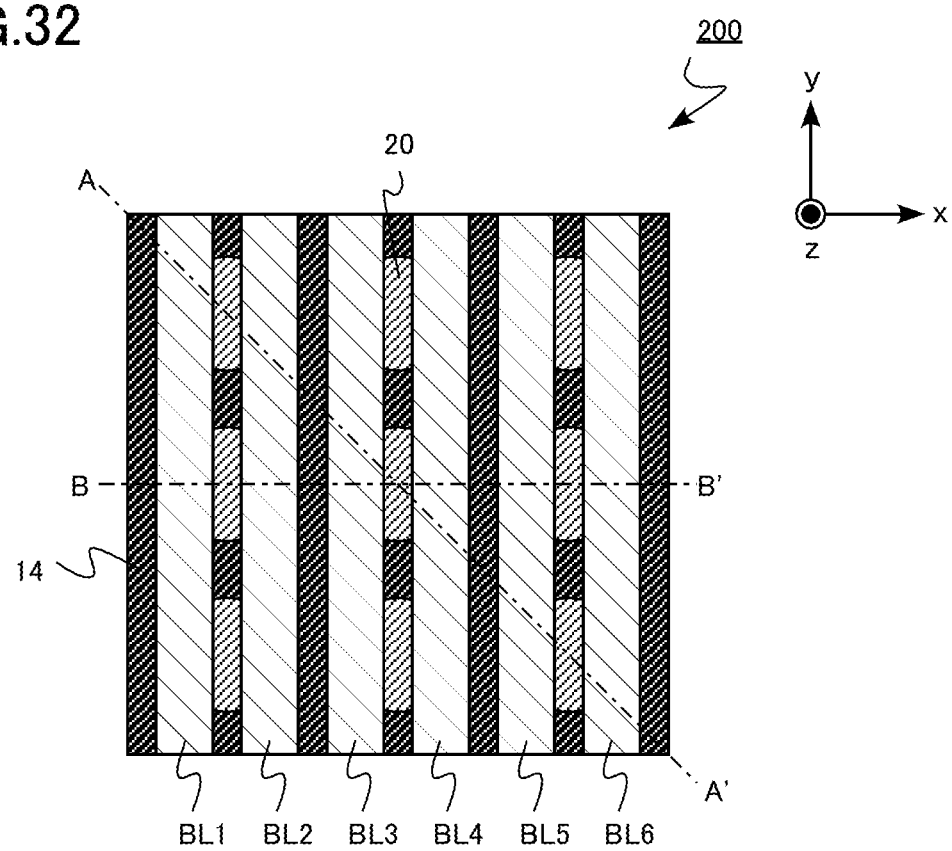
FIG. 32 is a view schematically illustrating a portion of the memory cell array of the semiconductor memory device according to the fourth embodiment.

FIG. 30, FIG. 31, FIG. 32, FIG. 33A, FIG. 33B, FIG. 33C, FIG. 34A, FIG. 34B, and FIG. 34C are views schematically illustrating a portion of the memory cell array of the semiconductor memory device according to the fourth embodiment. FIG. 30, FIG. 31, FIG. 33A, FIG. 33B, FIG. 33C, FIG. 34A, FIG. 34B, and FIG. 34C are cross-sectional views and FIG. 32 is a top view.

FIG. 30 illustrates a cross section of the memory cell array 200 parallel to the z direction. FIG. 30 illustrates the cross section taken along the line AA' of FIG. 32. In FIG. 30, a region surrounded by a rectangle is one memory cell MC.

FIG. 31 illustrates a cross section of the memory cell array 200 parallel to the x direction and the z direction. FIG. 31 illustrates the xz cross section of the memory cell array 200. FIG. 31 illustrates the cross section taken along the line BB' of FIG. 32.

FIG. 32 is a top view illustrating the memory cell array 200.

Figure 33A:
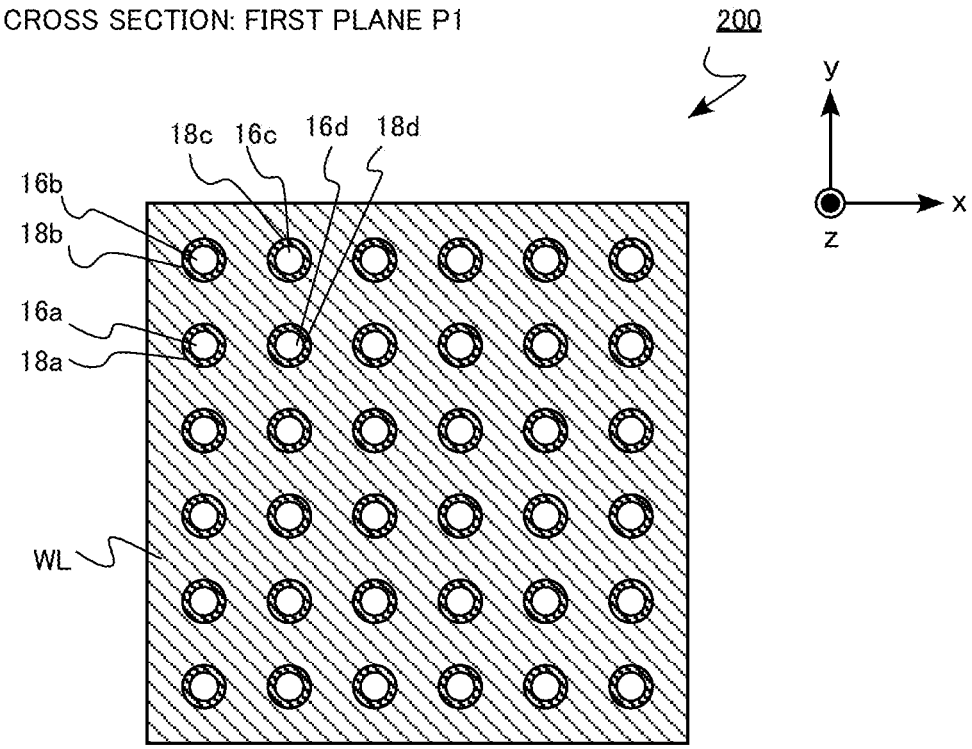
FIGS. 33A, 33B, and 33C are views schematically illustrating a portion of the memory cell array of the semiconductor memory device according to the fourth embodiment.
Figure 33B:
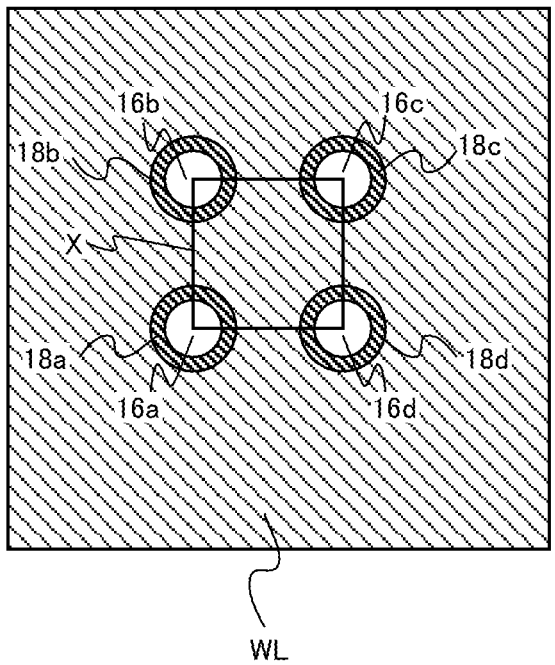
Figure 33C:
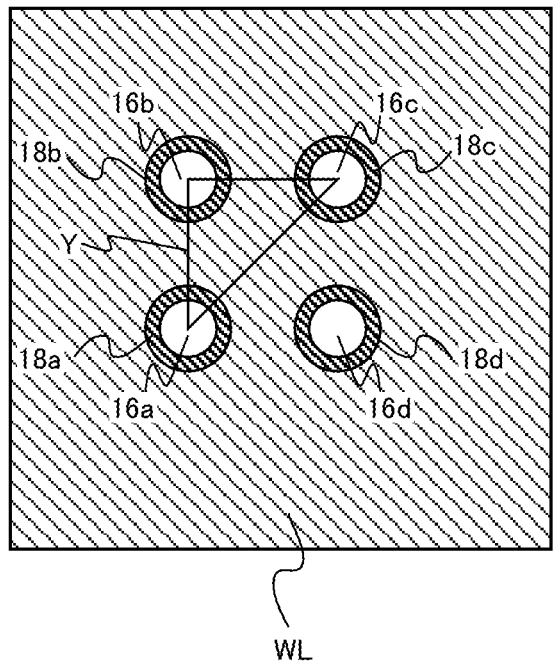

FIG. 33A, FIG. 33B, and FIG. 33C illustrate the cross sections of the memory cell array 200 parallel to the x direction and the y direction. FIG. 33A illustrates the cross section of the memory cell array 200 perpendicular to the z direction. FIG. 33A illustrates the cross section taken along the line CC' of FIG. 30 and FIG. 31. FIG. 33A illustrates the cross section perpendicular to the z direction (first direction), the cross section including the word line WL (gate electrode layer) and the semiconductor layer. FIG. 33A, FIG. 33B, and FIG. 33C illustrate an example of the first plane. FIG. 33B and FIG. 33C are enlarged views illustrating a portion of FIG. 33A.

Figure 34A:
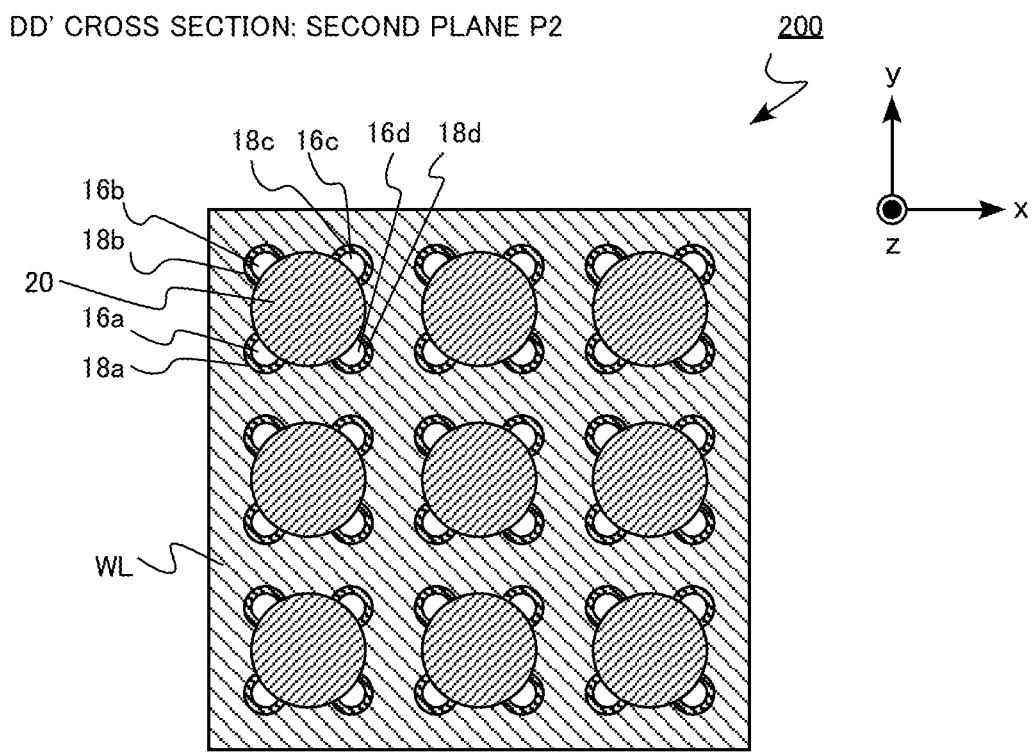
FIGS. 34A, 34B, and 34C are views schematically illustrating a portion of the memory cell array of the semiconductor memory device according to the fourth embodiment.
Figure 34B:
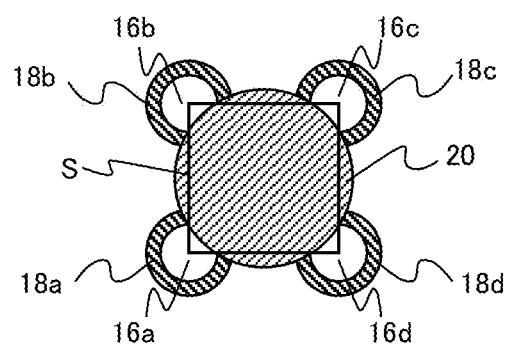
Figure 34C:
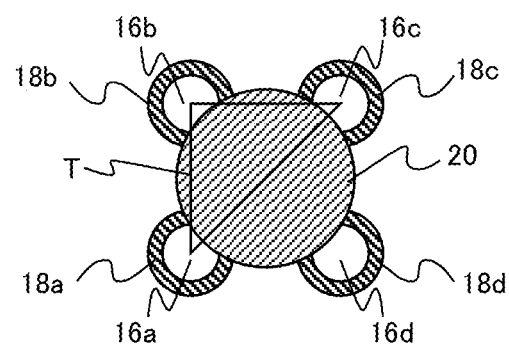

FIG. 34A, FIG. 34B, and FIG. 34C illustrate the cross sections of the memory cell array 200 parallel to the x direction and the y direction. FIG. 34A illustrates the cross section of the memory cell array 200 perpendicular to the z direction. FIG. 34A illustrates the cross section taken along the line DD' of FIG. 30 and FIG. 31. FIG. 34A illustrates the cross section perpendicular to the z direction (first direction), the cross section including the word line WL (gate electrode layer) and the semiconductor layer. FIG. 34A, FIG. 34B, and FIG. 34C illustrate an example of the second plane. FIG. 34B and FIG. 34C are enlarged views illustrating a portion of FIG. 34A.

Figure 35:
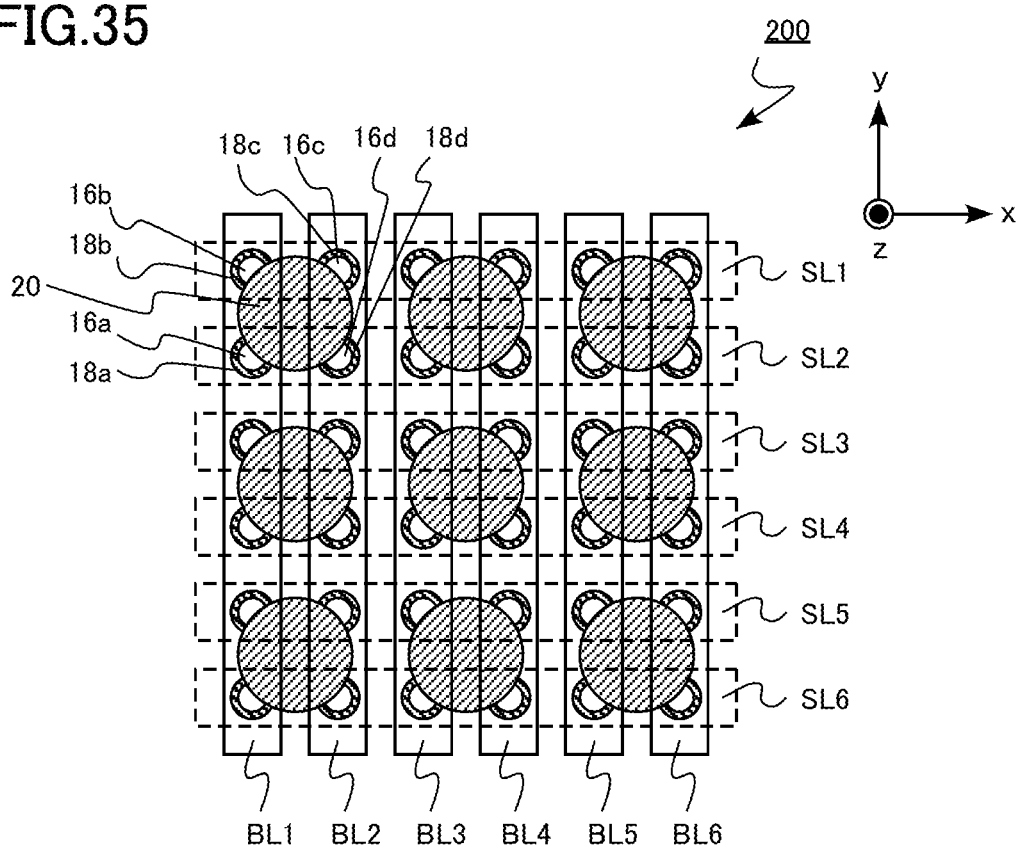
FIG. 35 is a diagram schematically illustrating a portion of the memory cell array of the semiconductor memory device according to the fourth embodiment.

FIG. 35 is a diagram schematically illustrating a portion of the memory cell array of the semiconductor memory device according to the fourth embodiment. FIG. 35 is a diagram schematically illustrating the memory cell array 200 at a position parallel to the x direction and the y direction. FIG. 35 illustrates a layout pattern of the source line SL, the bit line BL, and the semiconductor layer.

Figure 36:
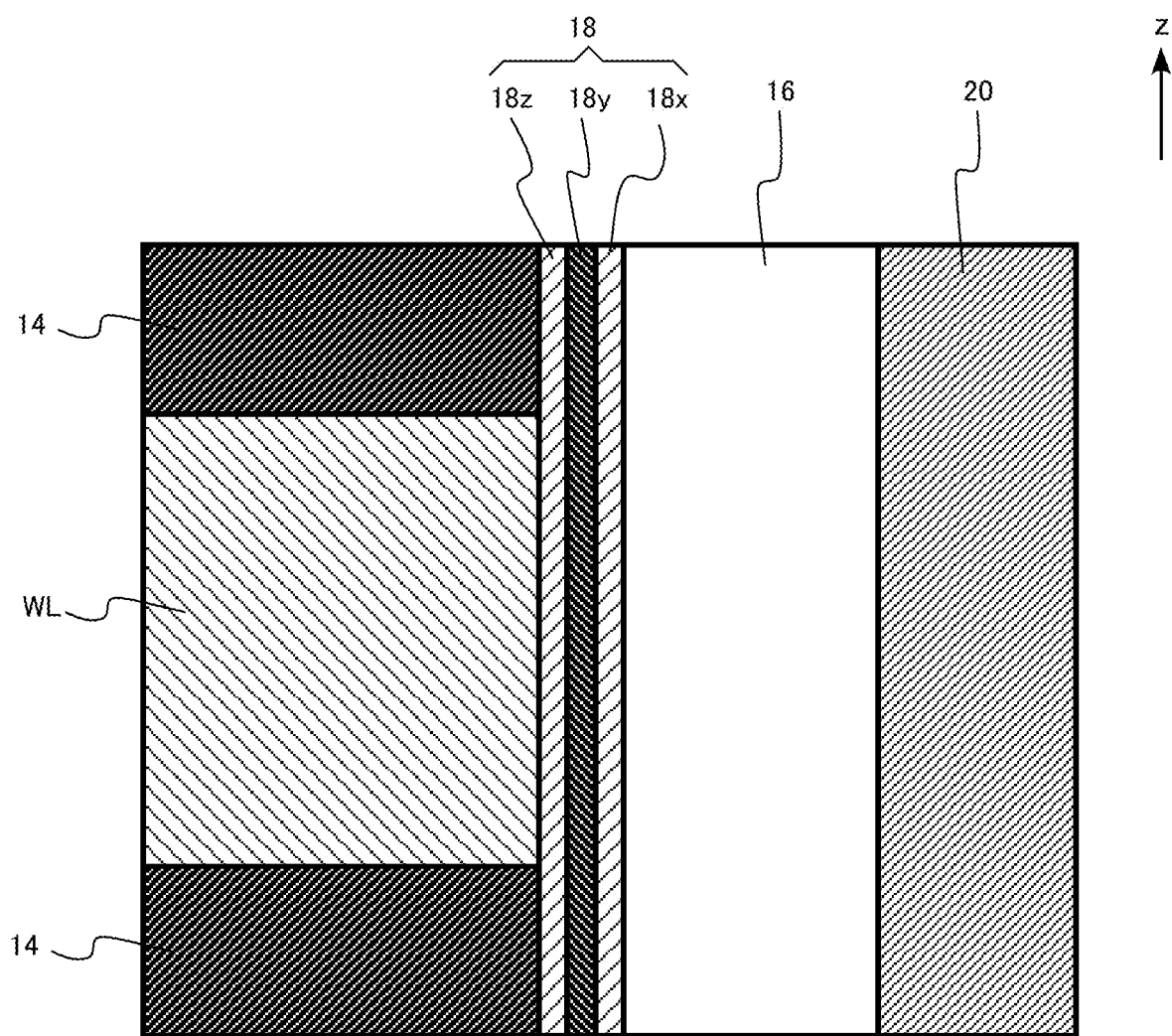
FIG. 36 is a cross-sectional view schematically illustrating a memory cell of the semiconductor memory device according to the fourth embodiment.

FIG. 36 is a cross-sectional view schematically illustrating the memory cell of the semiconductor memory device according to the fourth embodiment. FIG. 36 is a cross-sectional view illustrating a memory cell MC. FIG. 36 illustrates a cross section of the memory cell MC parallel to the z direction. FIG. 36 corresponds to a region surrounded by a rectangle in FIG. 30.

As illustrated in FIG. 30, FIG. 31, FIG. 32, FIG. 33A, FIG. 33B, FIG. 33C, FIG. 34A, FIG. 34B, and FIG. 34C, the memory cell array 200 includes a semiconductor substrate 10, a substrate insulating layer 12, the plurality of source lines SL, the source select gate line SGS, the plurality of word lines WL (gate electrode layers), a plurality of interlayer insulating layers 14 (first insulating layers), a first channel layer 16a (first semiconductor layer), a second channel layer 16b (second semiconductor layer), a third channel layer 16c (third semiconductor layer), a fourth channel layer 16d (fourth semiconductor layer), a first charge accumulation layer 18a, a second charge accumulation layer 18b, a third charge accumulation layer 18c, a fourth charge accumulation layer 18d, a central insulating layer 20 (second insulating layer), and the plurality of bit lines BL.

In the following description, in some cases, the first channel layer 16a (first semiconductor layer), the second channel layer 16b (second semiconductor layer), the third channel layer 16c (third semiconductor layer), and the fourth channel layer 16d (fourth semiconductor layer) are generically referred to as channel layers 16. In addition, in some cases, the first charge accumulation layer 18a, the second charge accumulation layer 18b, the third charge accumulation layer 18c, and the fourth charge accumulation layer 18d are generically referred to as charge accumulation layers 18.

The plurality of source lines SL include a first source line SL1 (first conductive line), a second source line SL2 (second conductive line), a third source line SL3, a fourth source line SL4, a fifth source line SL5, and a sixth source line SL6. The plurality of bit lines BL include a first bit line BL1 (third conductive line), a second bit line BL2 (fourth conductive line), a third bit line BL3, a fourth bit line BL4, a fifth bit line BL5, and a sixth bit line BL6.

A stacked body 22 includes the plurality of word lines WL and the plurality of interlayer insulating layers 14. The stacked body 22 has a first region 22a and a second region 22b. The second region 22b is located in the z direction (first direction) with respect to the first region 22a.

The semiconductor substrate 10 is, for example, a silicon substrate.

The substrate insulating layer 12 is provided on the semiconductor substrate 10. The substrate insulating layer 12 is made of, for example, silicon oxide.

The source lines SL (first conductive lines) are provided on the substrate insulating layer 12. The source lines SL extend in the x direction. The source lines SL are made of, for example, metal or a semiconductor.

The stacked body 22 is provided on the source lines SL. The stacked body 22 is interposed between the source line SL and the bit line.

The interlayer insulating layer 14 and the word line WL or the source select gate line SGS are alternately stacked above the semiconductor substrate 10 in the z direction (first direction). Of the word line WL and the source select gate line SGS alternately stacked in the z direction (first direction), a layer closest to the semiconductor substrate 10 is the source select gate line SGS. The source select gate line SGS is provided between the word line WL and the source line SL. The word line WL and the source select gate line SGS are disposed so as to be separated from each other in the z direction. The stacked body 22 includes the plurality of word lines WL, the source select gate line SGS, and the plurality of interlayer insulating layers 14.

The word line WL and the source select gate line SGS are, for example, plate-shaped conductors. The word line WL and the source select gate line SGS include, for example, metal, metal nitride, metal carbide, or a semiconductor. For example, tungsten (W), titanium (Ti), or tantalum (Ta) can be used as the metal. For example, polysilicon can be used as the semiconductor. The wordline WL and the source select gate line SGS may include barrier metal such as titanium nitride or tantalum nitride.

The word line WL functions as a control electrode of a transistor in the memory cell MC. The word line WL is an example of the gate electrode layer.

The interlayer insulating layer 14 separates the word lines WL from each other and separates the source select gate line SGS from the word line WL. The interlayer insulating layer 14 can be made of, for example, oxide, oxynitride, or nitride. The interlayer insulating layer 14 includes, for example, silicon oxide.

The channel layer 16 is provided in the stacked body 22. The channel layer 16 extends in the z direction. The first channel layer 16a is provided in the stacked body 22 and extends in the z direction. The second channel layer 16b is provided in the stacked body 22 and extends in the z direction. The third channel layer 16c is provided in the stacked body 22 and extends in the z direction. The fourth channel layer 16d is provided in the stacked body 22 and extends in the z direction. In addition, the direction in which the channel layer 16 extends may not be necessarily completely aligned with the first direction. For example, the direction in which the channel layer 16 extends may be in the range of ±5 degrees with respect to the first direction.

The channel layer 16 is made of, for example, a polycrystalline semiconductor. For example, polysilicon is used as the polycrystalline semiconductor. The channel layer 16 functions as a channel region of the transistor in the memory cell MC.

The charge accumulation layer 18 is provided between the word line WL and the channel layer 16. The first charge accumulation layer 18a is provided between the word line WL and the first channel layer 16a. The second charge accumulation layer 18b is provided between the word line WL and the second channel layer 16b. The third charge accumulation layer 18c is provided between the word line WL and the third channel layer 16c. The fourth charge accumulation layer 18d is provided between the word line WL and the fourth channel layer 16d.

The central insulating layer 20 is provided in the stacked body 22. The central insulating layer 20 extends in the z direction. The central insulating layer 20 does not penetrate through the stacked body 22. The central insulating layer 20 is not provided in a portion of the stacked body 22 close to the semiconductor substrate 10.

The central insulating layer 20 is an insulator. The central insulating layer 20 is made of, for example, oxide, oxynitride, or nitride. The central insulating layer 20 is made of, for example, silicon oxide.

As illustrated in FIG. 33A, FIG. 33B, and FIG. 33C, the central insulating layer 20 is not included in a first plane (P1 in FIG. 30 and FIG. 31) located in a portion of the stacked body 22 close to the semiconductor substrate 10, the first plane being perpendicular to the z direction and the first plane including the channel layer 16.

As illustrated in FIG. 33B, in the first plane P1, the word line WL is located in a region (a region X in FIG. 33B) surrounded by a line segment connecting the first channel layer 16a and the second channel layer 16b, a line segment connecting the second channel layer 16b and the third channel layer 16c, a line segment connecting the third channel layer 16c and the fourth channel layer 16d, and a line segment connecting the fourth channel layer 16d and the first channel layer 16a. In addition, as illustrated in FIG. 33C, the word line WL is located in a region (a region Y in FIG. 33C) surrounded by a line segment connecting the first channel layer 16a and the second channel layer 16b, a line segment connecting the second channel layer 16b and the third channel layer 16c, and a line segment connecting the third channel layer 16c and the first channel layer 16a in a plane perpendicular to the z direction, the plane including the word line WL.

As illustrated in FIG. 34A, FIG. 34B, and FIG. 34C, the central insulating layer 20 is included in a second plane (P2 in FIG. 30 and FIG. 31) located in a portion closer to the bit line BL than the first plane P1 in the z direction, the second plane being perpendicular to the z direction and the second plane including the channel layer 16.

As illustrated in FIG. 34A, FIG. 34B, and FIG. 34C, the central insulating layer 20 comes into contact with a plurality of channel layers 16 or a plurality of charge accumulation layers 18 in a plane perpendicular to the z direction, the plane including the word line WL. The plurality of channel layers 16 or the plurality of charge accumulation layers 18 are provided outside the central insulating layer 20. The plurality of channel layers 16 and the plurality of charge accumulation layers 18 are provided so as to surround the central insulating layer 20.

As illustrated in FIG. 34A, FIG. 34B, and FIG. 34C, four channel layers 16 are disposed around the central insulating layer 20. The central insulating layer 20 is surrounded by the four channel layers 16.

As illustrated in FIG. 34A, FIG. 34B, and FIG. 34C, the central insulating layer 20 comes into contact with the first channel layer 16a or the first charge accumulation layer 18a, the second channel layer 16b or the second charge accumulation layer 18b, the third channel layer 16c or the third charge accumulation layer 18c, and the fourth channel layer 16d or the fourth charge accumulation layer 18d in a plane perpendicular to the z direction, the plane including the word line WL. In particular, FIG. 34A, FIG. 34B, and FIG. 34C illustrate a case where the central insulating layer 20 comes into contact with the first channel layer 16a and the first charge accumulation layer 18a, the second channel layer 16b and the second charge accumulation layer 18b, the third channel layer 16c and the third charge accumulation layer 18c, and the fourth channel layer 16d and the fourth charge accumulation layer 18d.

As illustrated in FIG. 34B, the central insulating layer 20 is located in a region (a region S in FIG. 34B) surrounded by a line segment connecting the first channel layer 16a and the second channel layer 16b, a line segment connecting the second channel layer 16b and the third channel layer 16c, a line segment connecting the third channel layer 16c and the fourth channel layer 16d, and a line segment connecting the fourth channel layer 16d and the first channel layer 16a in a plane perpendicular to the z direction, the plane including the word line WL. Further, as illustrated in FIG. 34C, the central insulating layer 20 is located in a region (a region T in FIG. 34C) surrounded by a line segment connecting the first channel layer 16a and the second channel layer 16b, a line segment connecting the second channel layer 16b and the third channel layer 16c, and a line segment connecting the third channel layer 16c and the first channel layer 16a in a plane perpendicular to the z direction, the plane including the word line WL.

As illustrated in FIG. 30, a first distance (d1 in FIG. 30) between two end surfaces of the same word line WL monotonically increases, for example, from a first word line WL1 to a second word line WL2 in the z direction in a first cross section parallel to the z direction, the first cross section including the central insulating layer 20. In other words, the first distance d1 monotonically increases from the first region 22a to the second region 22b of the stacked body 22 in the z direction. The first distance d1 monotonically increases from the semiconductor substrate 10 to the bit line BL.

In contrast, as illustrated in FIG. 31, a second distance (d2 in FIG. 31) between two end surfaces of the same word line WL monotonically increases, for example, from the first word line WL1, decreases, and then monotonically increases toward the second word line WL2 in the z direction in a second cross section parallel to the z direction, the second cross section including the central insulating layer 20, and the second cross section being different from the first cross section. In the first region 22a of the stacked body 22, the second distance d2 monotonically increases. In addition, in the second region 22b of the stacked body 22, the second distance d2 monotonically increases. However, a change in the second distance d2 between the first region 22a and the second region 22b is discontinuous. The second distance d2 decreases once between the first region 22a and the second region 22b.

The second distance d2 between two end surfaces of the lowermost word line WL in the second region 22b is less than the second distance d2 between two end surfaces of the uppermost word line WL in the first region 22a. For example, the second distance d2 between two end surfaces of the lowermost word line WL in the second region 22b is equal to or less than 90% of the second distance d2 between two end surfaces of the uppermost word line WL in the first region 22a.

The first cross section includes at least one of the first channel layer 16a, the second channel layer 16b, the third channel layer 16c, and the fourth channel layer 16d. In addition, the second cross section does not include any of the first channel layer 16a, the second channel layer 16b, the third channel layer 16c, and the fourth channel layer 16d.

A plurality of bit lines BL are provided on the stacked body 22. The bit lines BL extend in the y direction. The bit line BL is located in the z direction with respect to the source line SL. The bit line BL extends in a direction orthogonal to the source line SL.

The bit line BL includes, for example, metal, metal nitride, metal carbide, or a semiconductor. For example, tungsten (W), titanium (Ti), or tantalum (Ta) can be used as the metal. For example, polysilicon can be used as the semiconductor. The bit line BL may include barrier metal such as titanium nitride or tantalum nitride.

As illustrated in FIG. 30 and FIG. 35, the lower end (one end) of the second channel layer 16b and the lower end (one end) of the third channel layer 16c are electrically connected to the first source line SL1 (first conductive line). In addition, the lower end (one end) of the first channel layer 16a and the lower end (one end) of the fourth channel layer 16d are electrically connected to the second source line SL2 (second conductive line). Further, the upper end (the other end) of the first channel layer 16a and the upper end (the other end) of the second channel layer 16b are electrically connected to the first bit line BL1 (third conductive line). Furthermore, the upper end (the other end) of the third channel layer 16c and the upper end (the other end) of the fourth channel layer 16d are electrically connected to the second bit line BL2 (fourth conductive line).

Next, an example of a method for manufacturing the semiconductor memory device according to the fourth embodiment will be described.

In the method for manufacturing the semiconductor memory device according to the fourth embodiment, a plurality of first layers as insulators and a plurality of second layers are alternately stacked in the first direction to form a first stacked body. A first mask member having a central opening portion is formed on the first stacked body. A first central hole having a depth less than a thickness of the first stacked body is formed using the first mask member as a mask. A plurality of first layers and a plurality of second layers are alternately stacked in the first direction to form a second stacked body. A second central hole is formed in the first stacked body. A second mask member having a first opening portion partially overlapping the second central hole, a second opening portion partially overlapping the second central hole, and a third opening portion partially overlapping the second central hole is formed on the second stacked body. A first hole, a second hole, and a third hole penetrating through the first stacked body and the second stacked body are formed using the second mask member as a mask. Hereinafter, a case where the second layer is an insulator and the second layer is substituted with a conductive layer after the first hole, the second hole, and the third hole are formed will be described as an example.

FIG. 37, FIG. 38, FIG. 39, FIG. 40, FIG. 41, FIG. 42, FIG. 43, FIG. 44, FIG. 45, FIG. 46, FIG. 47, FIG. 48, FIG. 49, FIG. 50, FIG. 51, FIG. 52, FIG. 53, FIG. 54, FIG. 55, and FIG. 56 are views schematically illustrating the method for manufacturing the semiconductor memory device according to the fourth embodiment. FIG. 37, FIG. 38, FIG. 40, FIG. 41, FIG. 42, FIG. 43, FIG. 44, FIG. 46, FIG. 47, FIG. 48, FIG. 50, FIG. 51, FIG. 52, FIG. 54, FIG. 55, and FIG. 56 are cross-sectional views illustrating a cross section corresponding to FIG. 30. FIG. 39, FIG. 45, FIG. 49, and FIG. 52 are top views corresponding to FIG. 38, FIG. 44, FIG. 48, and FIG. 50, respectively.

Figure 37:
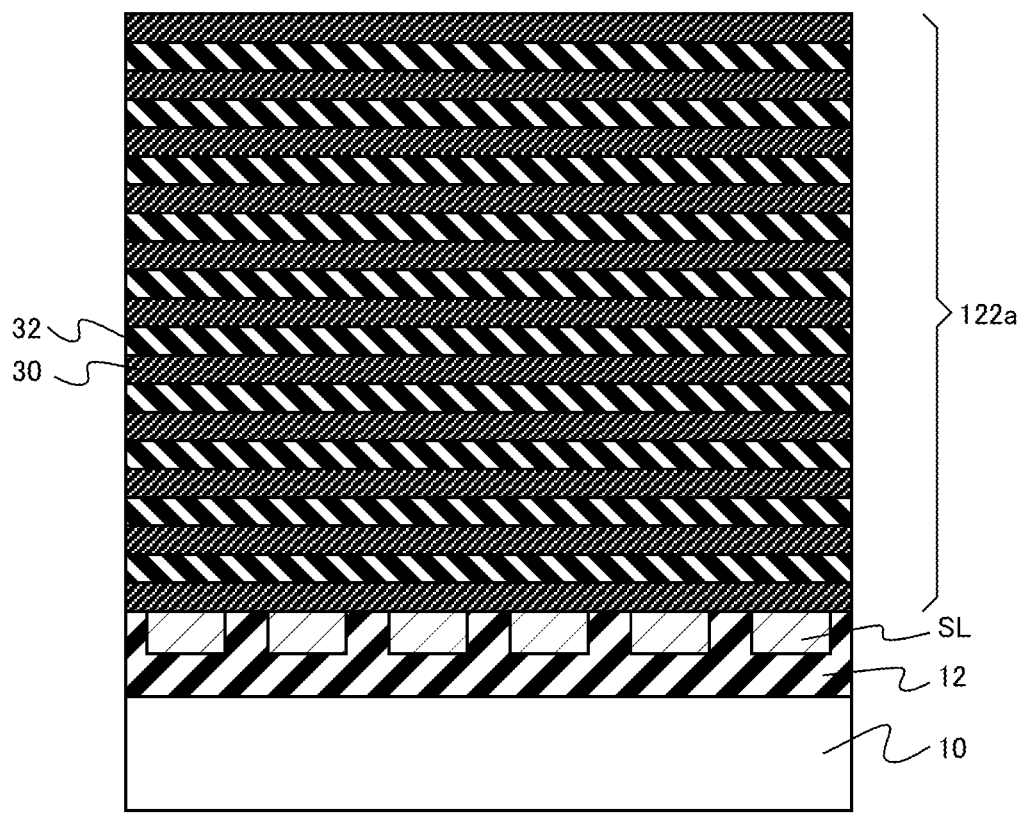
FIG. 37 is a view schematically illustrating a method for manufacturing the semiconductor memory device according to the fourth embodiment.

First, the substrate insulating layer 12 and the plurality of source lines SL are formed on the semiconductor substrate 10. The source lines SL extend in, for example, the x direction perpendicular to the z direction. The substrate insulating layer 12 is, for example, a silicon oxide layer. Then, a plurality of silicon oxide layers 30 (first layers) and a plurality of silicon nitride layers 32 (second layers) are alternately stacked on the source lines SL (FIG. 37). The silicon oxide layers 30 and the silicon nitride layers 32 form a first region 122a of a stacked body 122.

The silicon oxide layers 30 and the silicon nitride layers 32 are formed by, for example, a chemical vapor deposition method (CVD method). A portion of the silicon oxide layer 30 finally becomes the interlayer insulating layer 14.

The silicon nitride layer 32 is a sacrifice layer. The silicon nitride layers 32 are finally substituted with conductive layers and become the word line WL and the source select gate line SGS.

Figure 38:
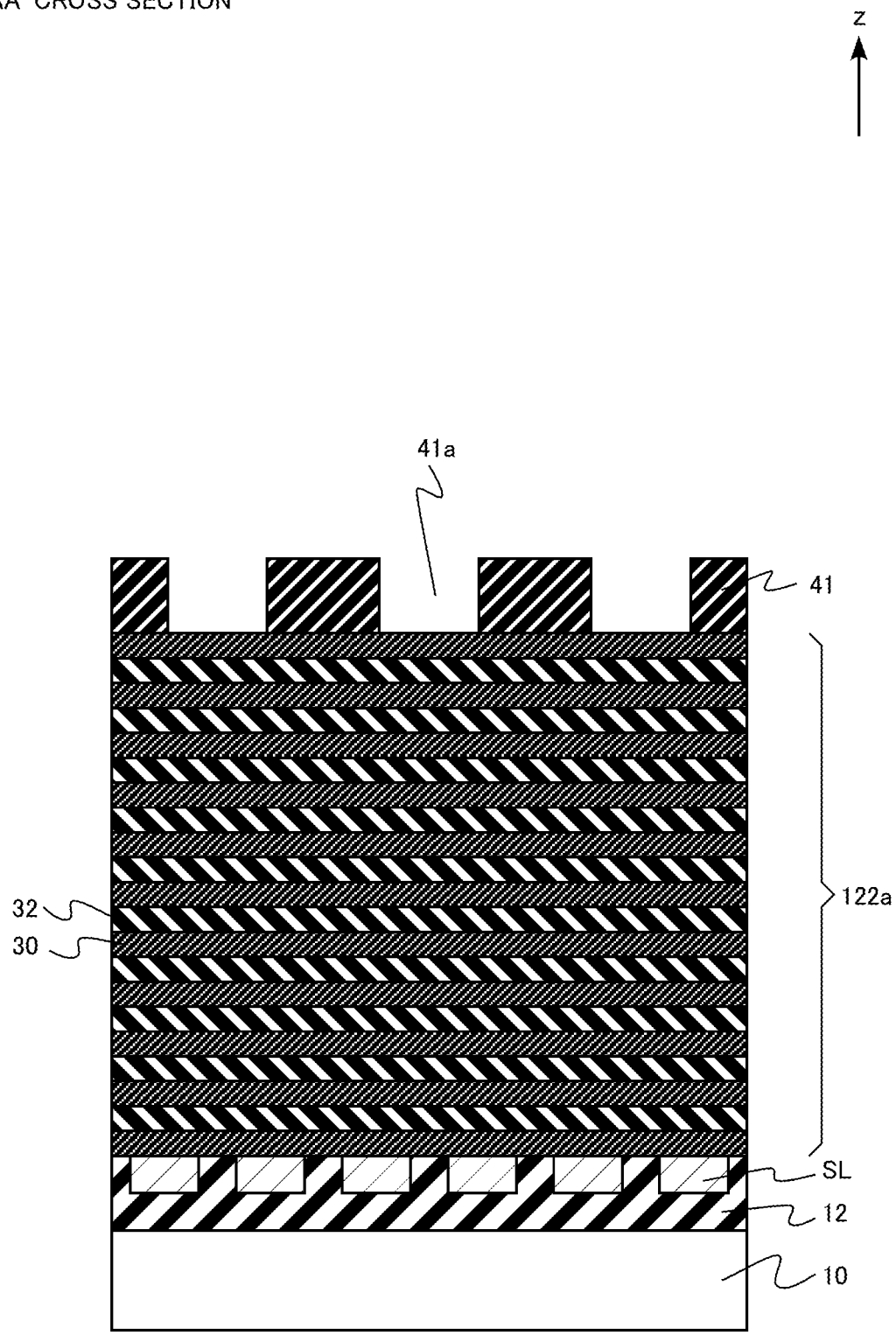
FIG. 38 is a view schematically illustrating the method for manufacturing the semiconductor memory device according to the fourth embodiment.
Figure 39:
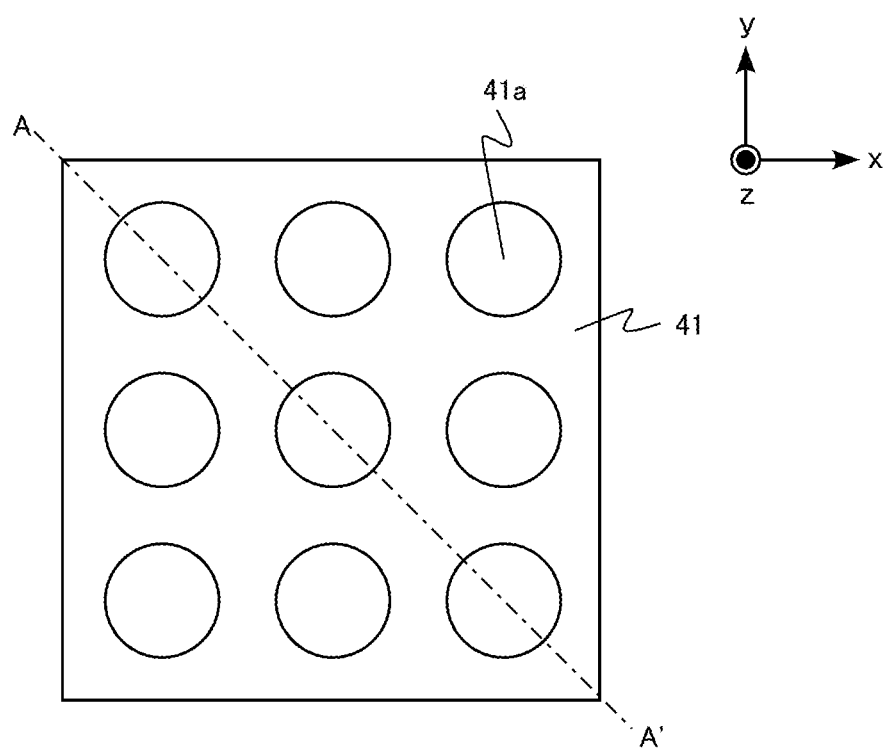
FIG. 39 is a view schematically illustrating the method for manufacturing the semiconductor memory device according to the fourth embodiment.

Then, a first processing mask 41 (first mask member) is formed on the first region 122a of the stacked body 122 (FIG. 38). For example, a photoresist or a carbon film is used as the first processing mask 41. The first processing mask 41 has central opening portions 41a with a circular shape (FIG. 39).

Figure 40:
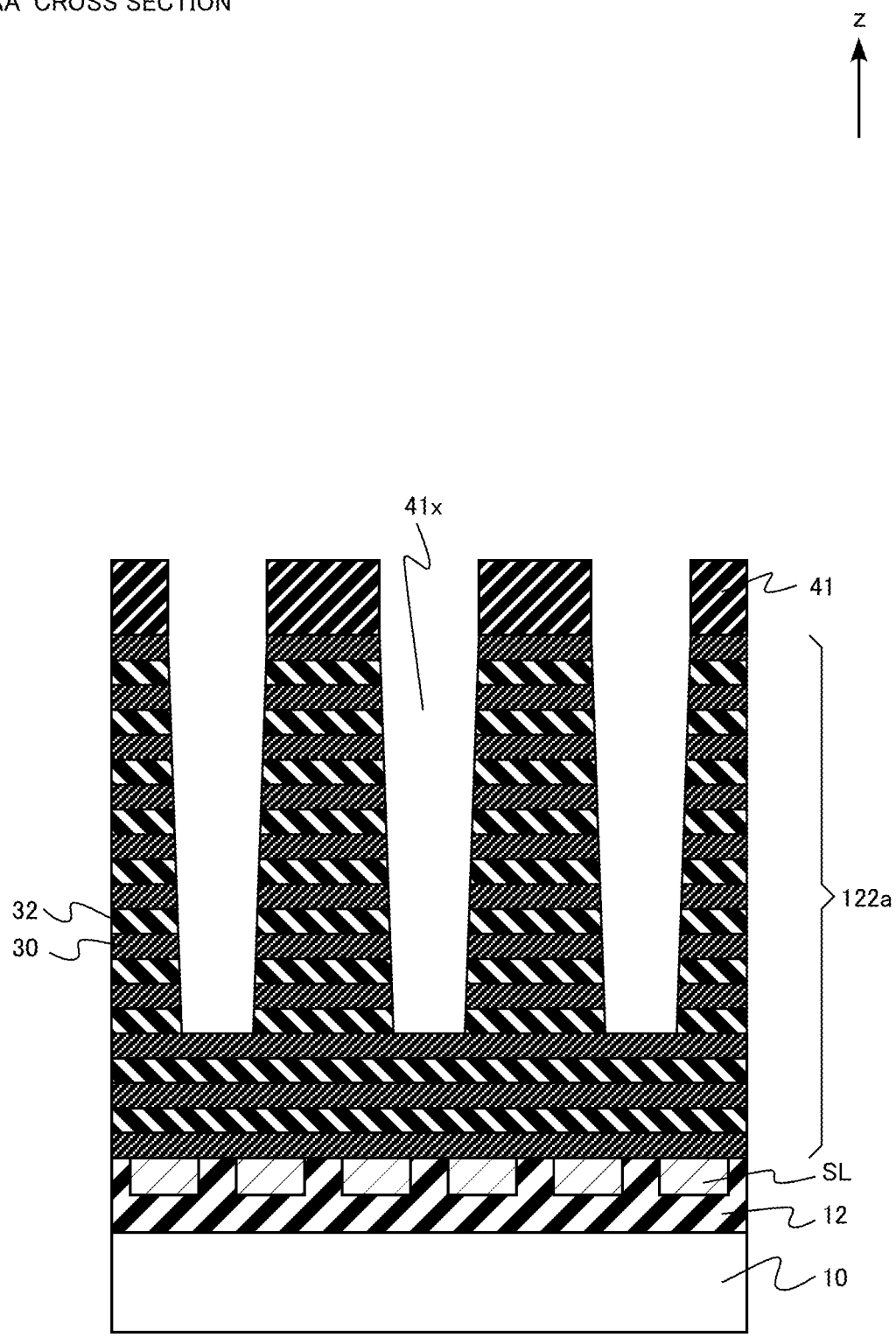
FIG. 40 is a view schematically illustrating the method for manufacturing the semiconductor memory device according to the fourth embodiment.

Then, the silicon oxide layers 30 and the silicon nitride layers 32 are etched using the first processing mask 41 as a mask to form central holes 41x penetrating through the first region 122a (FIG. 40). In other words, the depth of the central hole 41x is less than the thickness of the first region 122a. The silicon oxide layer 30 and the silicon nitride layer 32 that have not been removed by etching remain in a lower portion of the first region 122a. The central hole 41x is formed by, for example, a reactive ion etching method (RIE method).

Figure 41:
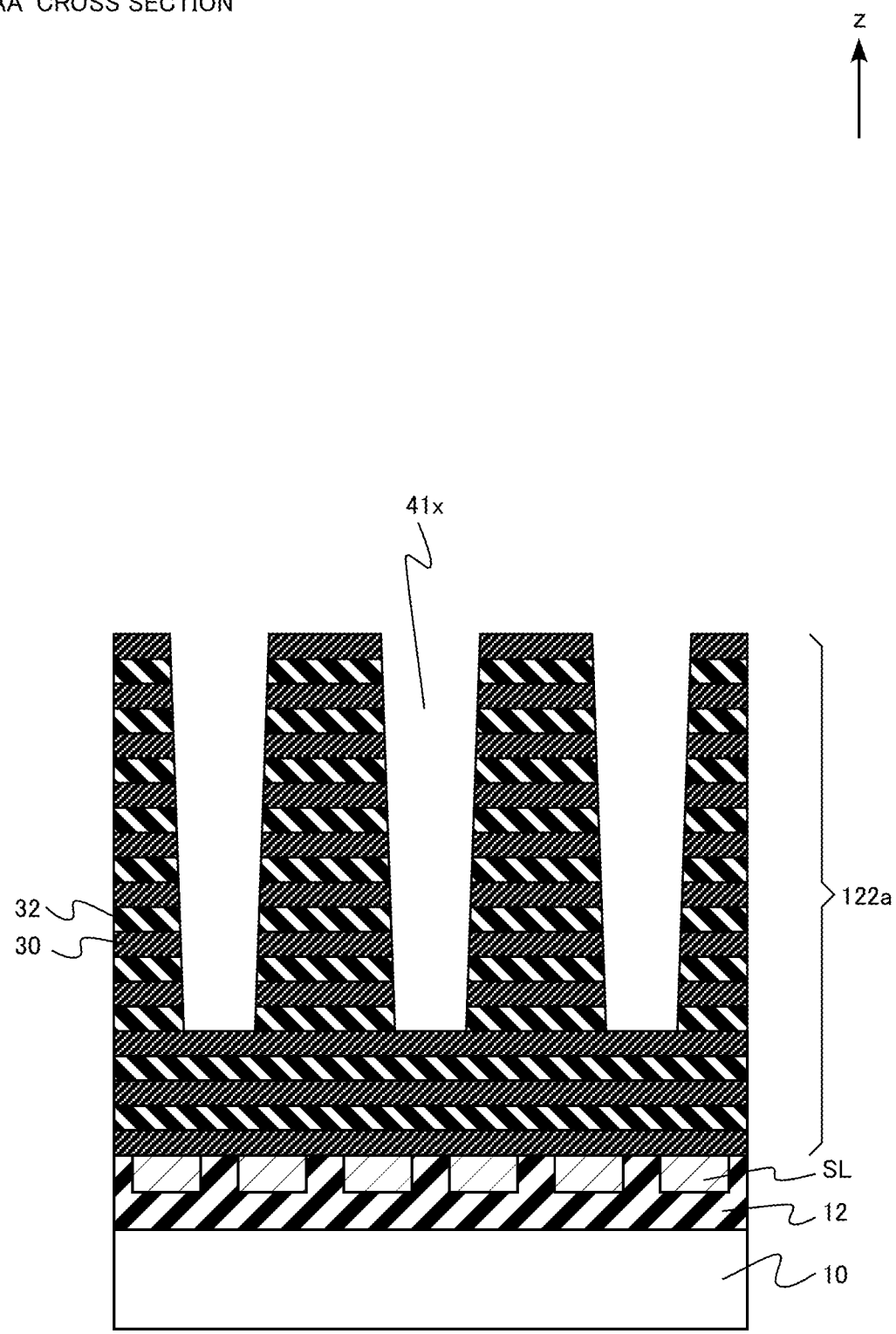
FIG. 41 is a view schematically illustrating the method for manufacturing the semiconductor memory device according to the fourth embodiment.

Then, the first processing mask 41 is removed (FIG. 41).

Figure 42:
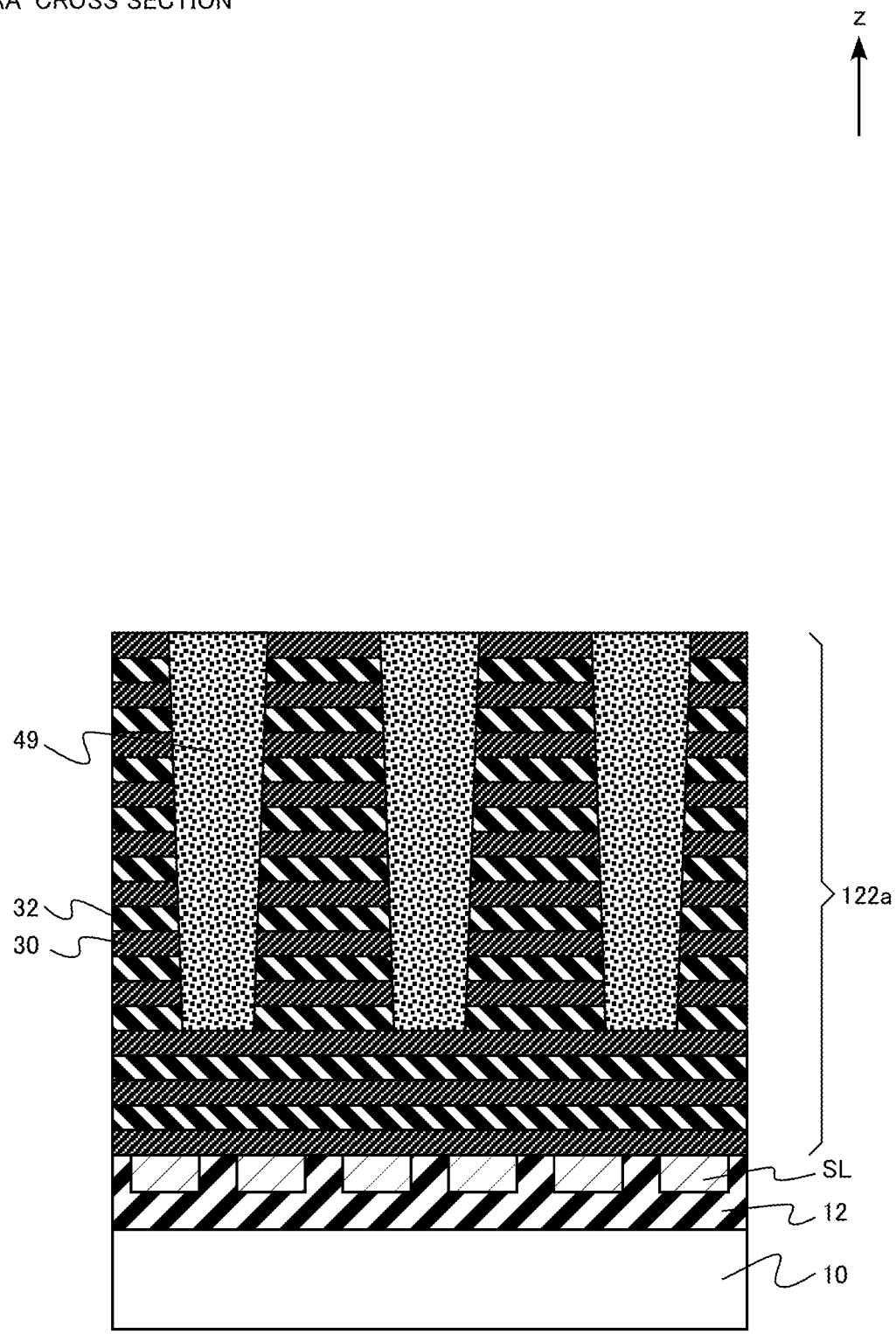
FIG. 42 is a view schematically illustrating the method for manufacturing the semiconductor memory device according to the fourth embodiment.

Then, the central hole 41x is filled with spin-on-glass 49 (SOG) (FIG. 42).

Figure 43:
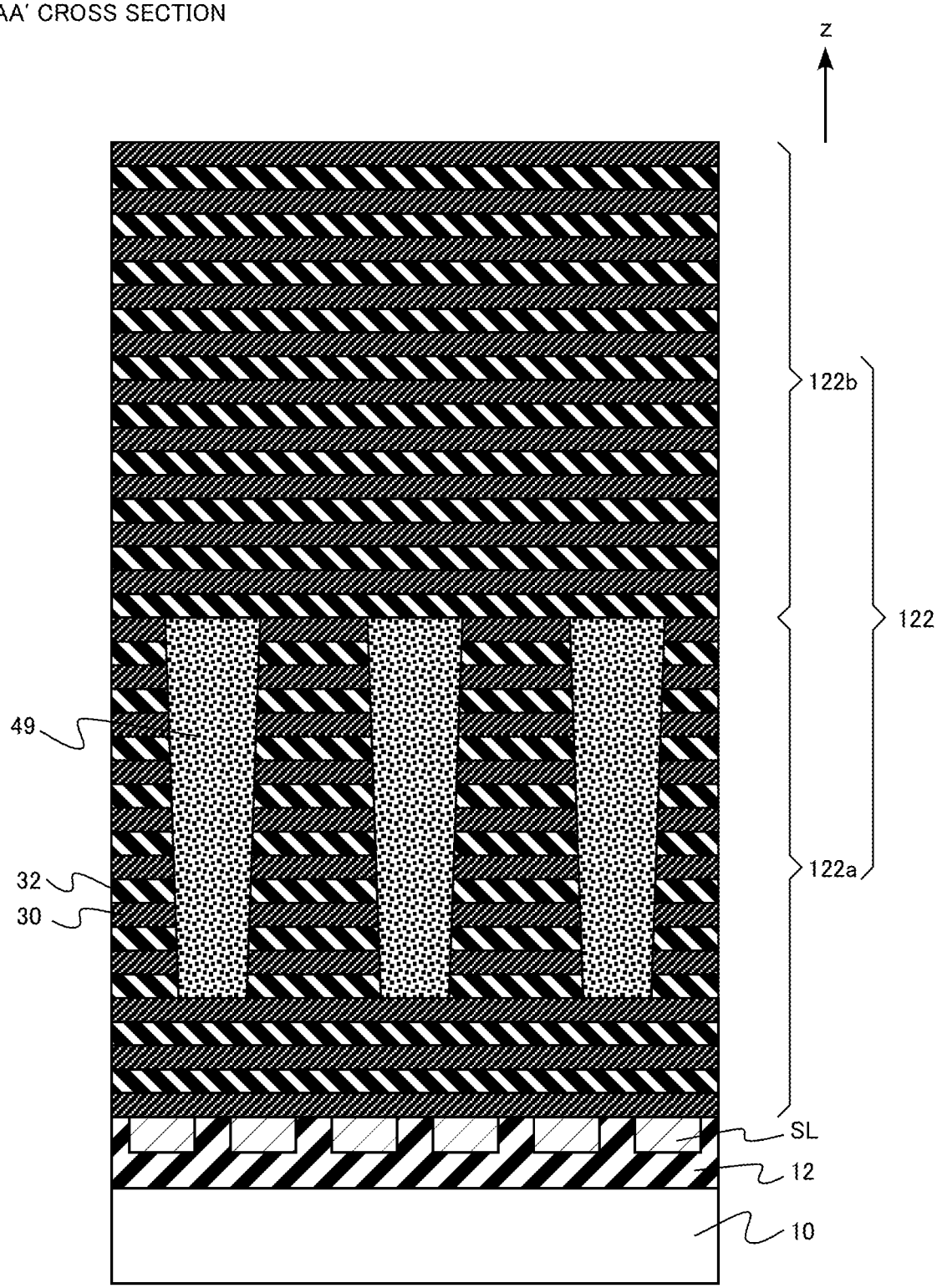
FIG. 43 is a view schematically illustrating the method for manufacturing the semiconductor memory device according to the fourth embodiment.

Then, the silicon oxide layers 30 and the silicon nitride layers 32 are alternately stacked on the first region 122a (FIG. 43). A second region 122b of the stacked body 122 is formed.

Figure 44:
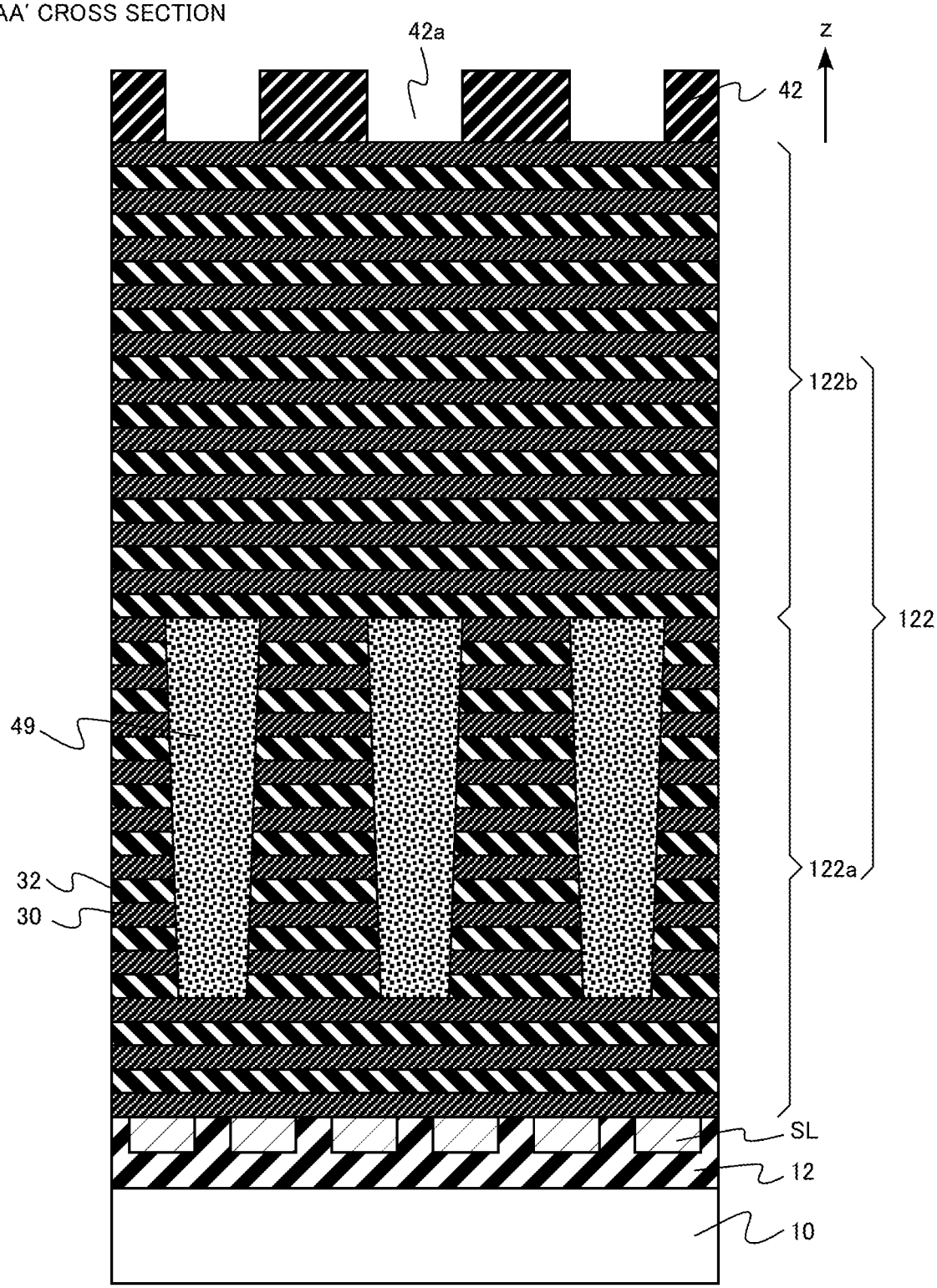
FIG. 44 is a view schematically illustrating the method for manufacturing the semiconductor memory device according to the fourth embodiment.
Figure 45:
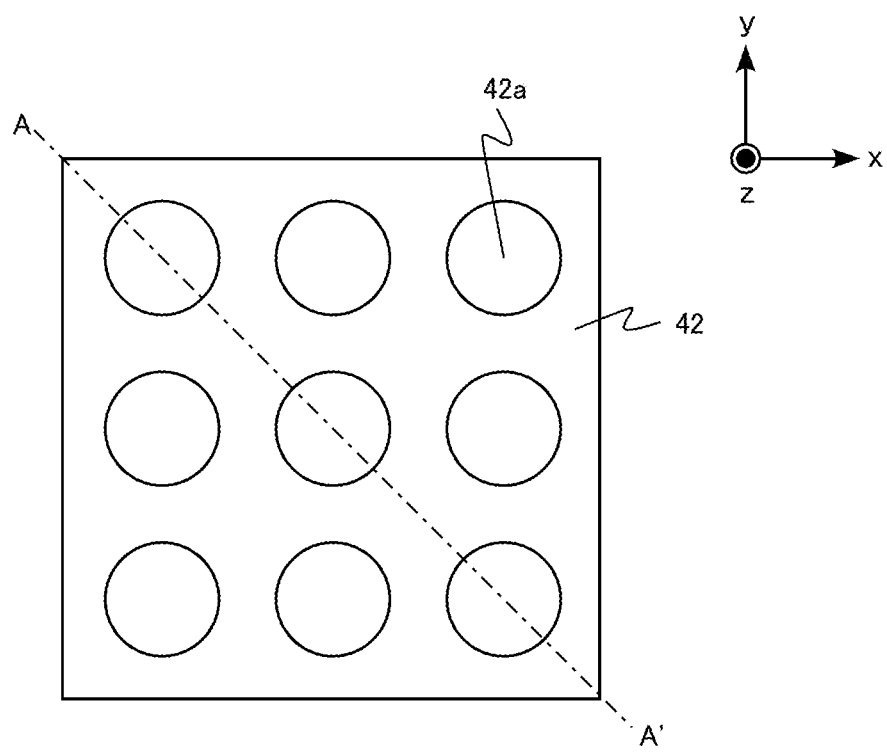
FIG. 45 is a view schematically illustrating the method for manufacturing the semiconductor memory device according to the fourth embodiment.

Then, a second processing mask 42 is formed on the second region 122b of the stacked body 122 (FIG. 44). For example, a photoresist or a carbon film is used as the second processing mask 42. The second processing mask 42 has central opening portions 42a with a circular shape (FIG. 45).

Figure 46:
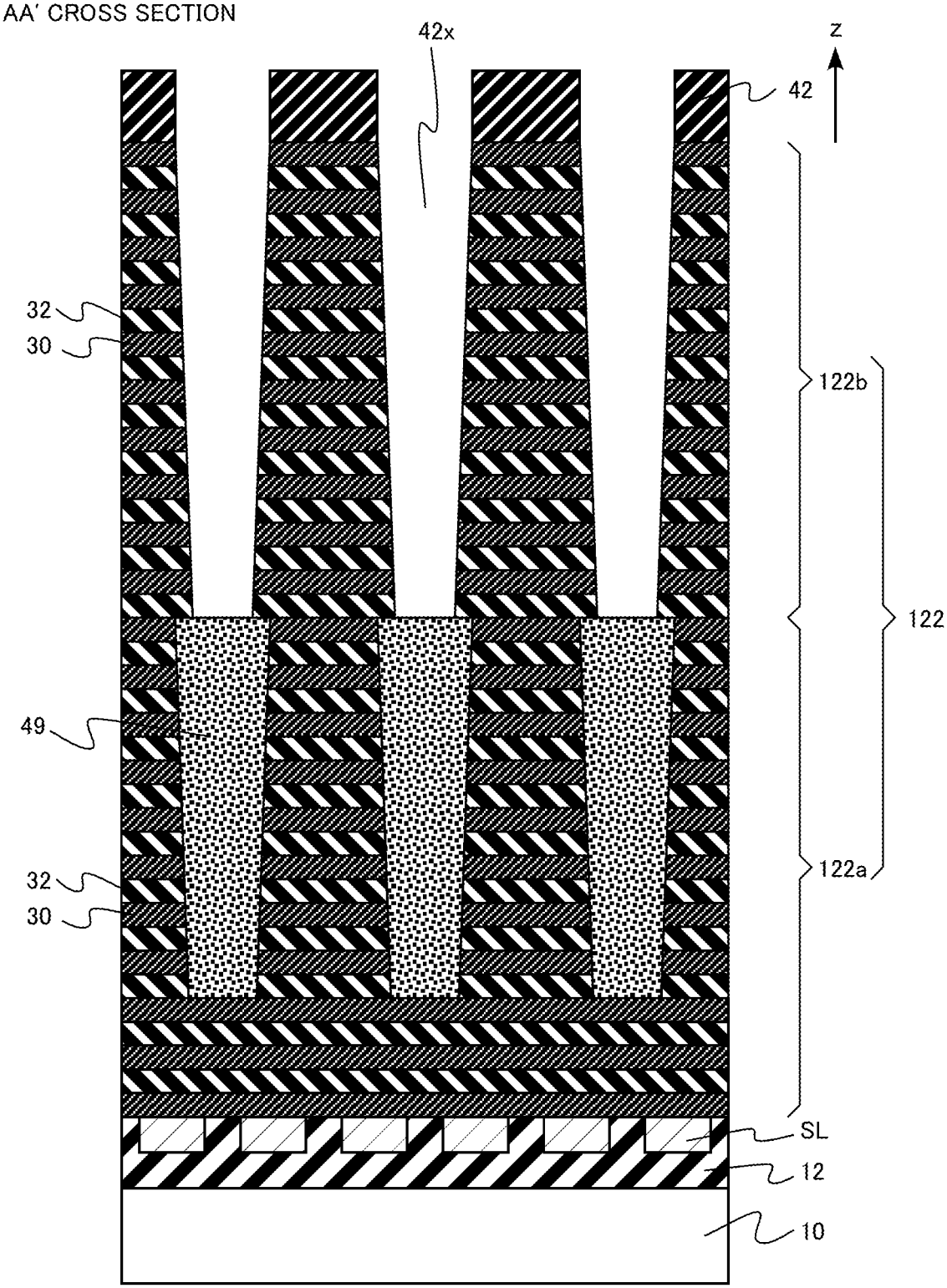
FIG. 46 is a view schematically illustrating the method for manufacturing the semiconductor memory device according to the fourth embodiment.

Then, the silicon oxide layers 30 and the silicon nitride layers 32 are etched using the second processing mask 42 as a mask to form central holes 42x penetrating through the second region 122b (FIG. 46). The central hole 42x reaches the spin-on-glass 49. The central hole 42x is formed by, for example, the RIE method.

Figure 47:
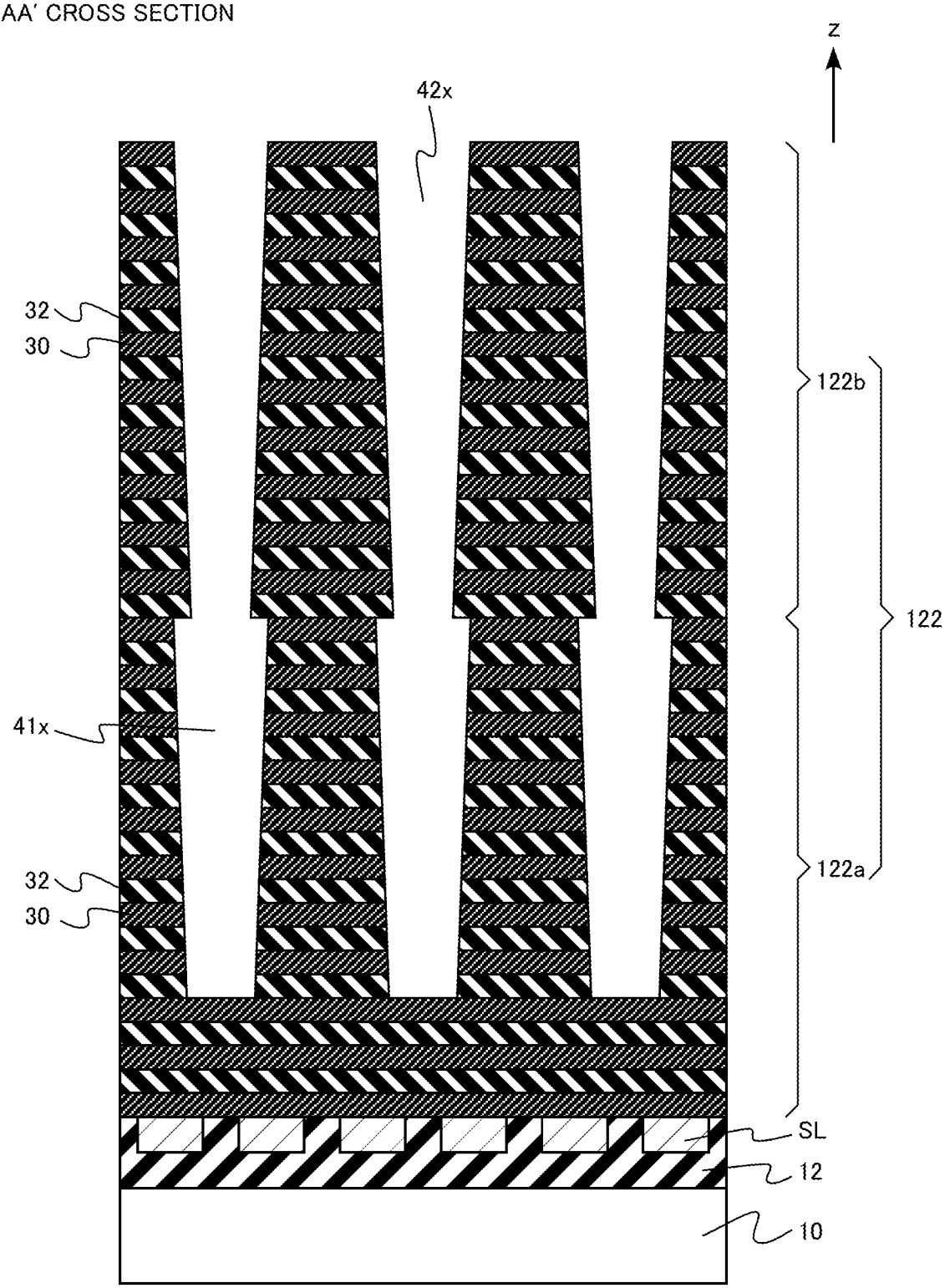
FIG. 47 is a view schematically illustrating the method for manufacturing the semiconductor memory device according to the fourth embodiment.

Then, the second processing mask 42 and the spin-on-glass 49 are removed (FIG. 47). The spin-on-glass 49 is removed by, for example, wet etching.

Figure 48:
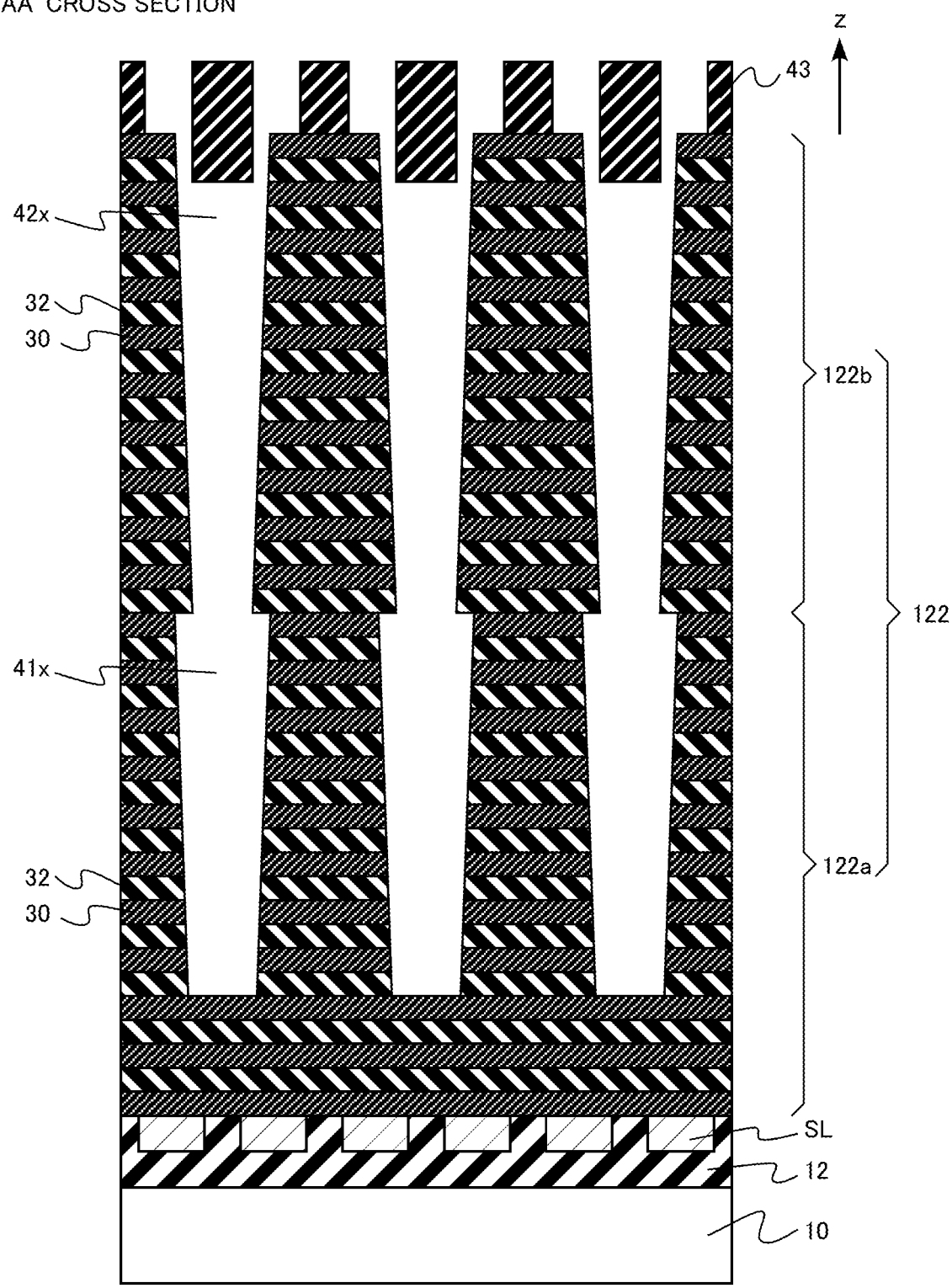
FIG. 48 is a view schematically illustrating the method for manufacturing the semiconductor memory device according to the fourth embodiment.
Figure 49:
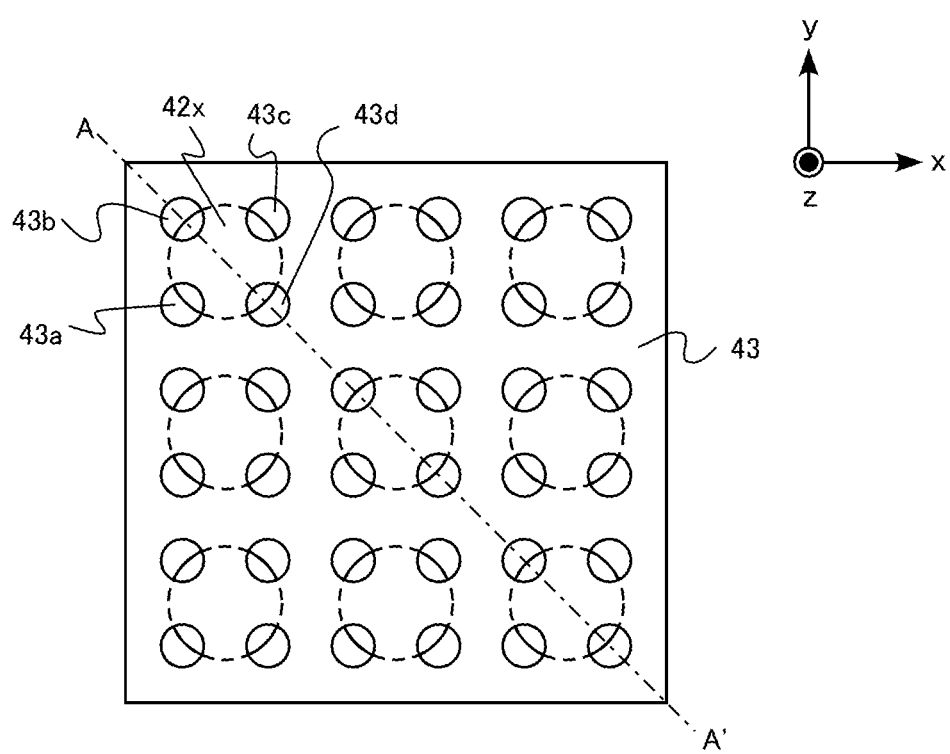
FIG. 49 is a view schematically illustrating the method for manufacturing the semiconductor memory device according to the fourth embodiment.

Then, a third processing mask 43 (second mask member) is formed (FIG. 48). The third processing mask 43 has a first opening portion 43a partially overlapping the central hole 42x, a second opening portion 43b partially overlapping the central hole 42x, a third opening portion 43c partially overlapping the central hole 42x, and a fourth opening portion 43d partially overlapping the central hole 42x (FIG. 49). In FIG. 49, a dashed circle indicates the central hole 42x.

Figure 50:
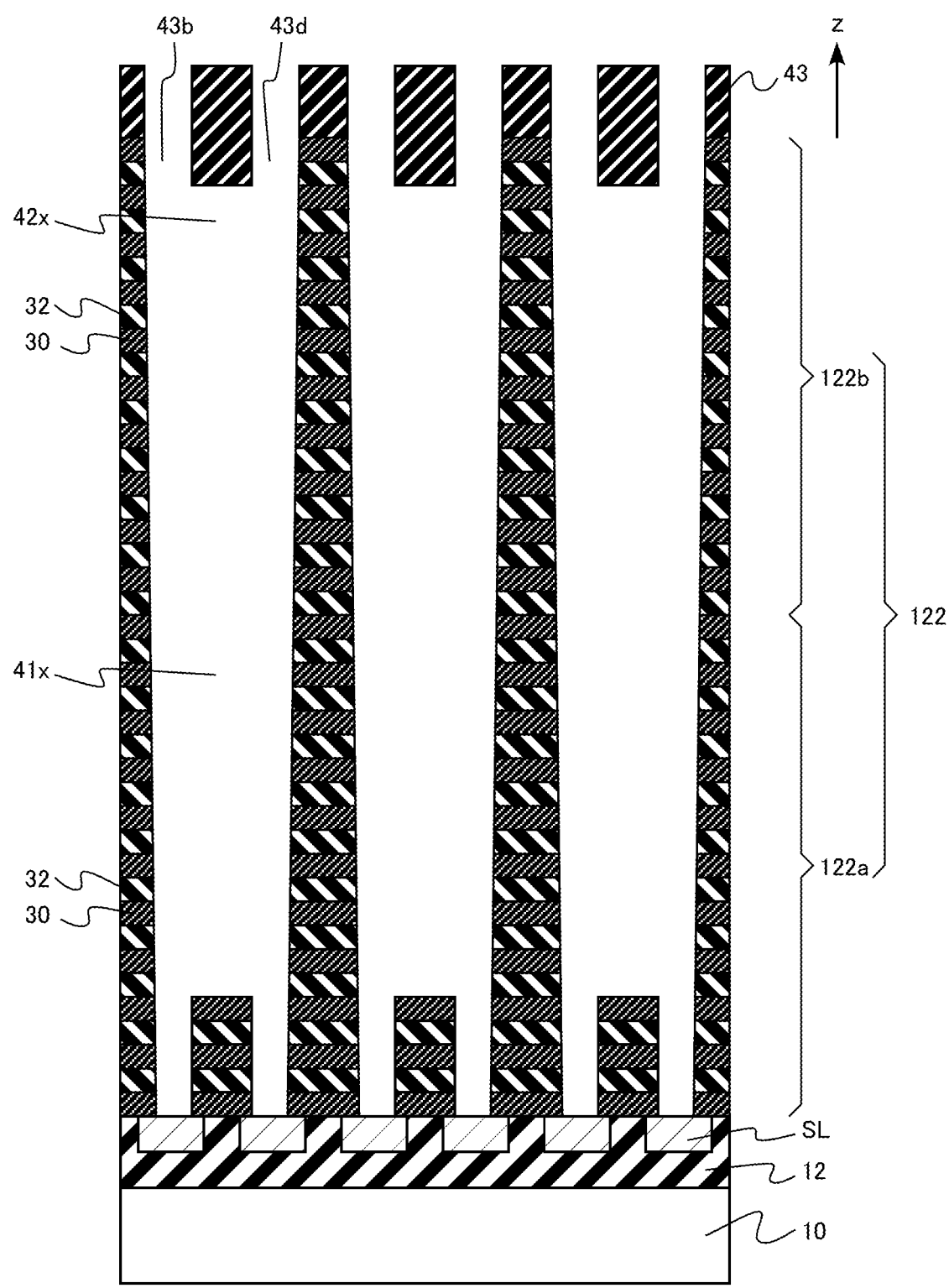
FIG. 50 is a view schematically illustrating the method for manufacturing the semiconductor memory device according to the fourth embodiment.

Then, the silicon oxide layers 30 and the silicon nitride layers 32 are etched using the third processing mask 43 as a mask (FIG. 50). A first memory hole 43p (first hole), a second memory hole 43q (second hole), a third memory hole 43r (third hole), and a fourth memory hole 43s (fourth hole) penetrating through the stacked body 122 are formed around the central hole 41x and the central hole 42x by the etching. The silicon oxide layers 30 and the silicon nitride layers 32 are etched by, for example, the RIE method. Substantially, the central hole 41x, the central hole 42x, the first memory hole 43p, the second memory hole 43q, the third memory hole 43r, and the fourth memory hole 43s are not a plurality of independent holes, but are one connected hole. That is, the central hole 41x, the central hole 42x, the first memory hole 43p, the second memory hole 43q, the third memory hole 43r, and the fourth memory hole 43s may be referred to as a central hole portion 41x, a central hole portion 42x, a first memory hole portion 43p (first hole portion), a second memory hole portion 43q (second hole portion), a third memory hole portion 43r (third hole portion), and a fourth memory hole portion 43s (fourth hole portion) of one hole, respectively.

The first memory hole 43p, the second memory hole 43q, the third memory hole 43r, and the fourth memory hole 43s are also formed in the silicon oxide layer 30 and the silicon nitride layer 32 remaining in the lower portion of the first region 122a without being etched when the central hole 41x is formed.

Figure 51:
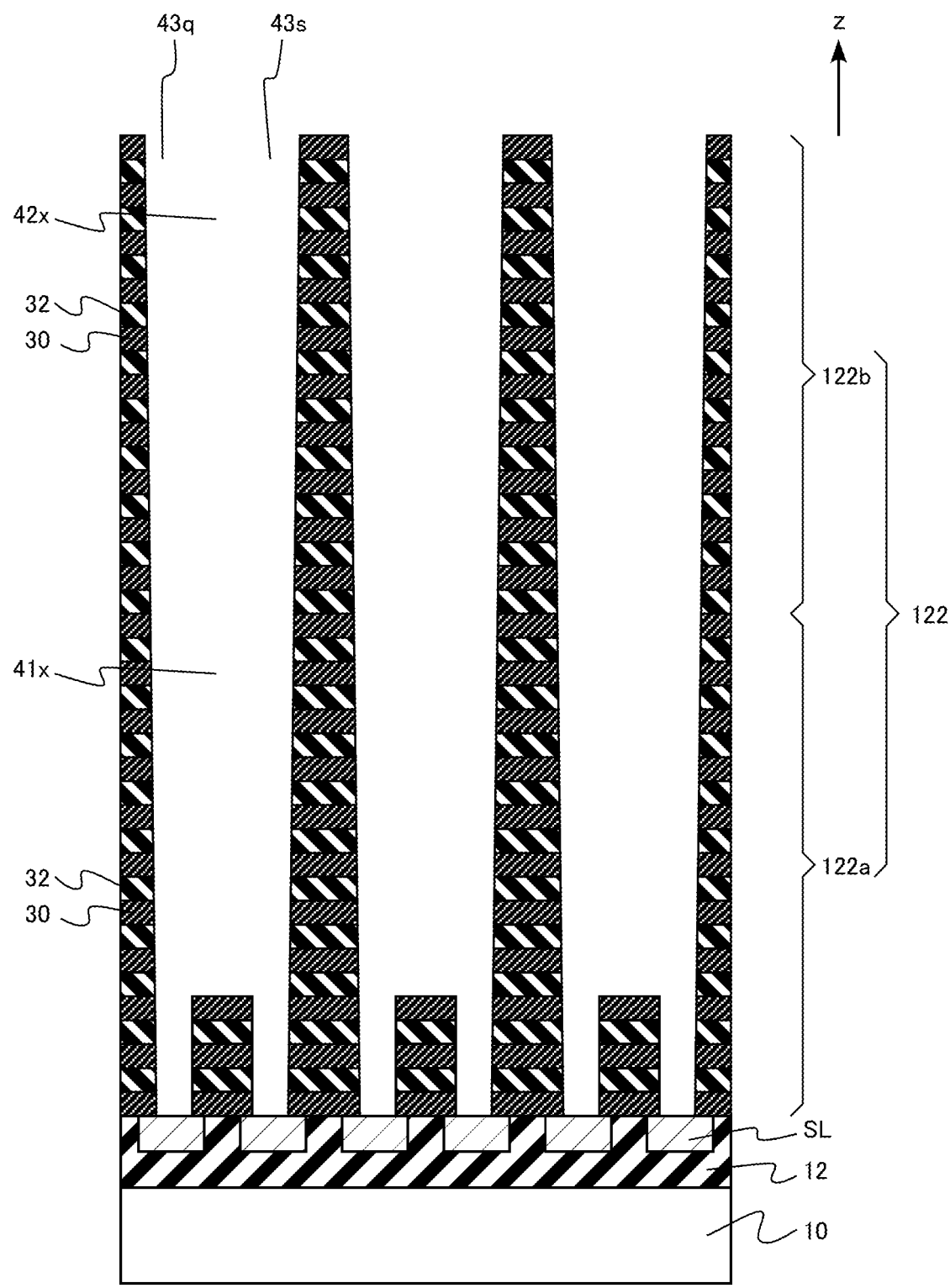
FIG. 51 is a view schematically illustrating the method for manufacturing the semiconductor memory device according to the fourth embodiment.
Figure 52:
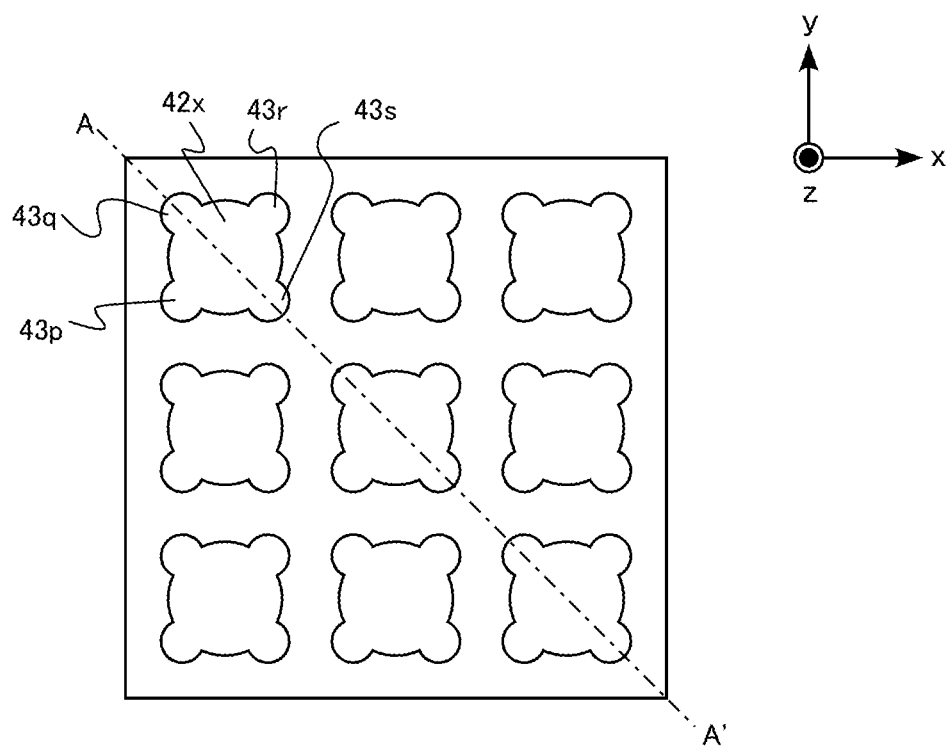
FIG. 52 is a view schematically illustrating the method for manufacturing the semiconductor memory device according to the fourth embodiment.

Then, the third processing mask 43 is removed (FIG. 51). The first memory hole 43p (first hole), the second memory hole 43q (second hole), the third memory hole 43r (third hole), and the fourth memory hole 43s (fourth hole) are formed around the central hole 41x and the central hole 42x (FIG. 52).

Figure 53:
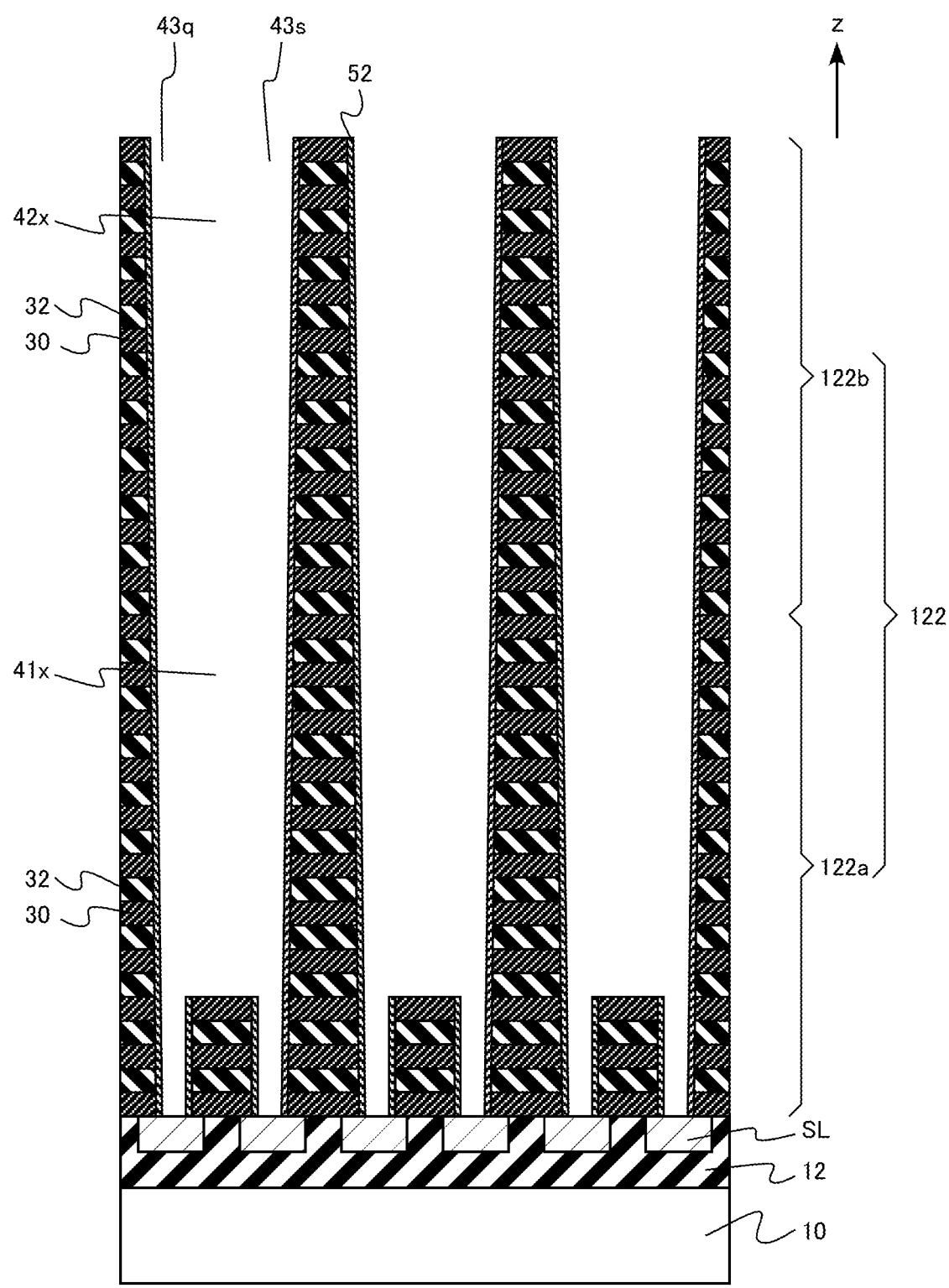
FIG. 53 is a view schematically illustrating the method for manufacturing the semiconductor memory device according to the fourth embodiment.

Then, a stacked film 52 of a silicon oxide film, a silicon nitride film, and a silicon oxide film is formed in the first memory hole 43p (first hole), the second memory hole 43q (second hole), the third memory hole 43r (third hole), and the fourth memory hole 43s (fourth hole) (FIG. 53). The stacked film 52 comes into contact with the silicon nitride layer 32. The stacked film 52 is formed by, for example, the CVD method. At least a portion of the stacked film 52 finally becomes the charge accumulation layer 18. In addition, the stacked film 52 is formed on the surface of the second region 122b and an exposed portion of the source line SL, but is removed by an etch-back method.

Figure 54:
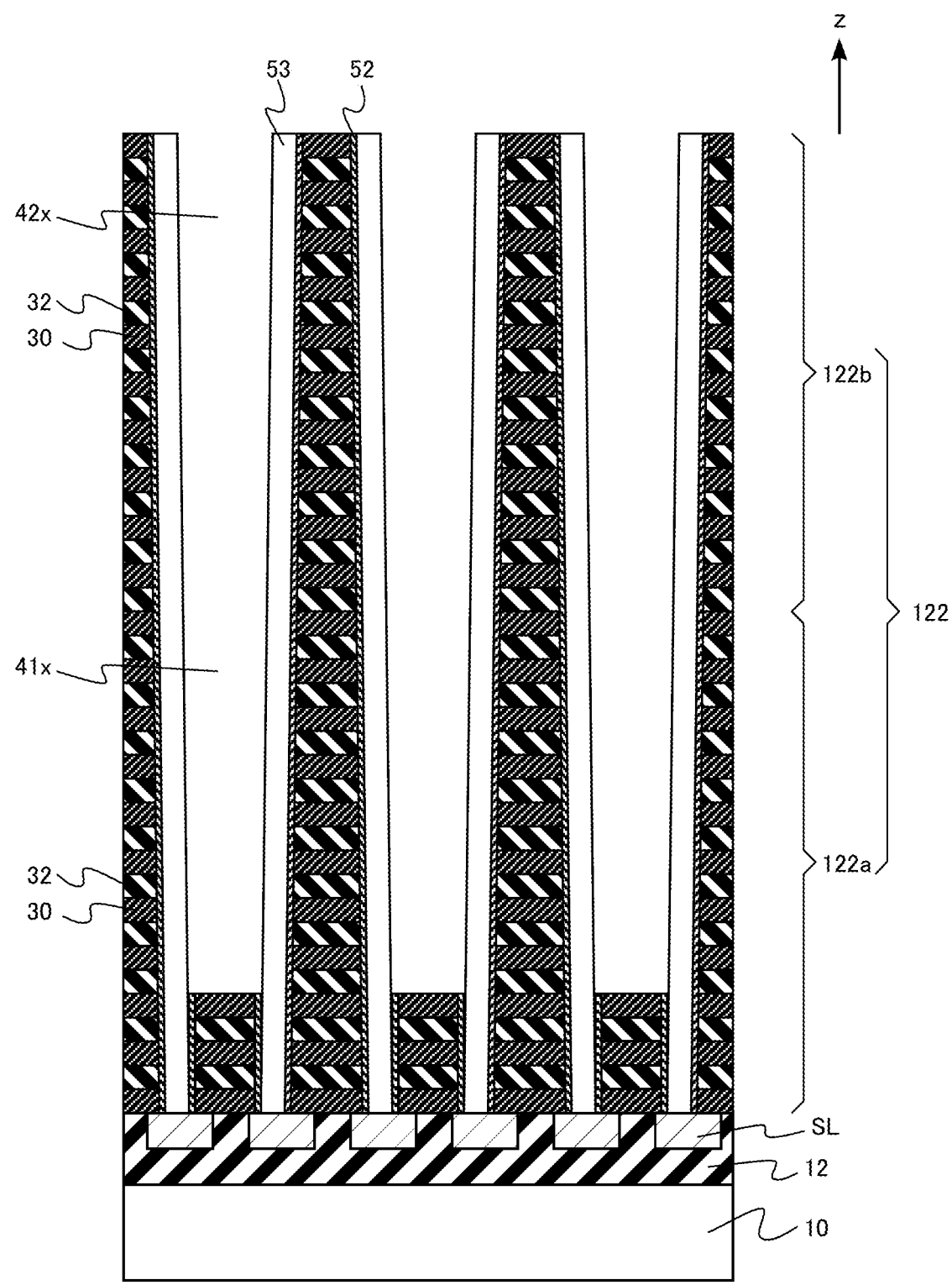
FIG. 54 is a view schematically illustrating the method for manufacturing the semiconductor memory device according to the fourth embodiment.

Then, an amorphous silicon film 53 is formed in the first memory hole 43p (first hole), the second memory hole 43q (second hole), the third memory hole 43r (third hole), and the fourth memory hole 43s (fourth hole) (FIG. 54). The amorphous silicon film 53 is heated in the subsequent process and finally becomes the channel layer 16 using polysilicon. In addition, the amorphous silicon film 53 is formed on the surface of the second region 122b and an exposed portion of the source line SL and in the central hole 41x and the central hole 42x. The amorphous silicon film 53 formed in regions other than the first memory hole 43p (first hole), the second memory hole 43q (second hole), the third memory hole 43r (third hole), and the fourth memory hole 43s (fourth hole) may be removed by, for example, an isotropic dry etching method in order to separate the channel layer 16.

For example, the amorphous silicon film 53 formed on the surface of the second region 122b and the inner surfaces of the central hole 41x and the central hole 42x may be removed by the isotropic dry etching method in order to separate the channel layer 16. Further, the stacked film 52 is formed in the central hole 41x and the central hole 42x. A portion of the stacked film 52 may be removed by the isotropic dry etching method.

Figure 55:
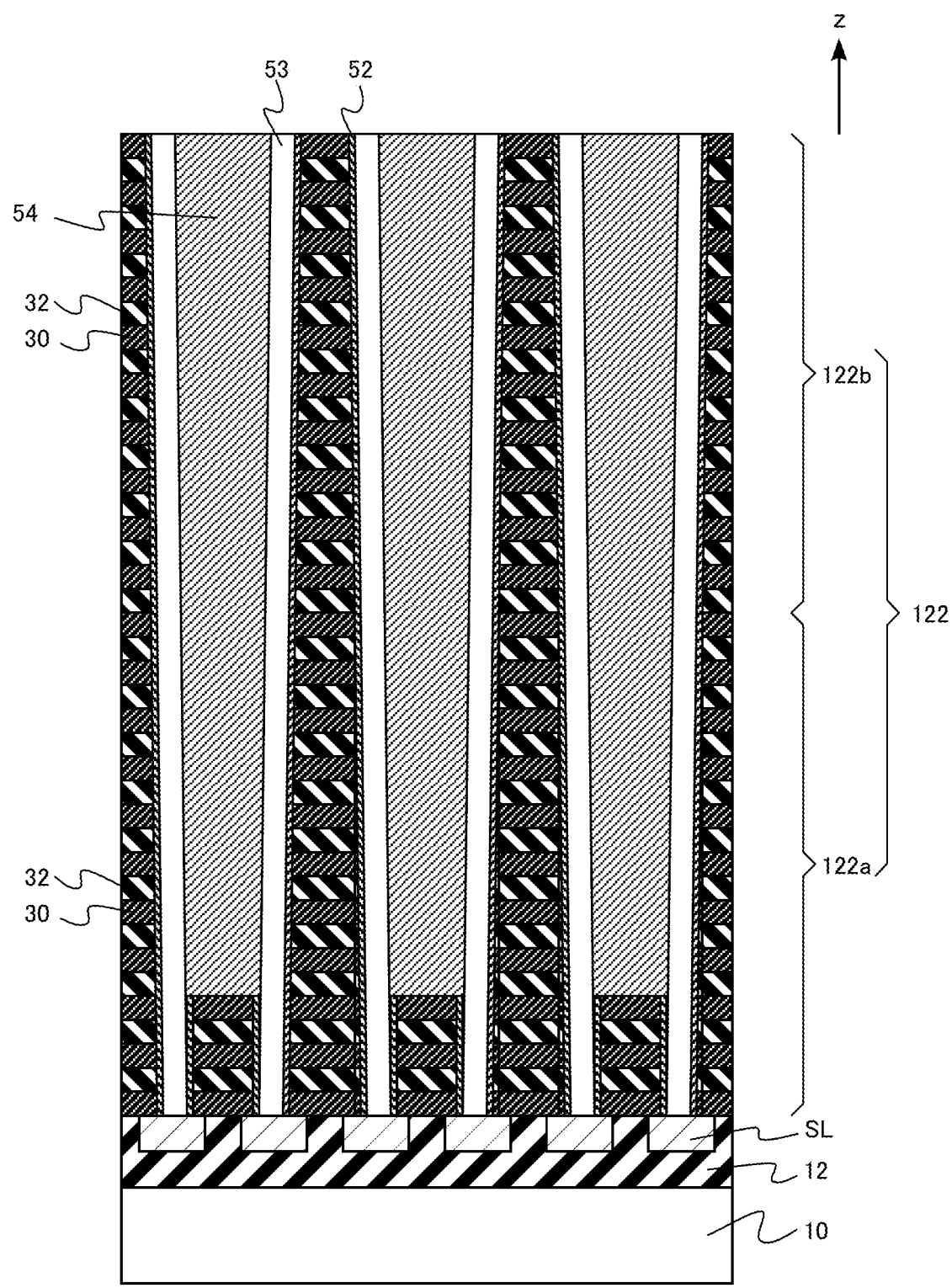
FIG. 55 is a view schematically illustrating the method for manufacturing the semiconductor memory device according to the fourth embodiment.

Then, the central hole 41x and the central hole 42x are filled with a silicon oxide film 54 (FIG. 55). The silicon oxide film 54 finally becomes the central insulating layer 20. The silicon oxide film 54 is formed by, for example, the CVD method.

Figure 56:
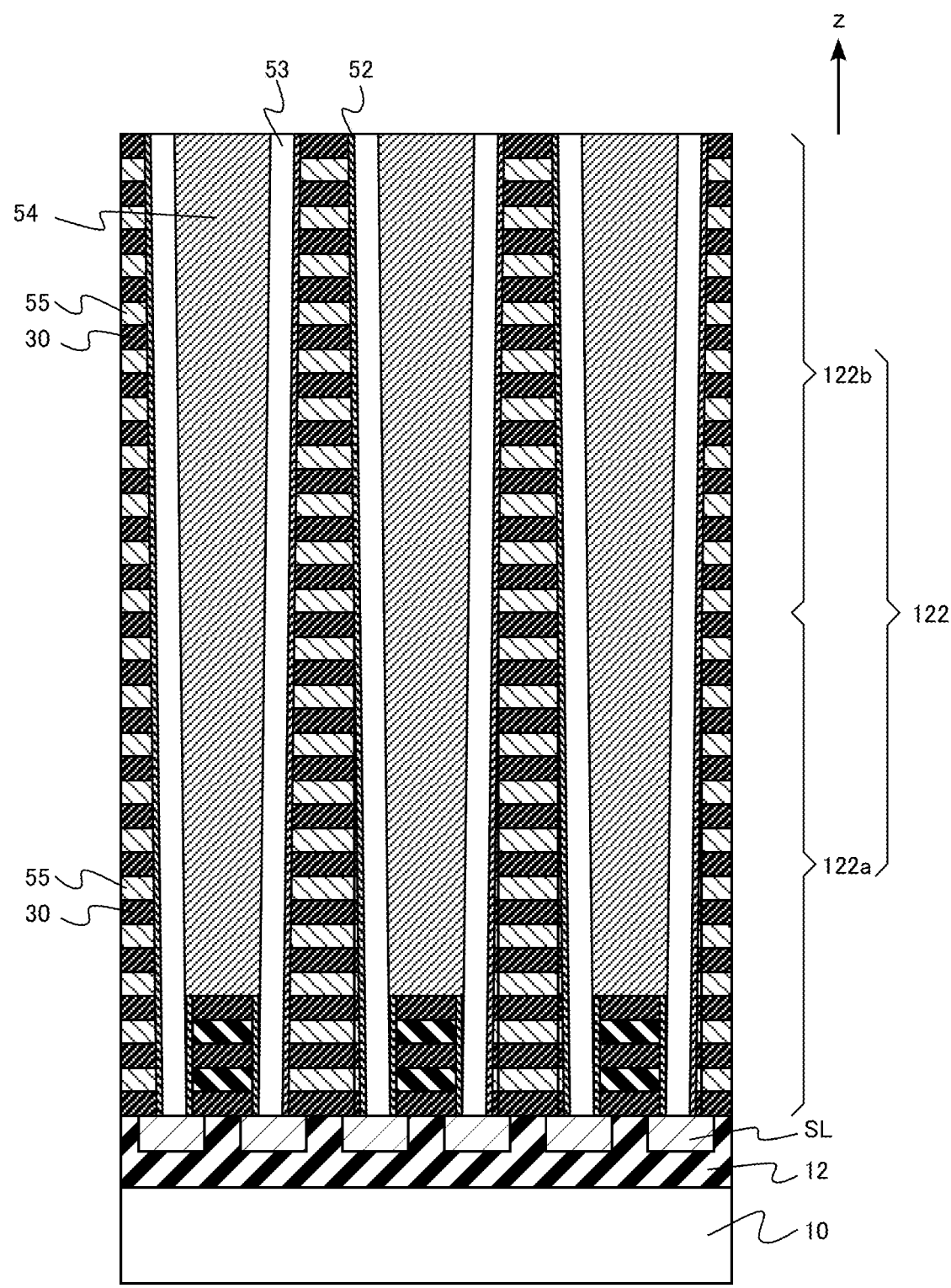
FIG. 56 is a view schematically illustrating the method for manufacturing the semiconductor memory device according to the fourth embodiment.

Then, the silicon nitride layer 32 is selectively removed by wet etching using an etching groove (not illustrated). The silicon nitride layer 32 is selectively etched with respect to the silicon oxide layer 30 using, for example, a phosphoric acid solution in the wet etching. Then, for example, a tungsten film 55 is formed in a region obtained by removing the silicon nitride layer 32 (FIG. 56). The silicon nitride layer 32 is substituted with the tungsten film 55. The tungsten films 55 finally become the word line WL and the source select gate line SGS.

Then, a plurality of bit lines BL are formed on the stacked body 122 by a known process technique.

The memory cell array 200 of the semiconductor memory device according to the fourth embodiment is manufactured by the above-mentioned manufacturing method.

In addition, when the stacked body 122 is formed, the second layer may be a conductive layer.

Next, the function and effect of the semiconductor memory device and the semiconductor memory device manufacturing method according to the fourth embodiment will be described.

The three-dimensional NAND flash memory in which the memory cells are three-dimensionally disposed increases the degree of integration and reduces costs. The three-dimensional NAND flash memory may be manufactured, for example, by alternately stacking a plurality of insulating layers and a plurality of gate electrode layers to forma stacked body, forming memory holes penetrating through the stacked body, and forming charge accumulation layers and semiconductor layers in the memory holes to form memory strings in which a plurality of memory cells are connected in series to each other. The capacity of the three-dimensional NAND flash memory may be further increased by increasing the number of gate electrodes stacked in the stacked body or scaling-down the size of the memory hole.

When the number of gate electrodes stacked in the stacked body is increased or when the size of the memory hole is scaled-down, the aspect ratio (depth/width) of the memory hole increases. Therefore, it is difficult to form the memory hole using etching. When the aspect ratio of the memory hole increases, an etching rate may be reduced or etching may be stopped during an etching using the RIE method.

In the memory cell array 200 of the semiconductor memory device according to the fourth embodiment, a plurality of channel layers 16 are provided around the central insulating layer 20 extending in the z direction in the stacked body 22. The adoption of this structure makes it possible to form memory hole with a high aspect ratio. As a result, the capacity of the three-dimensional NAND flash memory further increases.

When the memory cell array 200 is manufactured, the central holes 41x and 42x with a large diameter and a lower aspect ratio are formed in the stacked body 122 before the memory holes with a small diameter are formed. Then, as illustrated in FIG. 49, the first memory hole 43p, the second memory hole 43q, the third memory hole 43r, and the fourth memory hole 43s are formed so as to partially overlap the central hole 41x and the central hole 42x, which makes it possible to etch the memory holes with a small diameter in a state in which the effective aspect ratio is low. Therefore, when the memory holes with a small diameter and a high aspect ratio are formed, it is possible to reduce the possibility that the etching rate will be reduced or etching will be stopped.

In addition, when the number of gate electrodes stacked in the stacked body is further increased, it may be difficult to perform etching even for the central hole having a larger diameter and a higher aspect ratio than the memory hole. In the memory cell array 200 of the semiconductor memory device according to the fourth embodiment, the central hole can be manufactured so as to be divided into two upper and lower central holes, that is, the central hole 41x and the central hole 42x. Therefore, it is easy to perform etching for the central holes and it is possible to form a memory hole with a small diameter and a high aspect ratio.

Since the central hole is formed so as to be divided into the upper and lower holes, vertical misalignment or dimensional deviation is likely to occur. However, since the memory holes can be collectively formed, the channel layer 16 can be continuously formed from the bottom to the top of the stacked body 22 without any deviation.

Further, in the memory cell array 200, the central hole 41x is provided so as not to penetrate through the stacked body 22. Therefore, in the lower portion of the stacked body 22, the second channel layer 16b and the third channel layer 16c can be connected to the first source line SL1 and the first channel layer 16a and the fourth channel layer 16d can be connected to the second source line SL2. In other words, a plurality of channel layers 16 disposed around one central insulating layer 20 can be connected to different divided source lines SL.

For example, it is assumed that the central hole 41x is provided so as to penetrate through the stacked body 22 in a state in which the source lines SL are divided as in the memory cell array 200. In this case, for example, there is a concern that wiring lines or elements (not illustrated) below the memory cell array 200 will be damaged or a short circuit will occur in the wiring lines or the elements below the memory cell array 200. In the memory cell array 200, the above problems are suppressed by providing the central hole 41x so as not to penetrate through the stacked body 22.

Therefore, a plurality of channel layers 16 disposed around one central insulating layer 20 can be connected to different divided source lines SL. Therefore, as illustrated in FIG. 29, one memory string MS can be selected by one source line SL and one bit line BL and one memory cell MC can be selected by one word line WL. Therefore, for example, the drain select gate line SGD or the drain select transistor SDT for selecting the memory string MS provided in the semiconductor memory device according to the first embodiment is not required. As a result, it is possible to achieve a semiconductor memory device with a simple circuit structure.

In addition, the difficulty of finely processing the wiring lines or the elements provided in the upper portion of the memory cell array 200 is generally high. Since the wiring lines or the elements provided in the upper portion of the memory cell array 200 can be omitted, it is easy to manufacture the semiconductor memory device.

Figure 57:
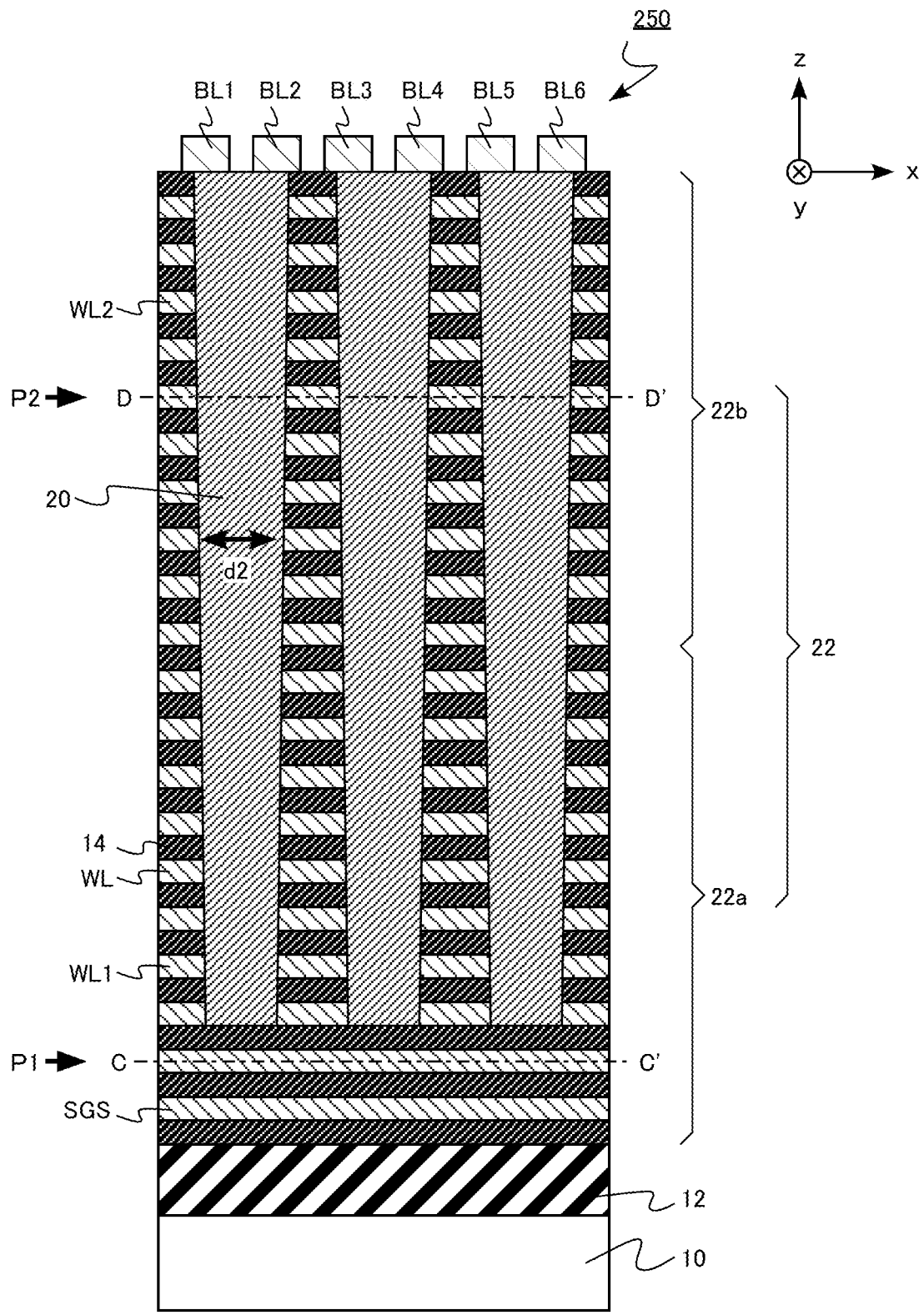
FIG. 57 is a cross-sectional view schematically illustrating a portion of a memory cell array of a semiconductor memory device according to a modification example of the fourth embodiment.

FIG. 57 is a cross-sectional view schematically illustrating a portion of a memory cell array of a semiconductor memory device according to a modification example of the fourth embodiment. FIG. 57 is a cross-sectional view corresponding to FIG. 31.

In the memory cell array 200 according to the fourth embodiment, as illustrated in FIG. 31, the second distance (d2 in FIG. 31) between two end surfaces of the same word line WL monotonically increases, for example, from the first word line WL1, decreases, and then monotonically increases toward the second word line WL2 in the z direction in the second cross section parallel to the z direction, the second cross section including the central insulating layer 20, and the second cross section being different from the first cross section.

In contrast, in a memory cell array 250 according to the modification example, as illustrated in FIG. 57, the second distance (d2 in FIG. 57) between two end surfaces of the same word line WL monotonically increases, for example, from the first word line WL1 to the second word line WL2 in the z direction in the second cross section parallel to the z direction, the second cross section including the central insulating layer 20, and the second cross section being different from the first cross section.

In the modification example of the fourth embodiment, a plurality of channel layers 16 disposed around one central insulating layer 20 can also be connected to different divided source lines SL.

As described above, according to the semiconductor memory device of the fourth embodiment, it is possible to form a memory hole with a high aspect ratio. Therefore, it is possible to provide a semiconductor memory device capable of increasing capacity. In addition, it is possible to provide a semiconductor memory device that has a simple circuit structure and is easy to manufacture.

Fifth Embodiment

A semiconductor memory device according to a fifth embodiment is different from the semiconductor memory device according to the fourth embodiment in the number of semiconductor layers disposed around the second insulating layer and the arrangement of the first to fourth conductive lines. Hereinafter, in some cases, a portion of the description of the same content as that in the fourth embodiment will be omitted.

Figure 58:
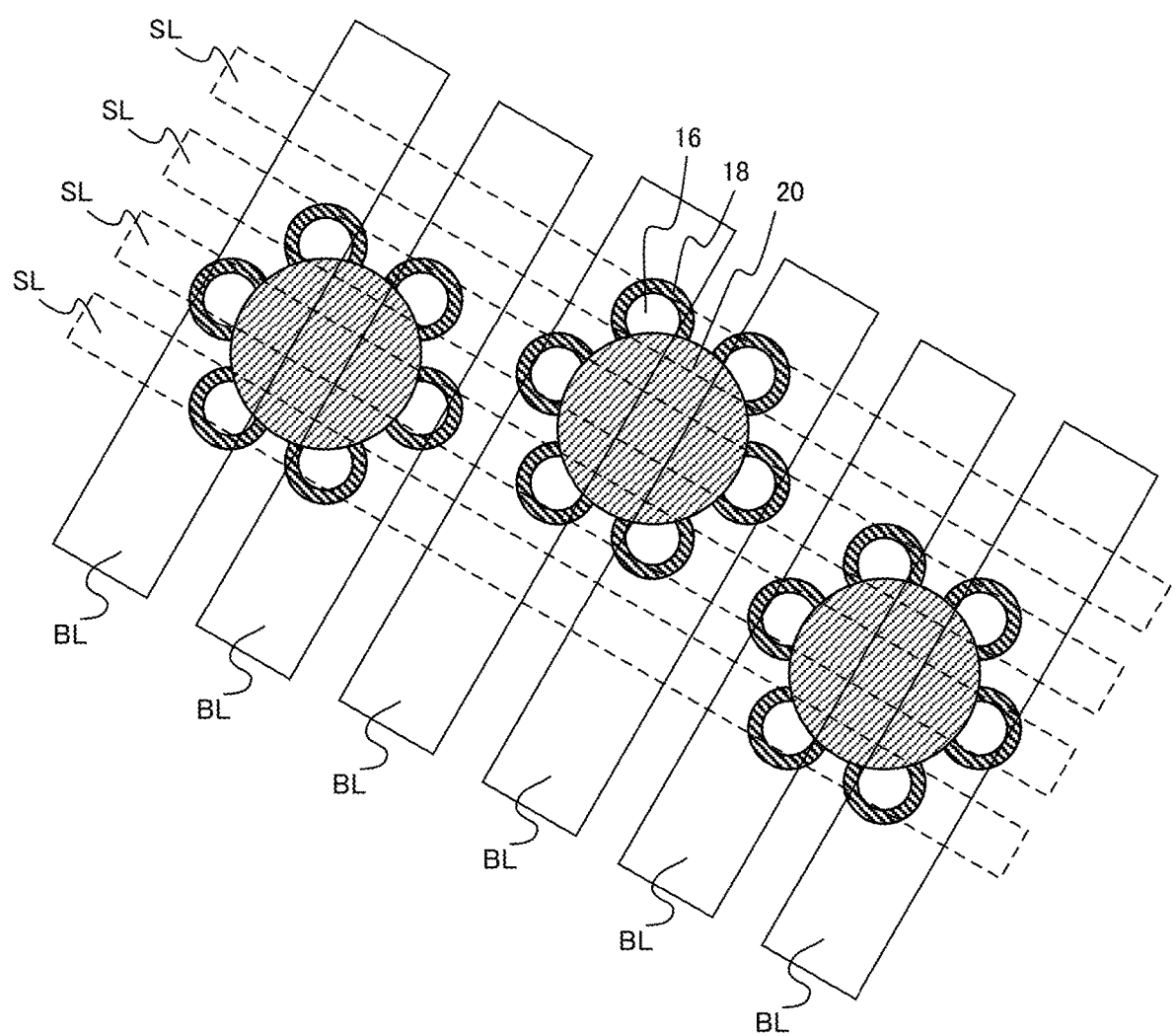
FIG. 58 is a diagram schematically illustrating a portion of a memory cell array of a semiconductor memory device according to a fifth embodiment.

FIG. 58 is a diagram schematically illustrating a portion of a memory cell array of the semiconductor memory device according to the fifth embodiment. FIG. 58 is a diagram schematically illustrating the memory cell array at a position parallel to the x direction and the y direction. FIG. 58 illustrates a layout pattern of the source line SL, the bit line BL, and the semiconductor layer.

FIG. 58 illustrates a case where six channel layers 16 and six charge accumulation layers 18 are disposed around the central insulating layer 20. The lower ends (one end) of two channel layers 16 among the six channel layers 16 are connected to the same source line SL. In addition, the upper ends (the other end) of three channel layers 16 among the six channel layers 16 are connected to the same bit line BL.

As described above, according to the semiconductor memory device of the fifth embodiment, similarly to the fourth embodiment, it is possible to form a memory hole with a high aspect ratio. Therefore, it is possible to provide a semiconductor memory device capable of increasing capacity. In addition, it is possible to provide a semiconductor memory device that has a simple circuit structure and is easy to manufacture.

Sixth Embodiment

A semiconductor memory device according to a sixth embodiment includes: a stacked body including a plurality of first insulating layers and a plurality of gate electrode layers alternately stacked in a first direction; a first semiconductor layer provided in the stacked body, the first semiconductor layer extending in the first direction; a second semiconductor layer provided in the stacked body, the second semiconductor layer extending in the first direction; a third semiconductor layer provided in the stacked body, the third semiconductor layer extending in the first direction; a first charge accumulation layer provided between the gate electrode layers and the first semiconductor layer; a second charge accumulation layer provided between the gate electrode layers and the second semiconductor layer; and a third charge accumulation layer provided between the gate electrode layers and the third semiconductor layer. The first charge accumulation layer is continuous with the second charge accumulation layer in a first plane perpendicular to the first direction, the first plane including one of the gate electrode layers. The first charge accumulation layer is separated from the third charge accumulation layer in the first plane. A first distance between the first semiconductor layer and the second semiconductor layer is less than a second distance between the first semiconductor layer and the third semiconductor layer in the first plane.

The semiconductor memory device according to the sixth embodiment is a three-dimensional NAND flash memory. In the semiconductor memory device according to the sixth embodiment, a charge accumulation layer of a memory cell MC has a stacked structure of insulating films. In the semiconductor memory device according to the sixth embodiment, the memory cell MC is a so-called metal-oxide-nitride-oxide-semiconductor (MONOS) memory cell.

Figure 59:
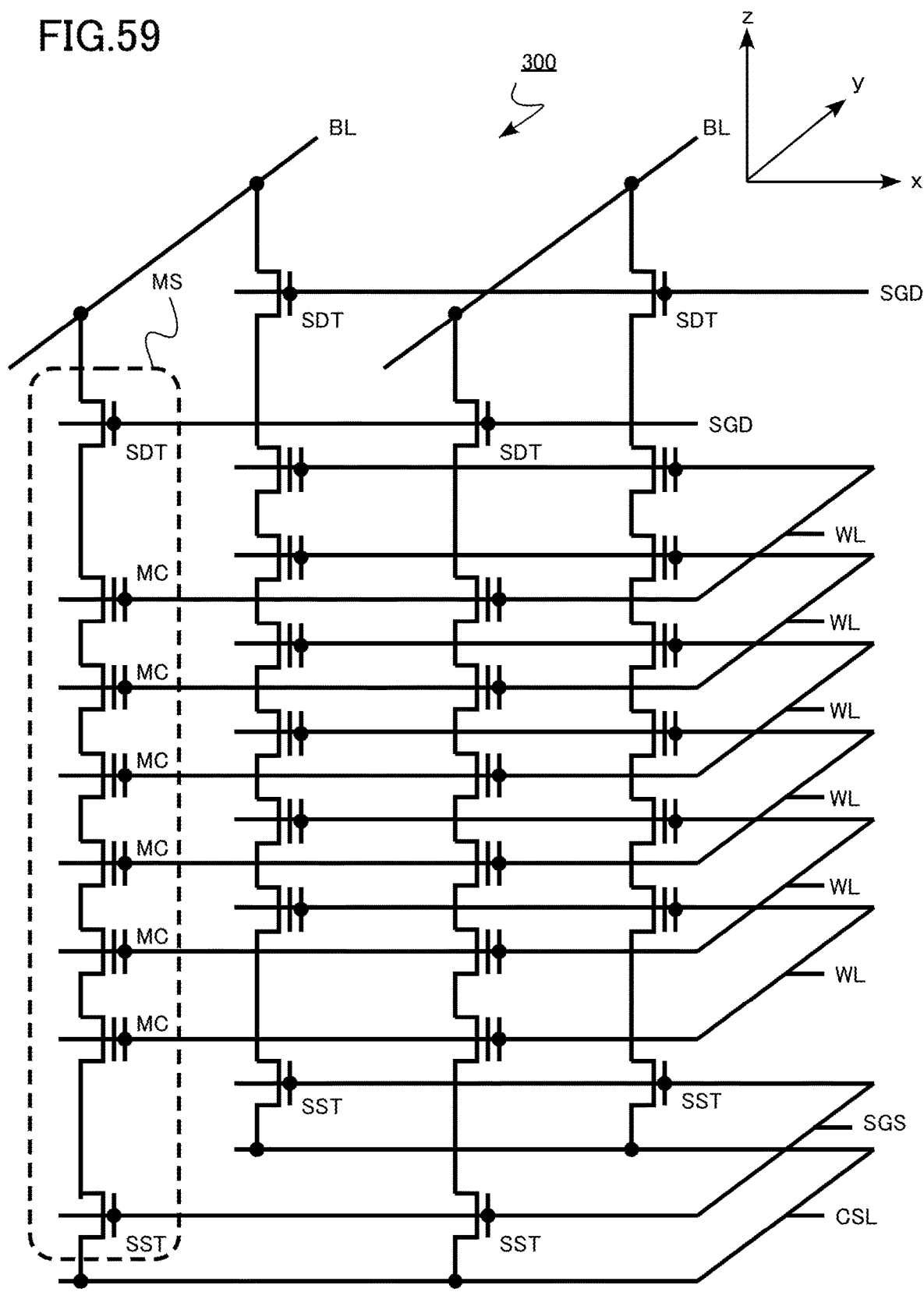
FIG. 59 is a circuit diagram illustrating a memory cell array of a semiconductor memory device according to a sixth embodiment.

FIG. 59 is a circuit diagram illustrating a memory cell array of the semiconductor memory device according to the sixth embodiment.

As illustrated in FIG. 59, a memory cell array 300 of the three-dimensional NAND flash memory according to the sixth embodiment includes a plurality of word lines WL (gate electrode layer), a common source line CSL, a source select gate line SGS, a plurality of drain select gate lines SGD, a plurality of bit lines BL, and a plurality of memory strings MS.

The plurality of word lines WL are disposed so as to be stacked in the z direction. The plurality of memory strings MS extend in the z direction. The plurality of bit lines BL extend in, for example, the y direction.

Hereinafter, the x direction is defined as a second direction, the y direction is defined as a third direction, and the z direction is defined as a first direction. For example, the x direction, the y direction, and the z direction are perpendicular to each other.

As illustrated in FIG. 59, the memory string MS includes a source select transistor SST, a plurality of memory cells MC, and a drain select transistor SDT connected in series to each other between the common source line CSL and the bit line BL. One bit line BL and one drain select gate line SGD are selected to select one memory string MS and one word line WL is selected to be able to select one memory cell MC. The word line WL is a gate electrode of a memory cell transistor forming the memory cell MC.

Figure 60:
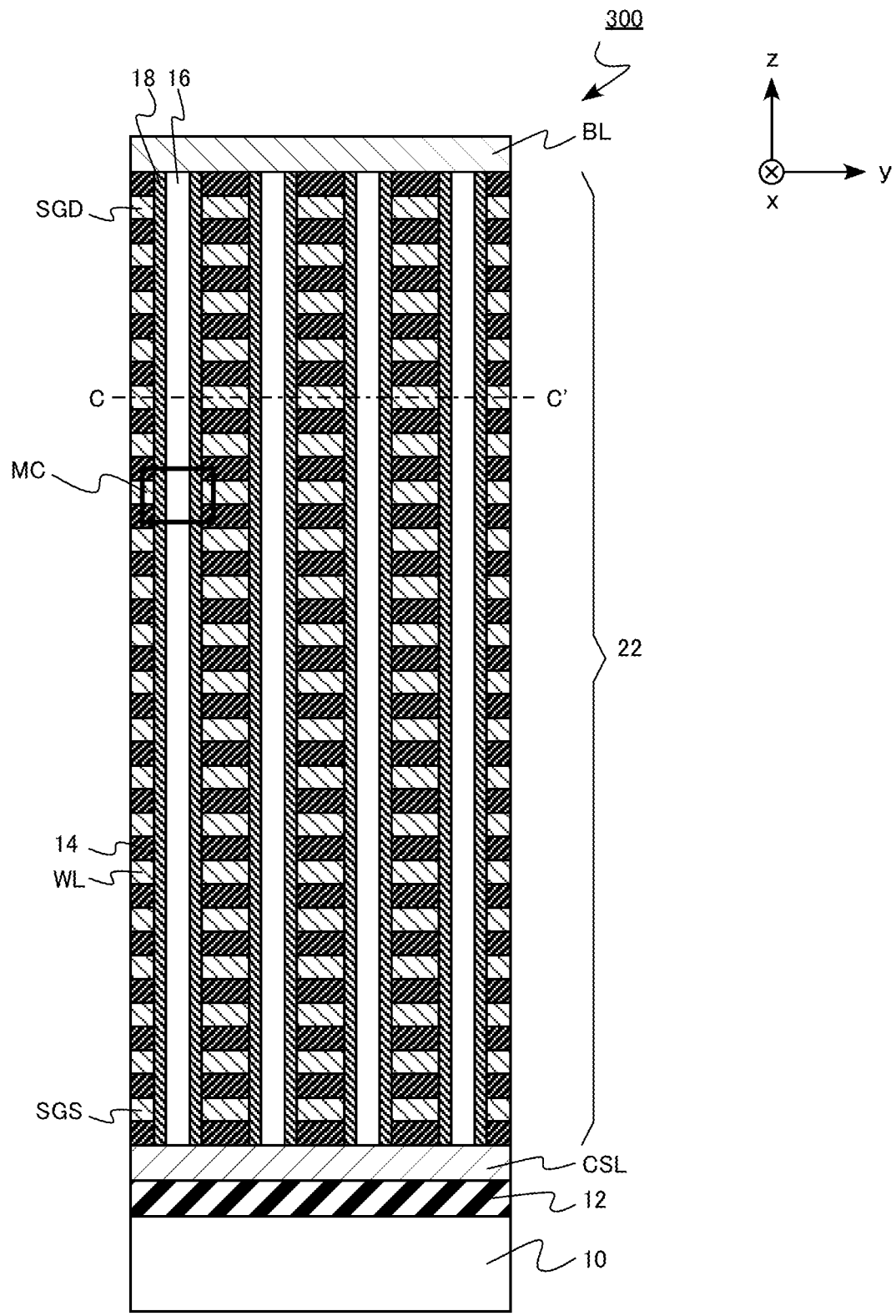
FIG. 60 is a cross-sectional view schematically illustrating a portion of the memory cell array of the semiconductor memory device according to the sixth embodiment.
Figure 61:
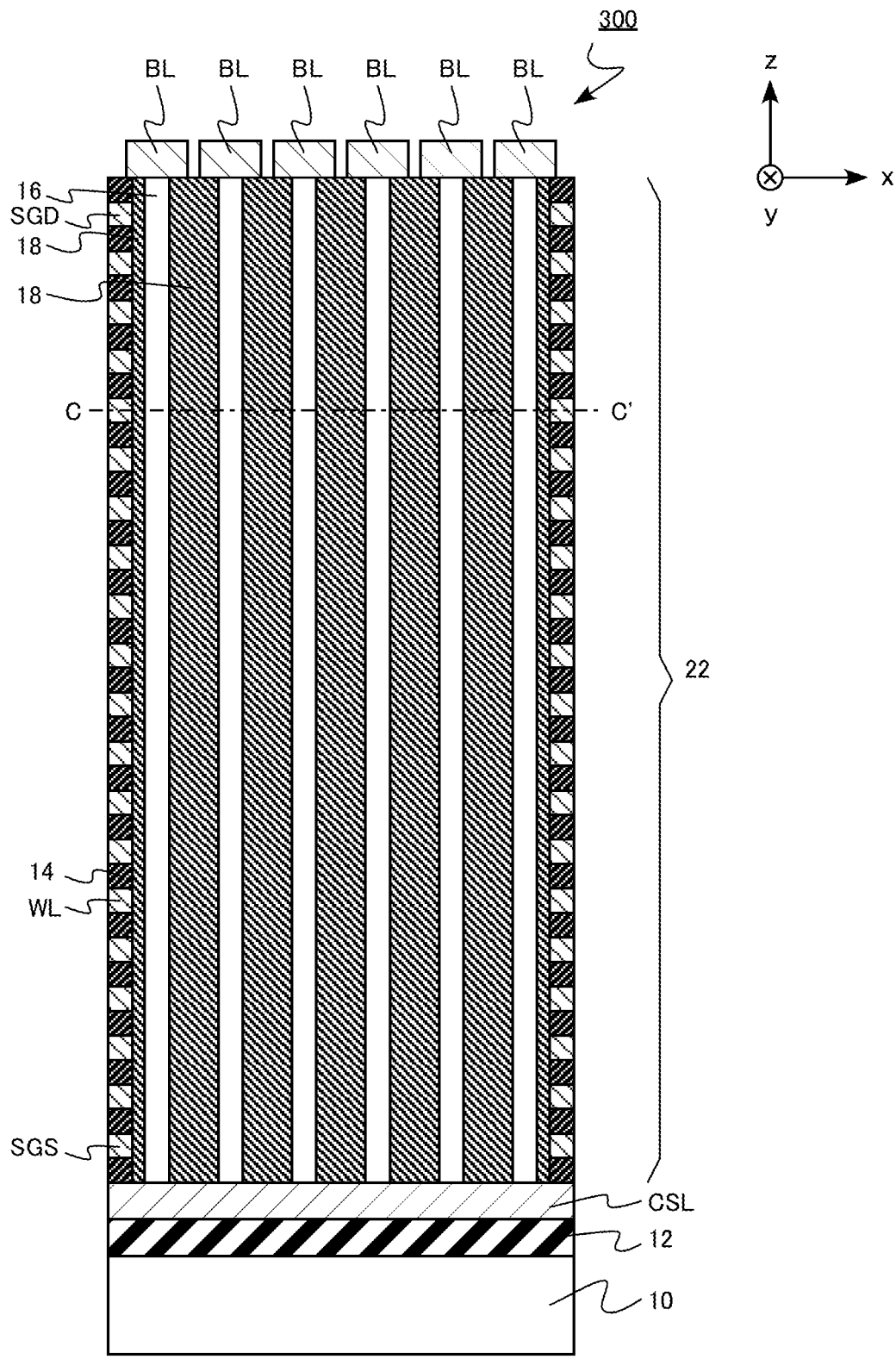
FIG. 61 is a cross-sectional view schematically illustrating a portion of the memory cell array of the semiconductor memory device according to the sixth embodiment.
Figure 62:
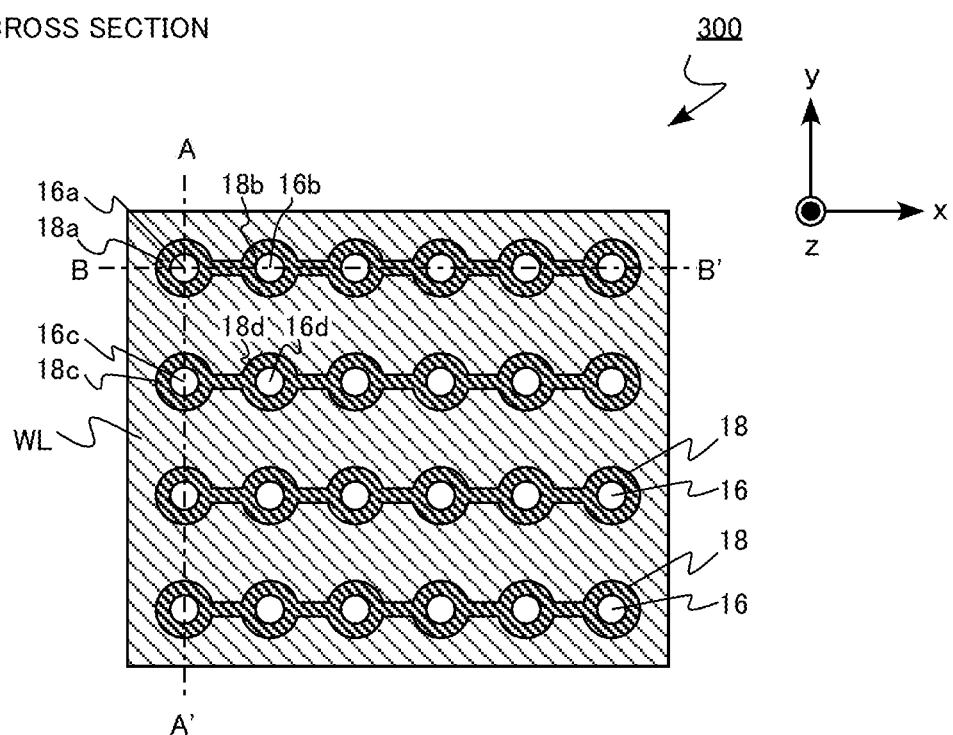
FIG. 62 is a cross-sectional view schematically illustrating a portion of the memory cell array of the semiconductor memory device according to the sixth embodiment.

FIG. 60, FIG. 61, and FIG. 62 are cross-sectional views schematically illustrating a portion of the memory cell array of the semiconductor memory device according to the sixth embodiment.

FIG. 60 illustrates a cross section of the memory cell array 300 parallel to the y direction and the z direction. FIG. 60 illustrates the yz cross section of the memory cell array 300. FIG. 60 illustrates the cross section taken along the line AA' of FIG. 62. In FIG. 60, a region surrounded by a rectangle is one memory cell MC.

FIG. 61 illustrates a cross section of the memory cell array 300 parallel to the x direction and the z direction. FIG. 61 illustrates the xz cross section of the memory cell array 300. FIG. 61 illustrates the cross section taken along the line BB' of FIG. 62.

FIG. 62 illustrates a cross section of the memory cell array 300 parallel to the x direction and the y direction. FIG. 62 illustrates the cross section of the memory cell array 300 perpendicular to the z direction. FIG. 62 is a cross section taken along the line CC' of FIG. 60 and FIG. 61. FIG. 62 illustrates the cross section perpendicular to the z direction (first direction), the cross section including the word line WL (gate electrode layer). FIG. 62 illustrates an example of the first plane.

Figure 63:
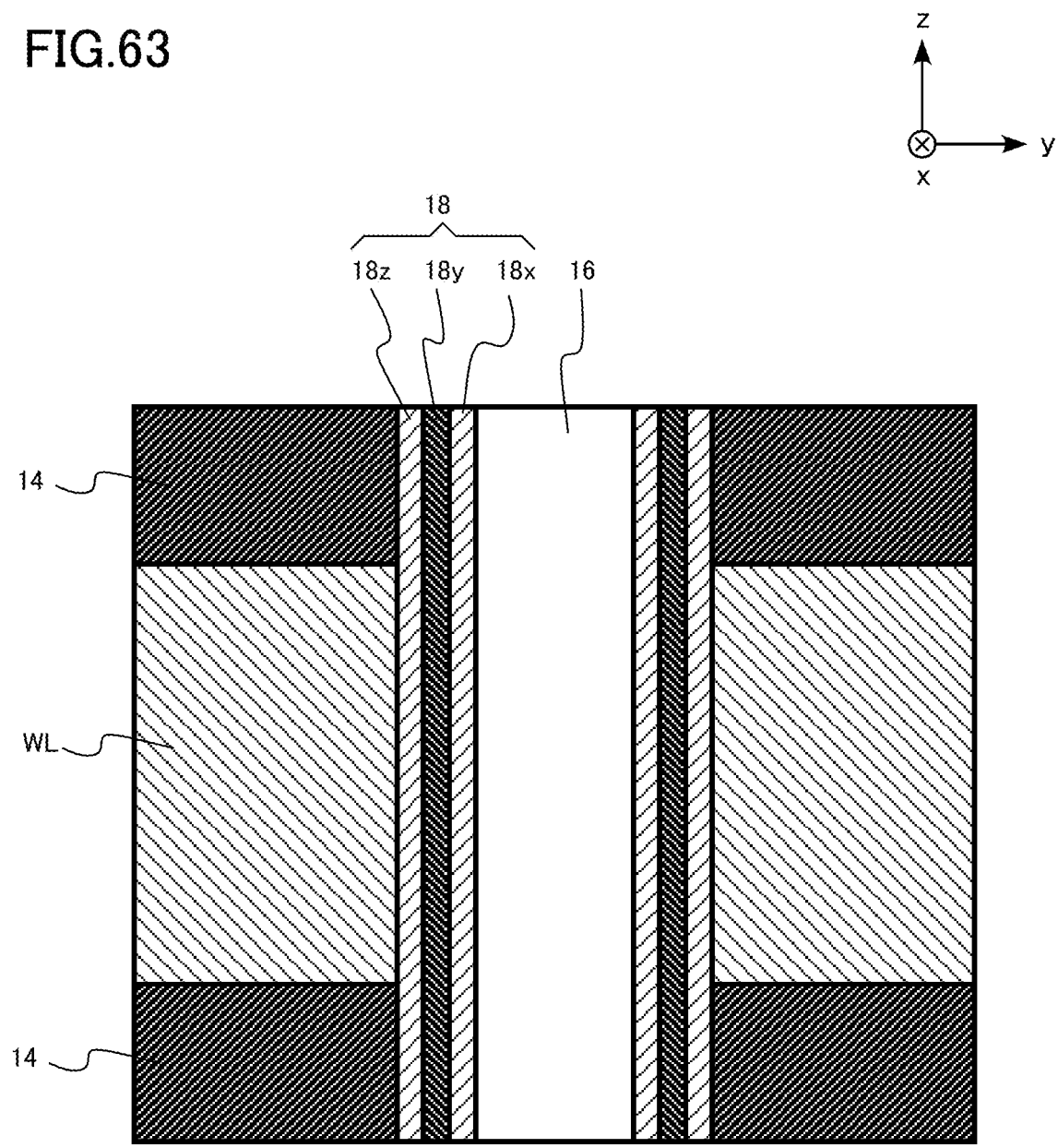
FIG. 63 is a cross-sectional view schematically illustrating a memory cell of the semiconductor memory device according to the sixth embodiment.

FIG. 63 is a cross-sectional view schematically illustrating the memory cell of the semiconductor memory device according to the sixth embodiment. FIG. 63 is a cross-sectional view illustrating the memory cell MC. FIG. 63 illustrates a cross section of the memory cell MC parallel to the z direction. FIG. 63 corresponds to the region (MC in FIG. 60) surrounded by the rectangle in FIG. 60.

As illustrated in FIG. 60, FIG. 61, and FIG. 62, the memory cell array 300 includes a semiconductor substrate 10, a substrate insulating layer 12, the common source line CSL, the source select gate line SGS, the drain select gate line SGD, the plurality of word lines WL (gate electrode layers), a plurality of interlayer insulating layers 14 (first insulating layers), a first channel layer 16$a$ (first semiconductor layer), a second channel layer 16$b$ (second semiconductor layer), a third channel layer 16$c$ (third semiconductor layer), a fourth channel layer 16$d$ (fourth semiconductor layer), a first charge accumulation layer 18$a$, a second charge accumulation layer 18$b$, a third charge accumulation layer 18$c$, a fourth charge accumulation layer 18$d$, and the plurality of bit lines BL.

In the following description, in some cases, the first channel layer 16$a$ (first semiconductor layer), the second channel layer 16$b$ (second semiconductor layer), the third channel layer 16$c$ (third semiconductor layer), and the fourth channel layer 16$d$ (fourth semiconductor layer) are generically referred to as channel layers 16. In addition, in some cases, the first charge accumulation layer 18$a$, the second charge accumulation layer 18$b$, the third charge accumulation layer 18$c$, and the fourth charge accumulation layer 18$d$ are generically referred to as charge accumulation layers 18.

A stacked body 22 includes the plurality of word lines WL and the plurality of interlayer insulating layers 14.

The semiconductor substrate 10 is, for example, a silicon substrate.

The substrate insulating layer 12 is provided on the semiconductor substrate 10. The substrate insulating layer 12 is made of, for example, silicon oxide.

The common source line CSL is provided on the substrate insulating layer 12. The common source line CSL is made of, for example, metal or a semiconductor.

The stacked body 22 is provided on the common source line CSL.

The word line WL and the interlayer insulating layer 14, the source select gate line SGS, or the drain select gate line SGD are alternately stacked on the semiconductor substrate 10 in the z direction (first direction). Among the word line WL, the source select gate line SGS, and the drain select gate line SGD alternately stacked in the z direction (first direction), a layer closest to the semiconductor substrate 10 is the source select gate line SGS and a layer farthest from the semiconductor substrate 10 is the drain select gate line SGD. The word line WL is provided between the source select gate line SGS and the drain select gate line SGD. The word line WL, the source select gate line SGS, and the drain select gate line SGD are disposed so as to be separated from each other in the z direction. The stacked body 22 includes the plurality of word lines WL, the source select gate line SGS, the drain select gate line SGD, and the plurality of interlayer insulating layers 14.

The word line WL, the source select gate line SGS, and the drain select gate line SGD are, for example, plate-shaped conductors. The word line WL, the source select gate line SGS, and the drain select gate line SGD include, for example, metal, metal nitride, metal carbide, or a semiconductor. For example, tungsten (W), titanium (Ti), or tantalum (Ta) can be used as the metal. For example, polysilicon can be used as the semiconductor. The word line WL, the source select gate line SGS, the drain select gate line SGD may include barrier metal such as titanium nitride or tantalum nitride.

The word line WL functions as a control electrode of a transistor in the memory cell MC. The word line WL is an example of the gate electrode layer.

The interlayer insulating layer 14 separates the word lines WL from each other, separates the source select gate line SGS from the word line WL, and separates the drain select gate line SGD from the word line WL. The inter layer insulating layer 14 can be made of, for example, oxide, oxynitride, or nitride. The interlayer insulating layer 14 includes, for example, silicon oxide.

The channel layer 16 is provided in the stacked body 22. The channel layer 16 extends in the z direction. The first channel layer 16$a$ is provided in the stacked body 22 and extends in the z direction. The second channel layer 16$b$ is provided in the stacked body 22 and extends in the z direction. The third channel layer 16$c$ is provided in the stacked body 22 and extends in the z direction. The fourth channel layer 16$d$ is provided in the stacked body 22 and extends in the z direction. In addition, the direction in which the channel layer 16 extends may not be necessarily completely aligned with the first direction. For example, the direction in which the channel layer 16 extends may be in the range of 5 degrees with respect to the first direction.

The channel layer 16 is made of, for example, a polycrystalline semiconductor. For example, polysilicon is used as the polycrystalline semiconductor. The channel layer 16 functions as a channel region of the transistor in the memory cell MC.

The charge accumulation layer 18 is provided between the word line WL and the channel layer 16. The first charge accumulation layer 18a is provided between the word line WL and the first channel layer 16a. The second charge accumulation layer 18b is provided between the word line WL and the second channel layer 16b. The third charge accumulation layer 18c is provided between the word line WL and the third channel layer 16c. The fourth charge accumulation layer 18d is provided between the word line WL and the fourth channel layer 16d.

As illustrated in FIG. 63, for example, the charge accumulation layer 18 has a tunnel insulating film 18x, a charge trap film 18y, and a block insulating film 18z. The charge trap film 18y is provided between the tunnel insulating film 18x and the block insulating film 18z. For example, a silicon oxide film, a silicon nitride film, and a silicon oxide film are used as the tunnel insulating film 18x, the charge trap film 18y, and the block insulating film 18z, respectively.

The tunnel insulating film 18x has a function of selectively transmitting charge. The charge trap film 18y has a function of trapping and accumulating charge. The block insulating film 18z has a function of blocking a current flowing between the charge trap film 18y and the word line WL. The memory cell MC is a so-called MONOS memory cell.

The charge accumulation layer 18 is provided along a side surface of the channel layer 16. The charge accumulation layer 18 may also be provided between the channel layer 16 and the interlayer insulating layer 14. The charge accumulation layer 18 may be provided between the memory cells MC adjacent to each other in the z direction without being divided.

A threshold voltage of the transistor in the memory cell MC changes depending on the amount of charge accumulated in the charge accumulation layer 18. The use of the change in the threshold voltage makes it possible to store data in one memory cell MC.

For example, when the threshold voltage of the transistor in the memory cell MC changes, the on-voltage of the transistor changes. For example, when a state in which the threshold voltage is high is defined as data "0" and a state in which the threshold voltage is low is defined as data "1", the memory cell MC can store 1-bit data of "0" or "1".

Figure 64:
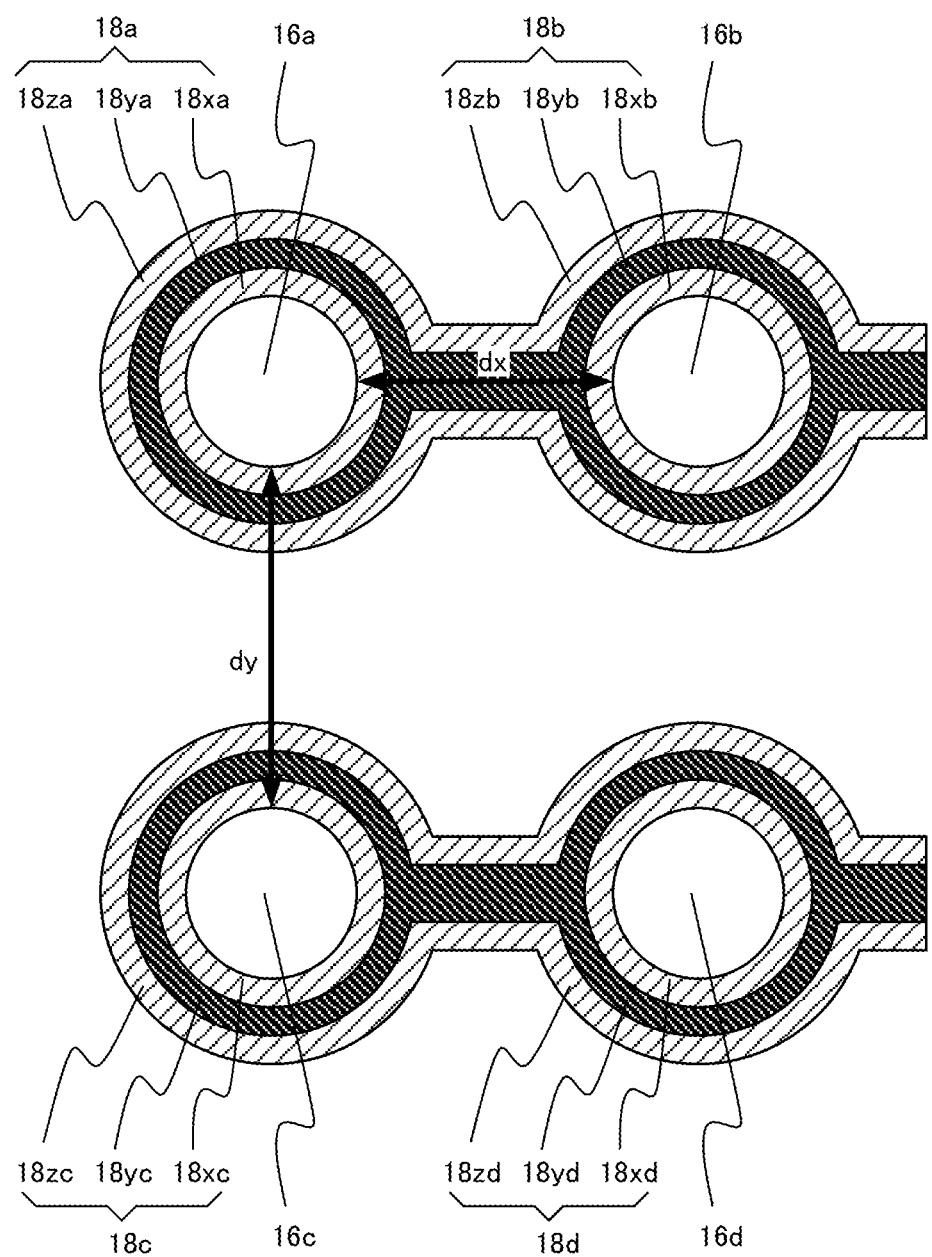
FIG. 64 is a cross-sectional view schematically illustrating a portion of the memory cell array of the semiconductor memory device according to the sixth embodiment.

FIG. 64 is a cross-sectional view schematically illustrating a portion of the memory cell array of the semiconductor memory device according to the sixth embodiment. FIG. 64 is an enlarged view illustrating a portion of FIG. 62. In FIG. 64, the word line WL is not illustrated.

As illustrated in FIG. 62 and FIG. 64, at least a portion of the first charge accumulation layer 18a and at least a portion of the second charge accumulation layer 18b are continuous in the first plane perpendicular to the z direction, the first plane including the word line WL. Further, at least a portion of the third charge accumulation layer 18c and at least a portion of the fourth charge accumulation layer 18d are continuous.

As illustrated in FIG. 62, the charge accumulation layers 18 between the word line WL and a plurality of channel layers 16 arranged in the x direction are continuous. In contrast, the charge accumulation layers 18 between the word line WL and a plurality of channel layers 16 arranged in the y direction are separated from each other.

For example, as illustrated in FIG. 64, a charge trap film 18ya of the first charge accumulation layer 18a is continuous with a charge trap film 18yb of the second charge accumulation layer 18b. In addition, a block insulating film 18za of the first charge accumulation layer 18a is continuous with a block insulating film 18zb of the second charge accumulation layer 18b. A tunnel insulating film 18xa of the first charge accumulation layer 18a is separated from a tunnel insulating film 18xb of the second charge accumulation layer 18b. In addition, the tunnel insulating film 18xa of the first charge accumulation layer 18a may be continuous with the tunnel insulating film 18xb of the second charge accumulation layer 18b.

Further, a charge trap film 18yc of the third charge accumulation layer 18c is continuous with a charge trap film 18yd of the fourth charge accumulation layer 18d. Furthermore, a block insulating film 18zc of the third charge accumulation layer 18c is continuous with a block insulating film 18zd of the fourth charge accumulation layer 18d. A tunnel insulating film 18xc of the third charge accumulation layer 18c is continuous with a tunnel insulating film 18xd of the fourth charge accumulation layer 18d. In addition, the tunnel insulating film 18xc of the third charge accumulation layer 18c may be continuous with the tunnel insulating film 18xd of the fourth charge accumulation layer 18d.

In the first plane, the first charge accumulation layer 18a is separated from the third charge accumulation layer 18c. Further, the second charge accumulation layer 18b is separated from the third charge accumulation layer 18c. Furthermore, the first charge accumulation layer 18a is separated from the fourth charge accumulation layer 18d. In addition, the second charge accumulation layer 18b is separated from the fourth charge accumulation layer 18d.

The word line WL is located between the first charge accumulation layer 18a and the third charge accumulation layer 18c. The word line WL is located between the second charge accumulation layer 18b and the third charge accumulation layer 18c. The word line WL is located between the first charge accumulation layer 18a and the fourth charge accumulation layer 18d. The word line WL is located between the second charge accumulation layer 18b and the fourth charge accumulation layer 18d.

In the first plane, a first distance (dx in FIG. 64) between the first channel layer 16a and the second channel layer 16b is less than a second distance (dy in FIG. 64) between the first channel layer 16a and the third channel layer 16c. For example, the second distance dy is equal to or greater than 1.2 times the first distance dx and is equal to or less than two times the first distance dx.

A plurality of bit lines BL are provided on the stacked body 22. The bit lines BL extend in the y direction. The bit line BL includes, for example, metal, metal nitride, metal carbide, or a semiconductor. For example, tungsten (W), titanium (Ti), or tantalum (Ta) can be used as the metal. For example, polysilicon can be used as the semiconductor. The bit line BL may include barrier metal such as titanium nitride or tantalum nitride.

Next, an example of a method for manufacturing the semiconductor memory device according to the sixth embodiment will be described.

In the method for manufacturing the semiconductor memory device according to the sixth embodiment, a plurality of first layers as insulators and a plurality of second layers are alternately stacked in the first direction to form a stacked body. A mask member having a first opening portion, a second opening portion, a connection portion connecting the first opening portion and the second opening portion, a third opening portion separated from the first opening portion is formed on the stacked body. A first hole, a second hole, a connection hole, and a third hole penetrating through the stacked body are formed using the mask member as a mask. A first charge accumulation layer coming into contact with the second layer is formed in the first hole. A second charge accumulation layer coming into contact with the second layer is formed in the second hole. A third charge accumulation layer coming into contact with the second layer is formed in the third hole. A first semiconductor layer that comes into contact with the first charge accumulation layer and extends in the first direction is formed in the first hole. A second semiconductor layer that comes into contact with the second charge accumulation layer, extends in the first direction, and is separated from the first semiconductor layer is formed in the second hole. A third semiconductor layer that comes into contact with the third charge accumulation layer and extends in the first direction is formed in the third hole. Hereinafter, a case where the second layer is an insulator and the second layer is substituted with a conductive layer after the first hole, the second hole, and the third hole are formed will be described as an example.

FIG. 65, FIG. 66, FIG. 67, FIG. 68, FIG. 69, FIG. 70, FIG. 71, FIG. 72, FIG. 73, FIG. 74, FIG. 75, FIG. 76, FIG. 77, FIG. 78, FIG. 79, and FIG. 80 are views schematically illustrating the method for manufacturing the semiconductor memory device according to the sixth embodiment. FIG. 65, FIG. 67, FIG. 70, FIG. 72, FIG. 75, FIG. 77, and FIG. 79 are cross-sectional views illustrating a cross section corresponding to FIG. 60. FIG. 66, FIG. 68, FIG. 71, FIG. 73, FIG. 76, FIG. 78, and FIG. 80 are cross-sectional views illustrating a cross section corresponding to FIG. 61. FIG. 69 and FIG. 74 are top views corresponding to FIG. 67 and FIG. 72, respectively.

Figure 65:
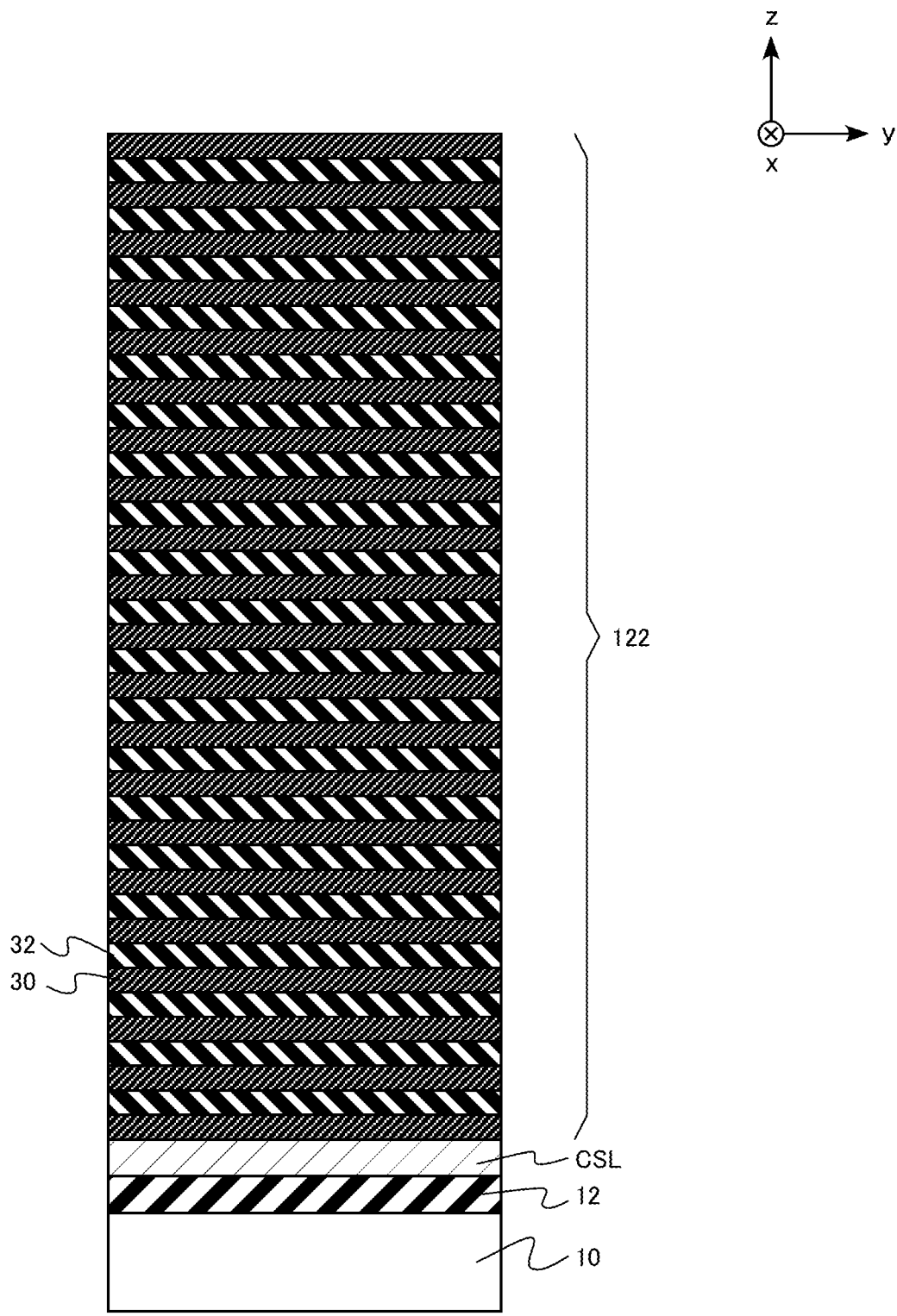
FIG. 65 is a view schematically illustrating a method for manufacturing the semiconductor memory device according to the sixth embodiment.
Figure 66:
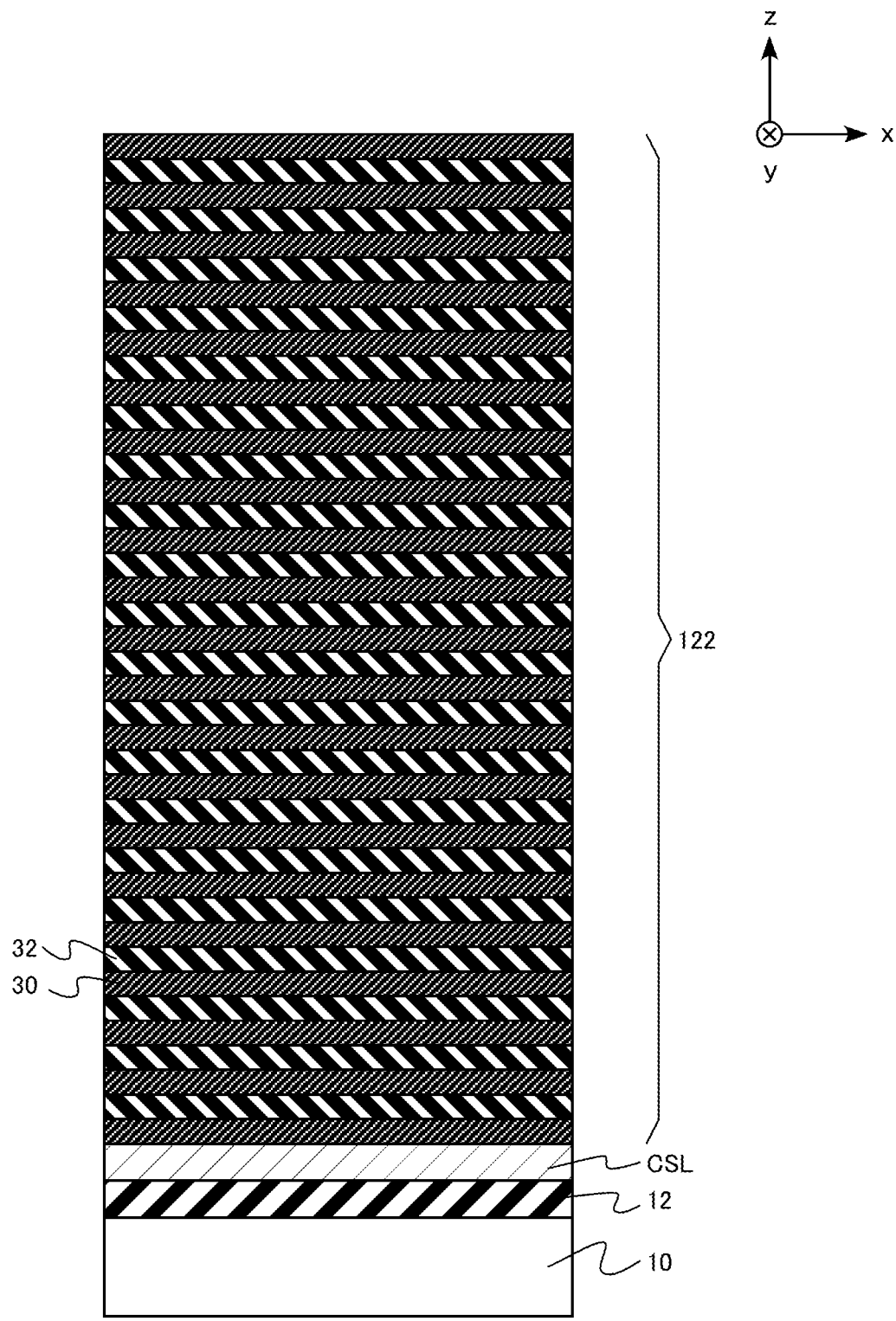
FIG. 66 is a view schematically illustrating the method for manufacturing the semiconductor memory device according to the sixth embodiment.

First, the substrate insulating layer 12 and the common source line CSL are formed on the semiconductor substrate 10. The substrate insulating layer 12 is, for example, a silicon oxide layer. Then, a plurality of silicon oxide layers 30 (first layers) and a plurality of silicon nitride layers 32 (second layers) are alternately stacked on the common source line CSL in the z direction (FIG. 65 and FIG. 66). The silicon oxide layers 30 and the silicon nitride layers 32 form a stacked body 122.

The silicon oxide layers 30 and the silicon nitride layers 32 are formed by, for example, a chemical vapor deposition method (CVD method). A portion of the silicon oxide layer 30 finally becomes the interlayer insulating layer 14.

The silicon nitride layer 32 is a sacrifice layer. The silicon nitride layers 32 are finally substituted with conductive layers and become the word line WL, the source select gate line SGS, and the drain select gate line SGD.

Figure 67:
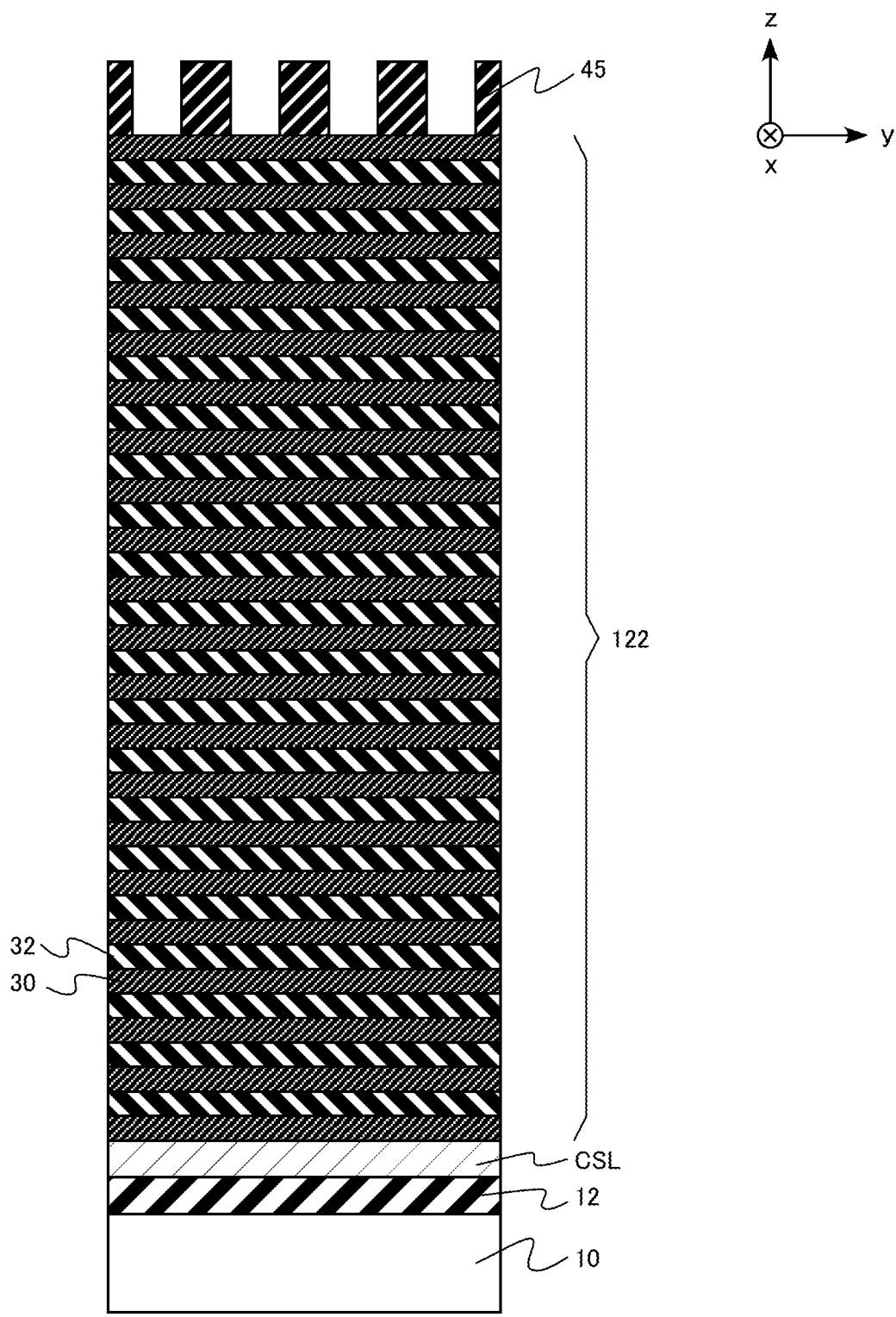
FIG. 67 is a view schematically illustrating the method for manufacturing the semiconductor memory device according to the sixth embodiment.
Figure 68:
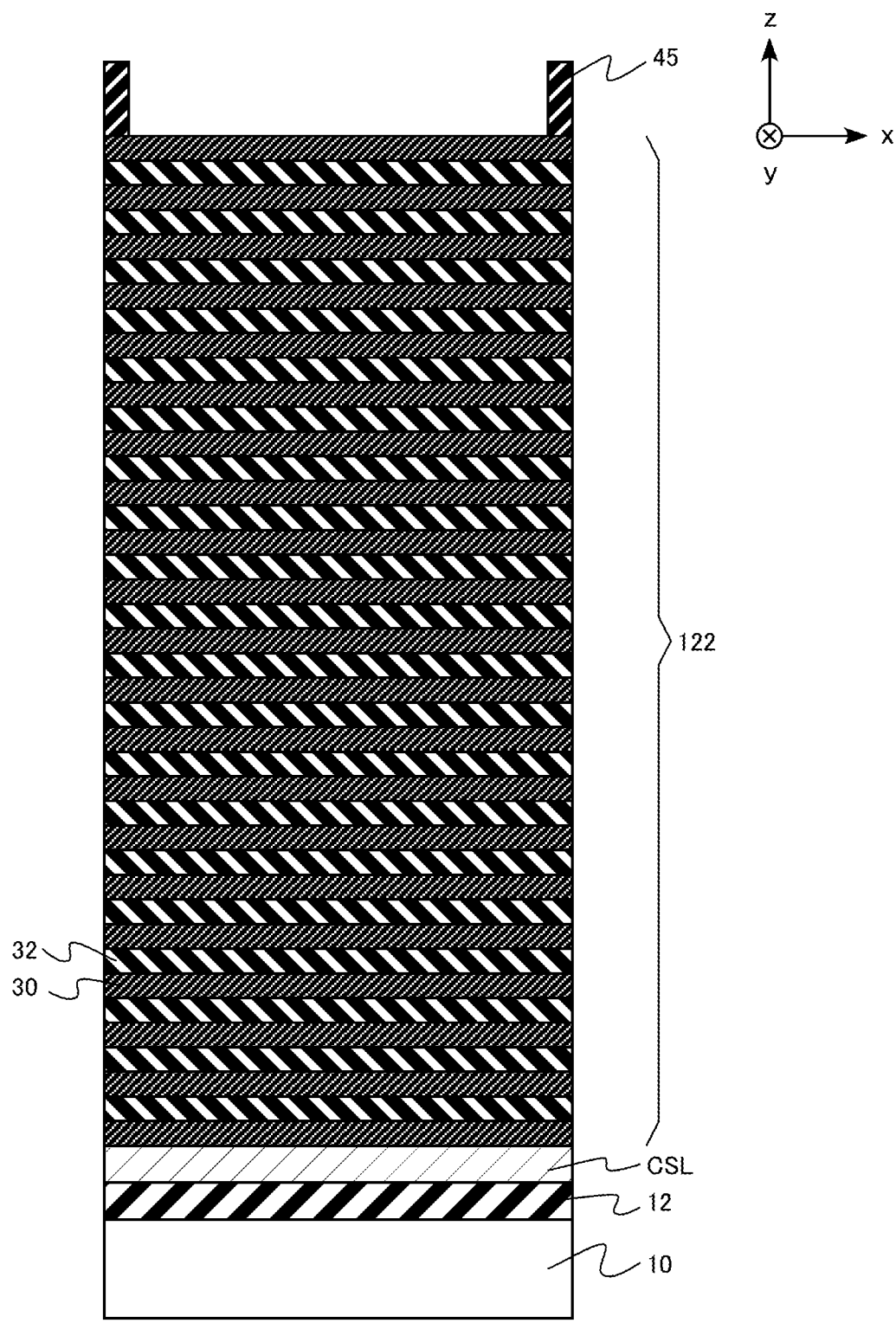
FIG. 68 is a view schematically illustrating the method for manufacturing the semiconductor memory device according to the sixth embodiment.
Figure 69:
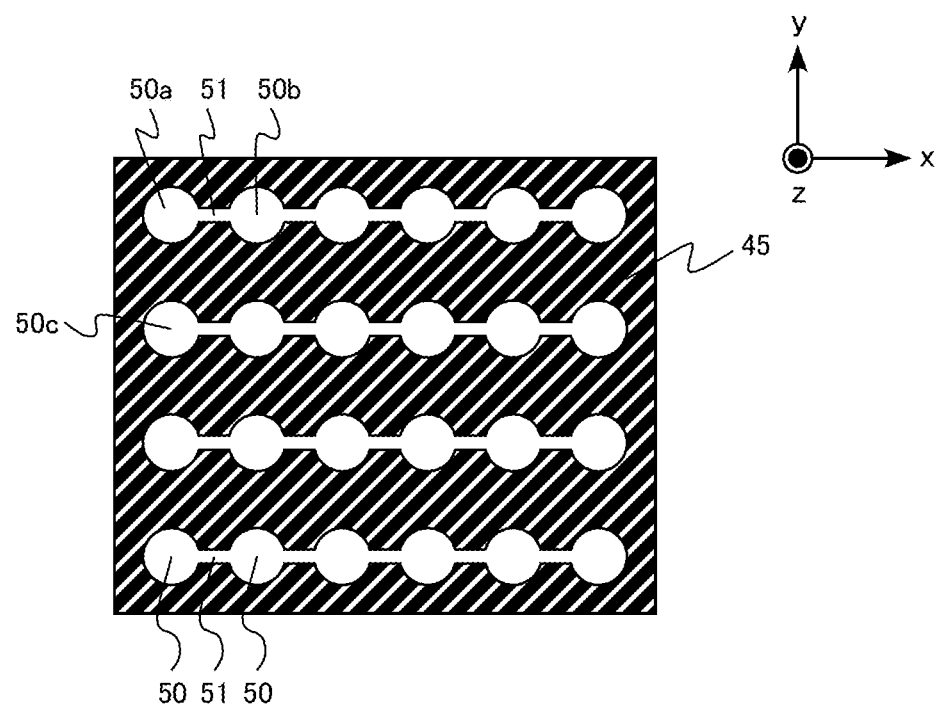
FIG. 69 is a view schematically illustrating the method for manufacturing the semiconductor memory device according to the sixth embodiment.

Then, a processing mask 45 (mask member) is formed on the stacked body 122 (FIGS. 67 and 68). For example, a photoresist or a carbon film is used as the processing mask 45. The processing mask 45 has a plurality of opening portions 50 and a plurality of connection portions 51 (FIG. 69). The plurality of opening portions 50 include a first opening portion 50a, a second opening portion 50b, and a third opening portion 50c. The connection portion 51 connects the first opening portion 50a and the second opening portion 50b. The third opening portion 50c is separated from the first opening portion 50a and the second opening portion 50b.

The width of the connection portion 51 is less than the width of the opening portion 50. The width of the connection portion 51 is less than the width of the first opening portion 50a and the width of the second opening portion 50b.

Figure 70:
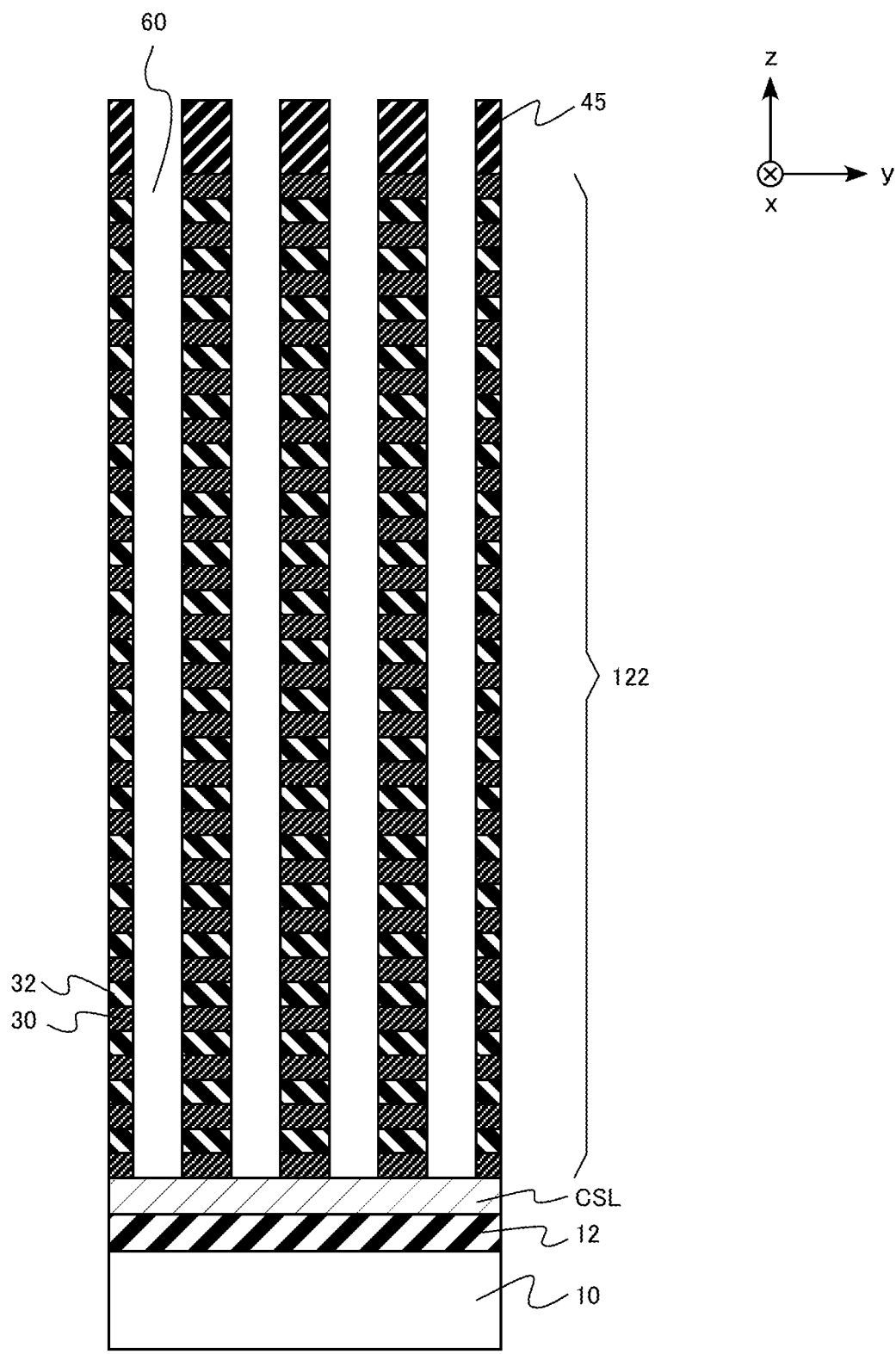
FIG. 70 is a view schematically illustrating the method for manufacturing the semiconductor memory device according to the sixth embodiment.
Figure 71:
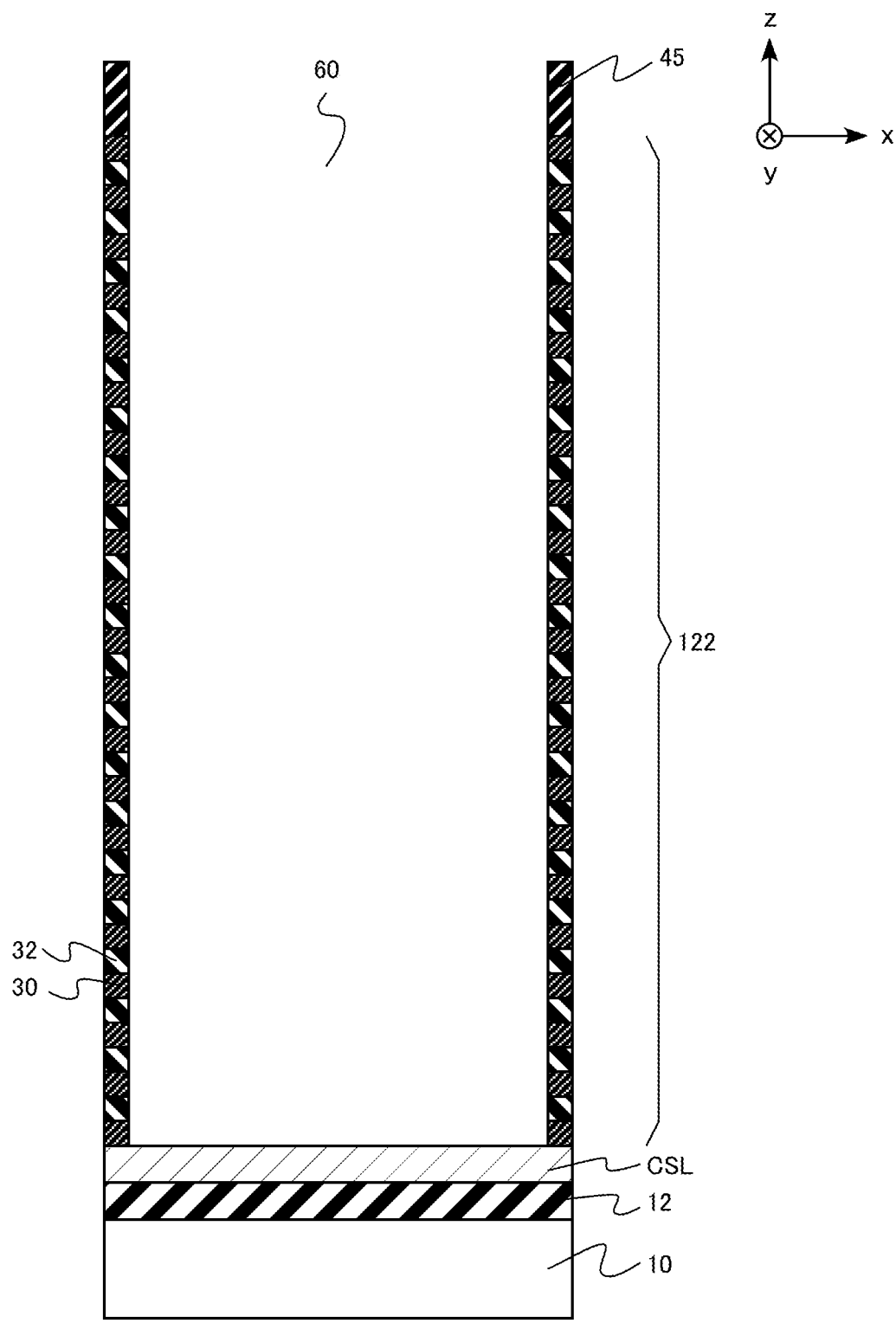
FIG. 71 is a view schematically illustrating the method for manufacturing the semiconductor memory device according to the sixth embodiment.

Then, the silicon oxide layers 30 and the silicon nitride layers 32 are etched using the processing mask 45 as a mask (FIG. 70 and FIG. 71). An opening hole 60 penetrating through the stacked body 122 is formed by etching. The etching is performed by, for example, a reactive ion etching method (RIE method). The opening hole 60 reaches the common source line CSL.

Figure 72:
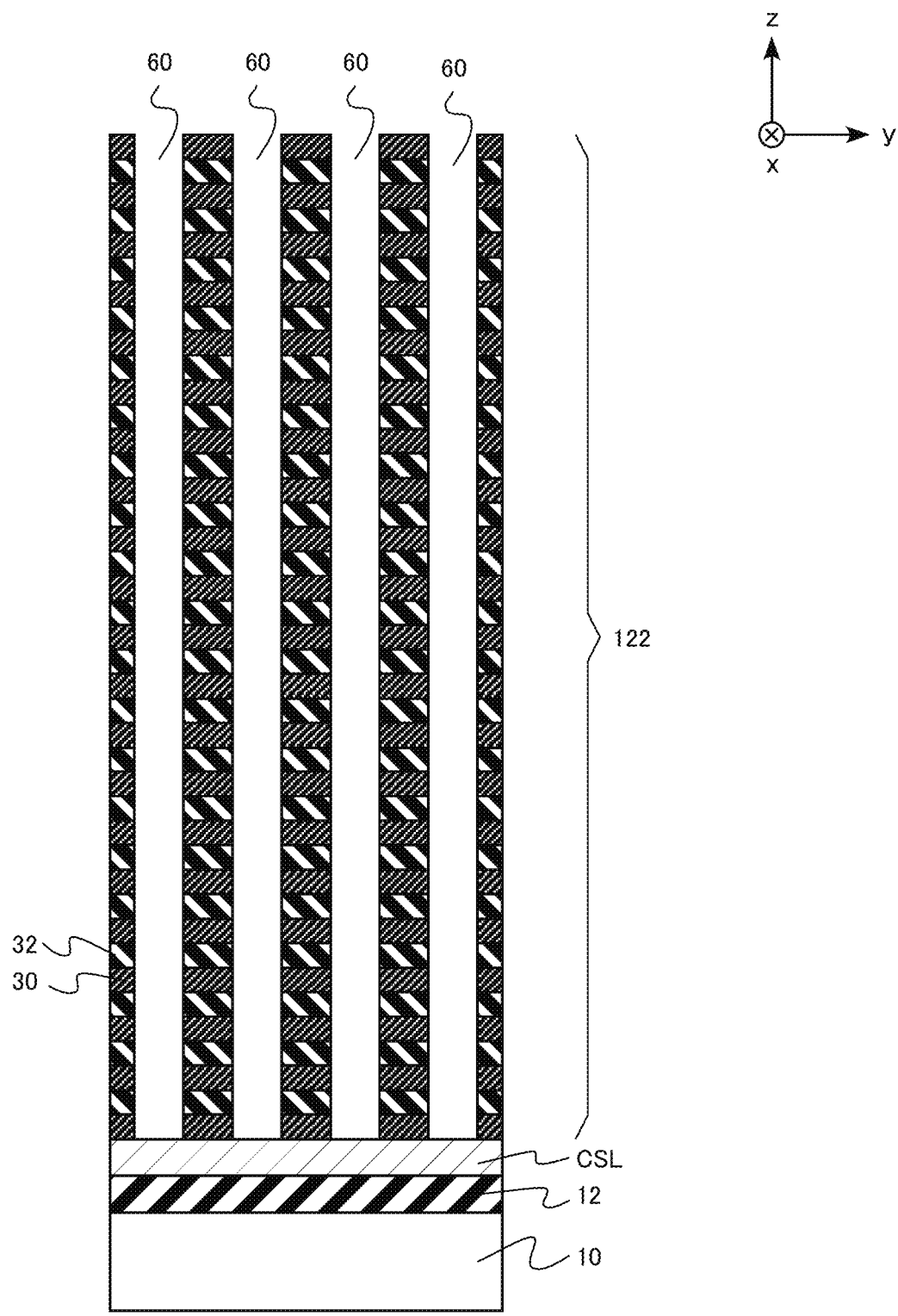
FIG. 72 is a view schematically illustrating the method for manufacturing the semiconductor memory device according to the sixth embodiment.
Figure 73:
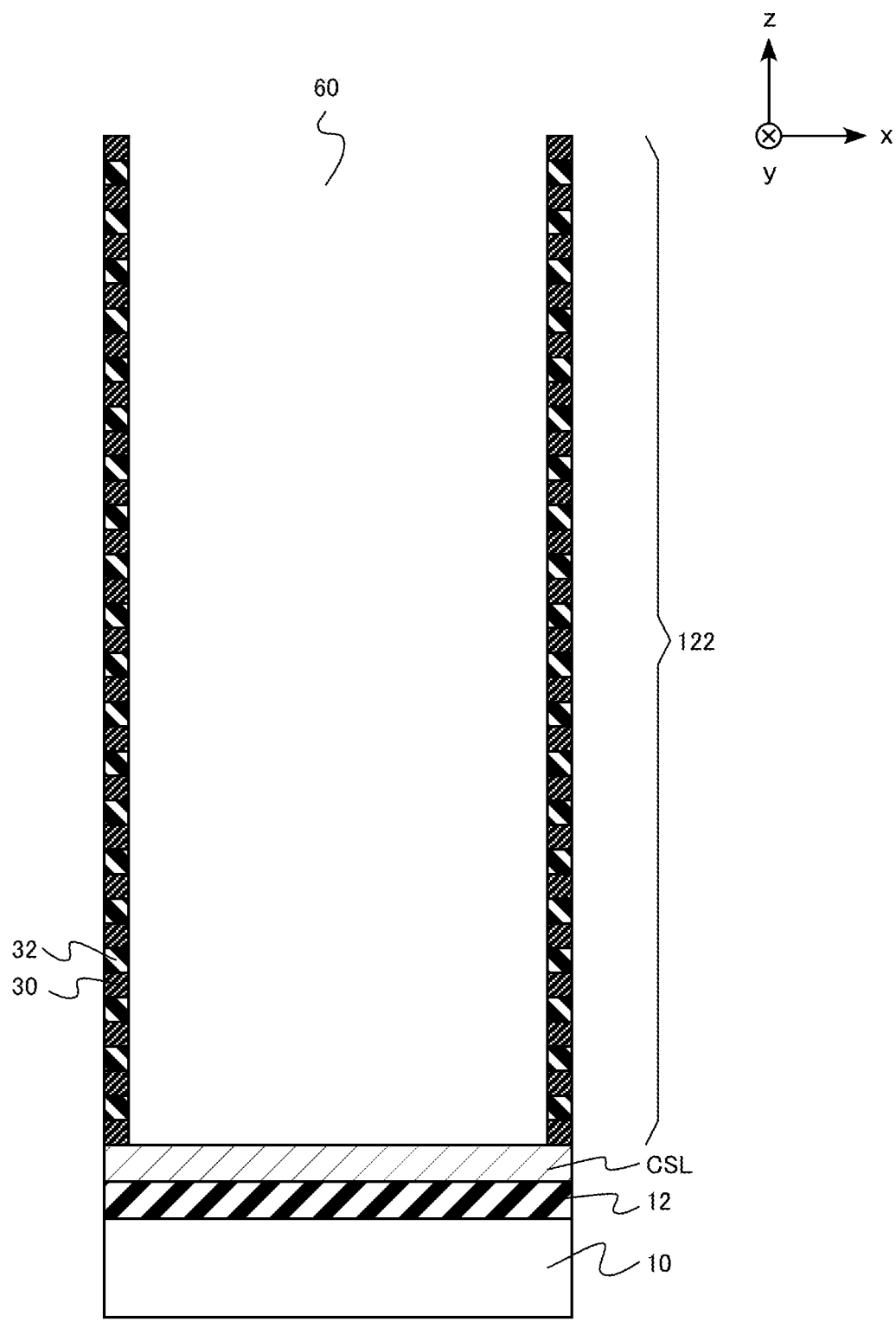
FIG. 73 is a view schematically illustrating the method for manufacturing the semiconductor memory device according to the sixth embodiment.
Figure 74:
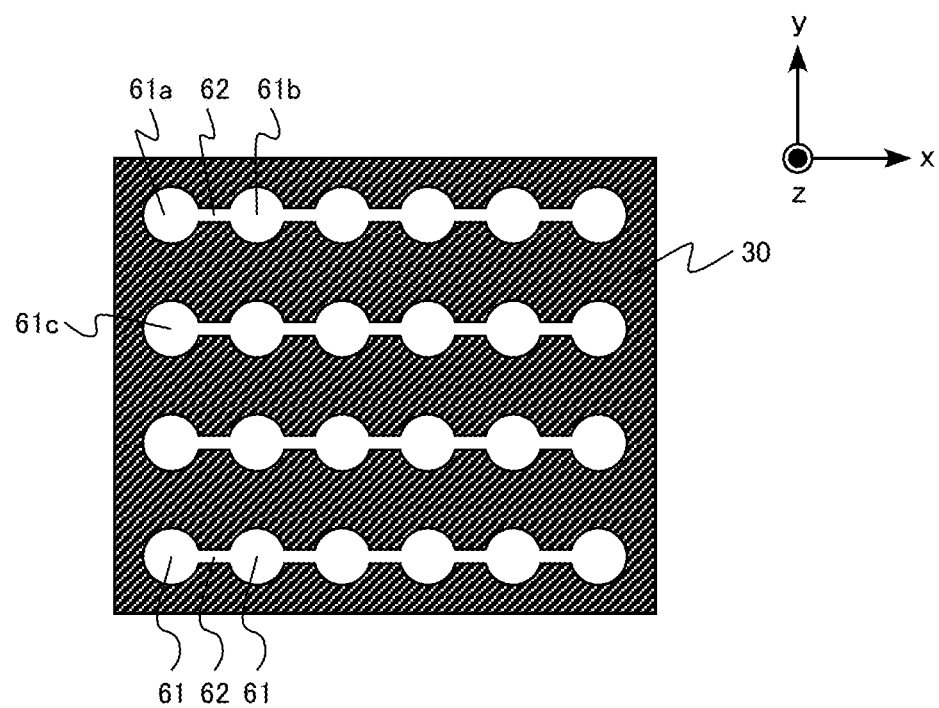
FIG. 74 is a view schematically illustrating the method for manufacturing the semiconductor memory device according to the sixth embodiment.

Then, the processing mask 45 is removed (FIGS. 72 and 73).

The opening hole 60 includes a memory hole 61 and a connection hole 62. The memory hole 61 includes a first memory hole 61a (first hole), a second memory hole 61b (second hole), and a third memory hole 61c (third hole) (FIG. 74). Substantially, the memory hole 61 and the connection hole 62 are not a plurality of independent holes, but are one connected hole. That is, the memory hole 61 and the connection hole 62 may be referred to as a memory hole portion 61 and a connection hole portion 62, respectively.

Figure 75:
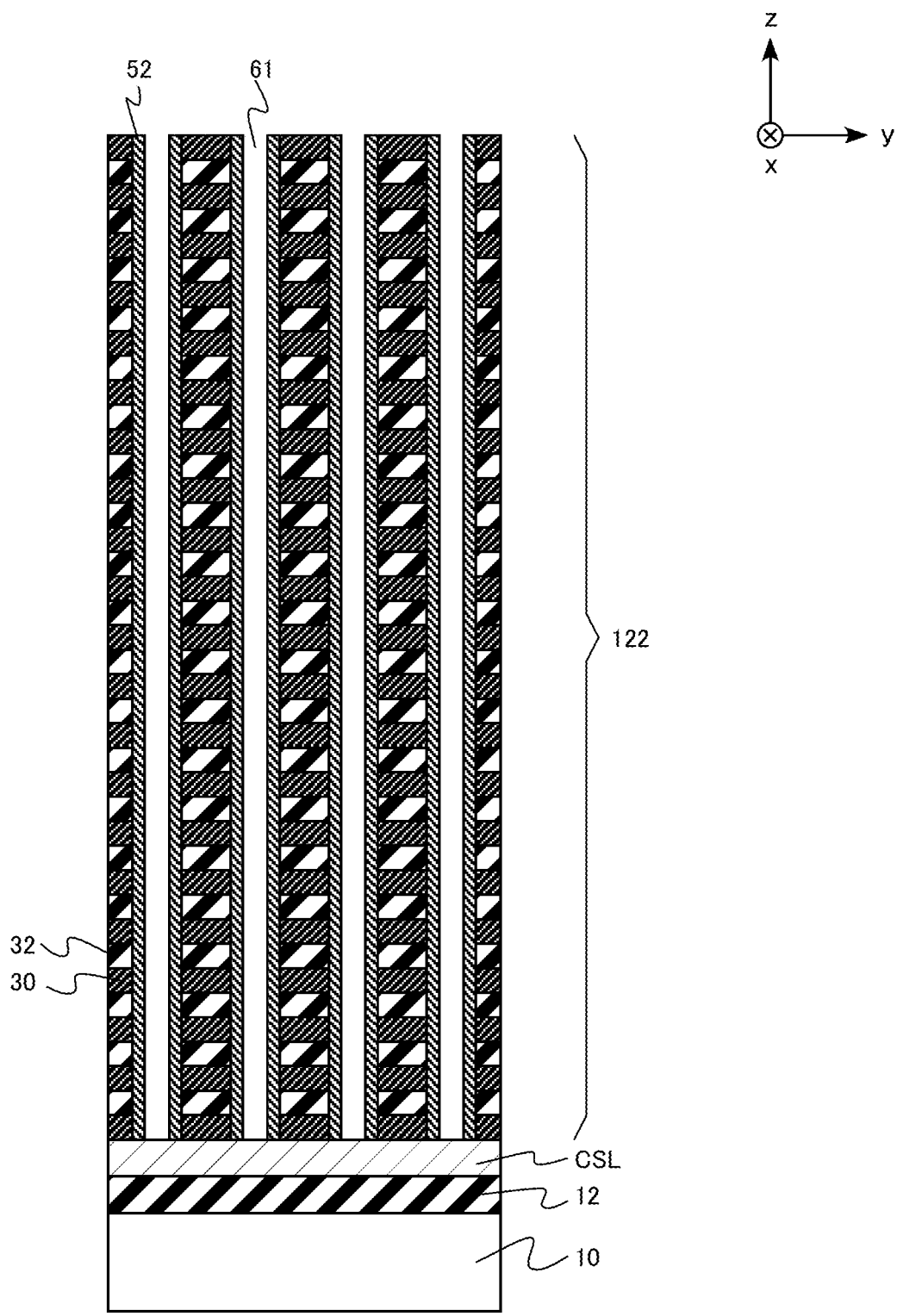
FIG. 75 is a view schematically illustrating the method for manufacturing the semiconductor memory device according to the sixth embodiment.
Figure 76:
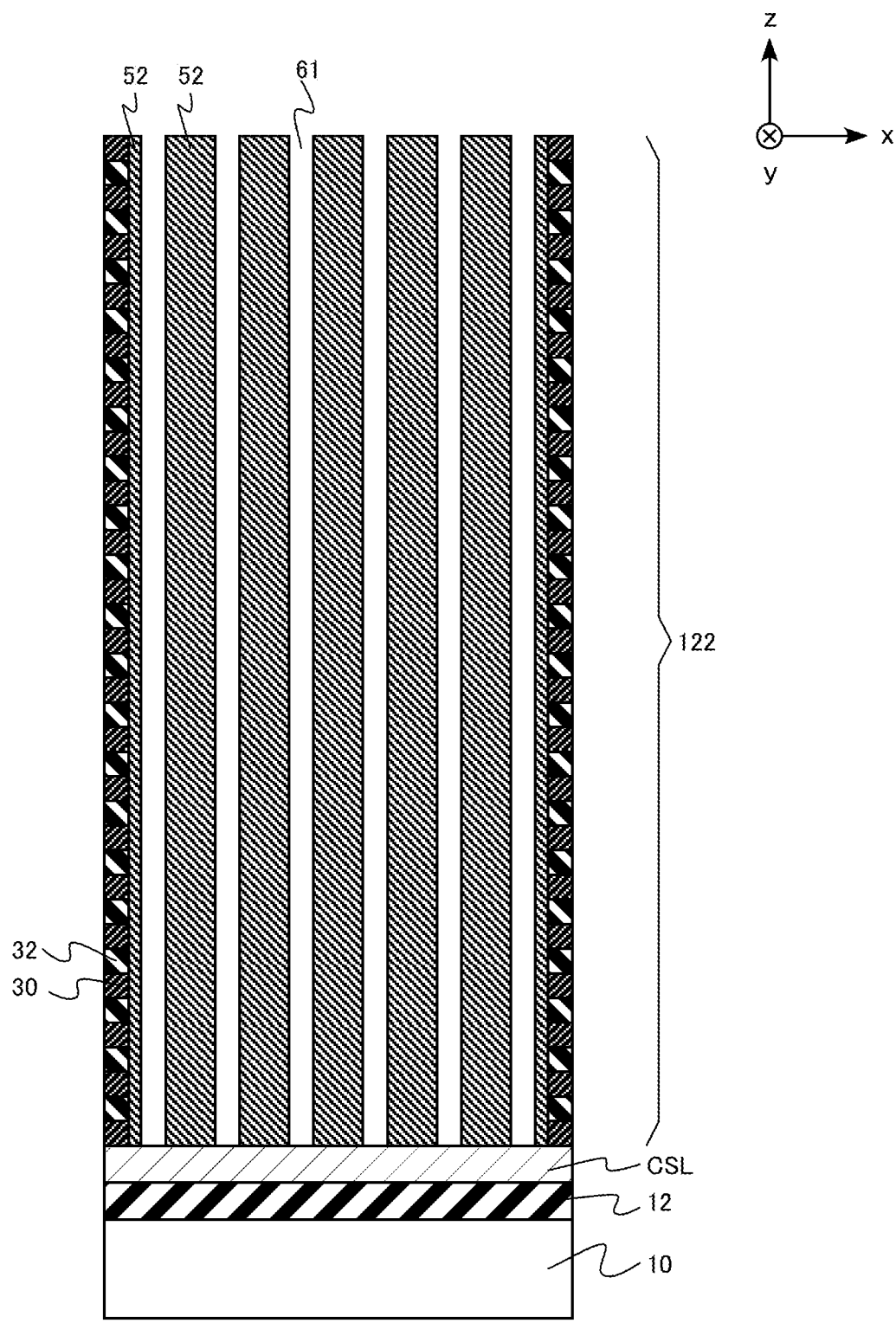
FIG. 76 is a view schematically illustrating the method for manufacturing the semiconductor memory device according to the sixth embodiment.

Then, a stacked film 52 of a silicon oxide film, a silicon nitride film, and a silicon oxide film is formed in the memory hole 61 (FIG. 75 and FIG. 76). The stacked film 52 comes into contact with the silicon nitride layer 32.

The stacked film 52 formed in the first memory hole 61a becomes the first charge accumulation layer 18a. Further, the stacked film 52 formed in the second memory hole 61b becomes the second charge accumulation layer 18b. In addition, the stacked film 52 formed in the third memory hole 61c becomes the third charge accumulation layer 18c.

The connection hole 62 having a smaller width than the memory hole 61 is closed by the stacked film 52. The stacked film 52 is formed on the surface of the stacked body 122 and an exposed portion of the common source line CSL, but is removed by an etch-back method.

Figure 77:
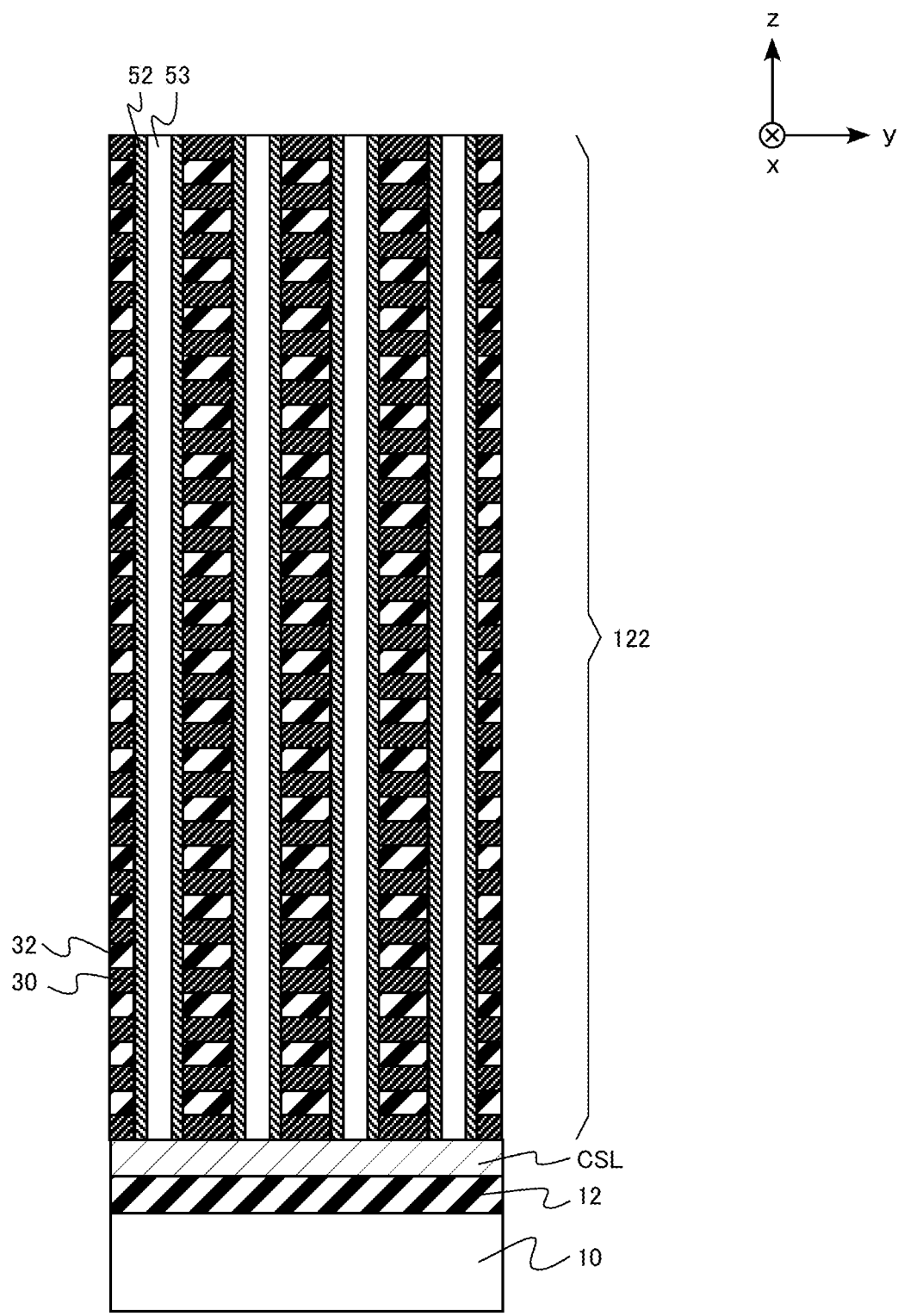
FIG. 77 is a view schematically illustrating the method for manufacturing the semiconductor memory device according to the sixth embodiment.
Figure 78:
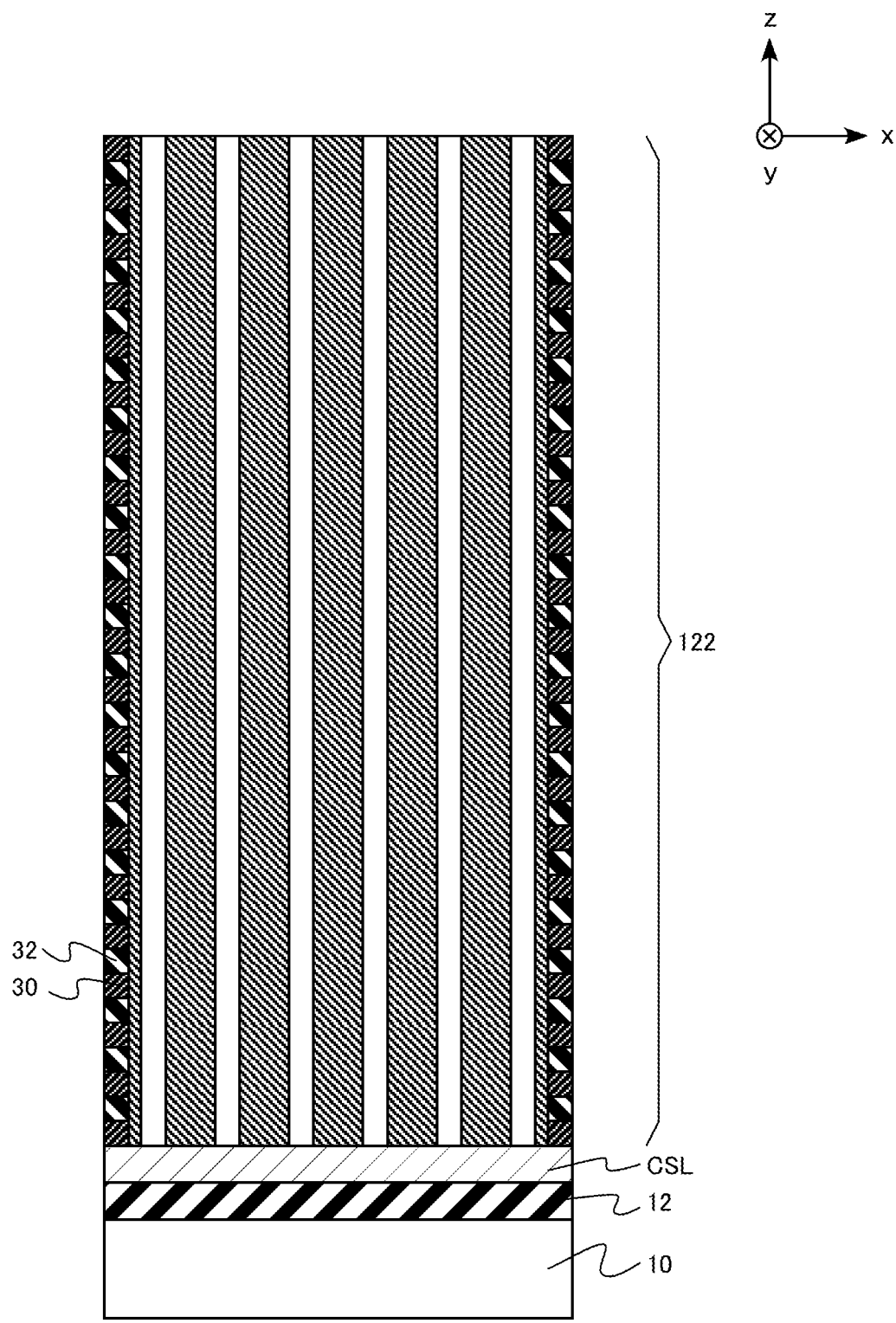
FIG. 78 is a view schematically illustrating the method for manufacturing the semiconductor memory device according to the sixth embodiment.

Then, an amorphous silicon film 53 coming into contact with the stacked film 52 is formed in the memory hole 61 (FIG. 77 and FIG. 78). The amorphous silicon film 53 is heated in the subsequent process and finally becomes the channel layer 16 using polysilicon.

The first channel layer 16a (first semiconductor layer) extending in the z direction is formed so as to come into contact with the first charge accumulation layer 18a provided in the first memory hole 61a. The second channel layer 16b (second semiconductor layer) that extends in the z direction and is separated from the first channel layer 16a (first semiconductor layer) is formed so as to come into contact with the second charge accumulation layer 18b provided in the second memory hole 61b. In addition, the third channel layer 16c (third semiconductor layer) that extends in the z direction and is separated from the first channel layer 16a (first semiconductor layer) and the second channel layer 16b (second semiconductor layer) is formed so as to come into contact with the third charge accumulation layer 18c provided in the third memory hole 61c.

Then, the silicon nitride layer 32 is selectively removed by wet etching using an etching groove (not illustrated). The silicon nitride layer 32 is selectively etched with respect to the silicon oxide layer 30 using, for example, a phosphoric acid solution in the wet etching.

Figure 79:
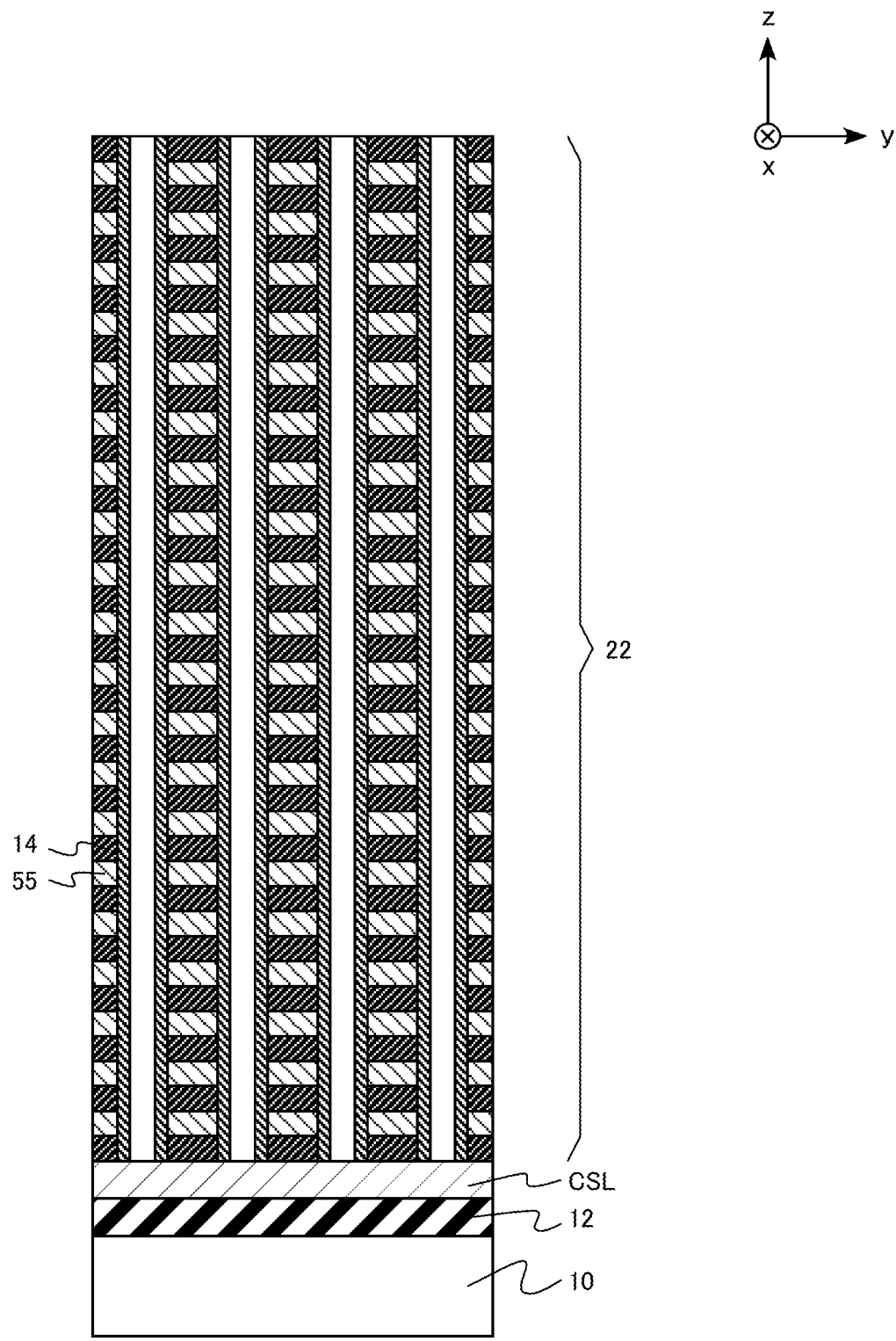
FIG. 79 is a view schematically illustrating the method for manufacturing the semiconductor memory device according to the sixth embodiment.
Figure 80:
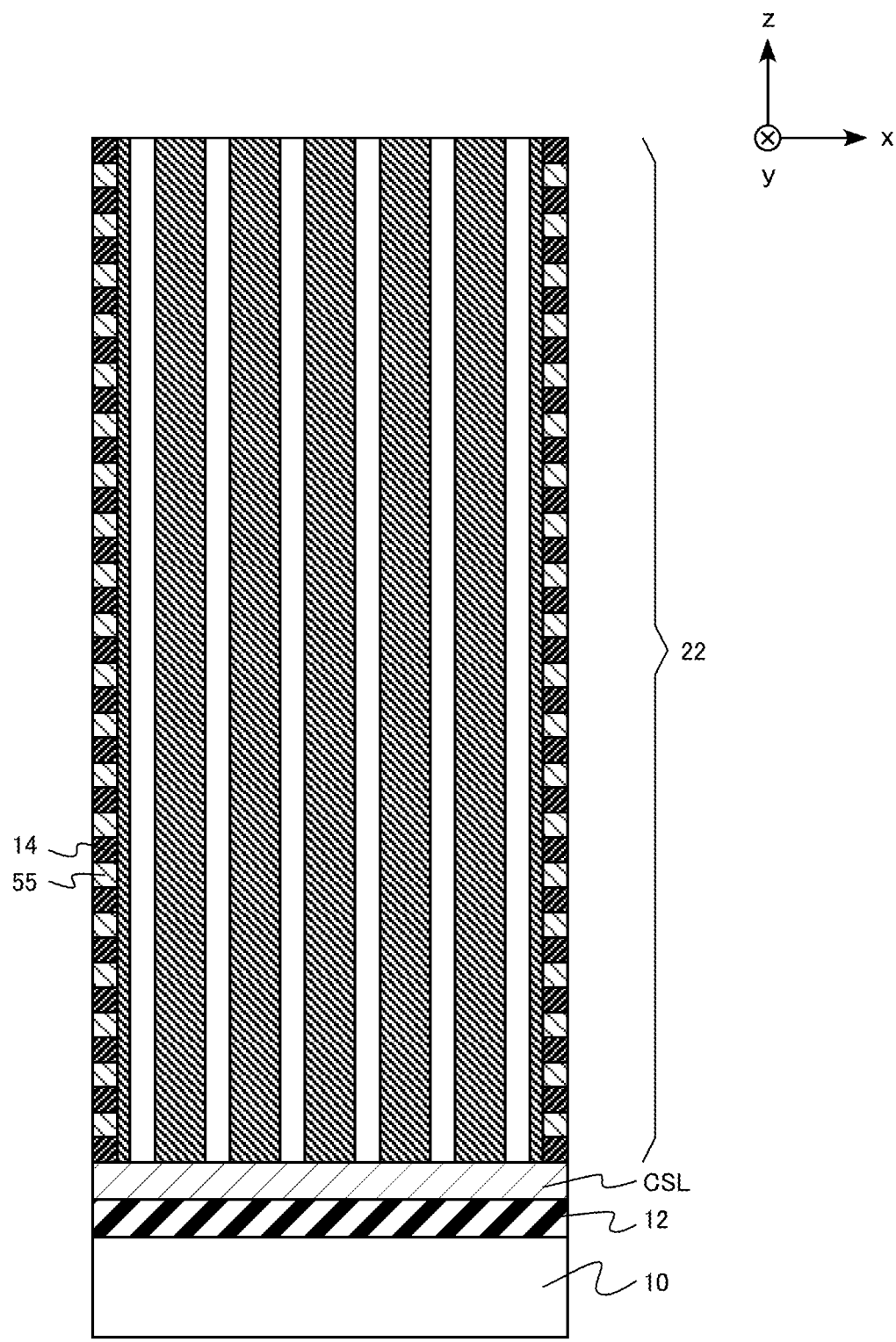
FIG. 80 is a view schematically illustrating the method for manufacturing the semiconductor memory device according to the sixth embodiment.

Then, for example, a tungsten film 55 is formed in a region obtained by removing the silicon nitride layer 32 (FIG. 79 and FIG. 80). The silicon nitride layer 32 is substituted with the tungsten film 55. The tungsten films 55 finally become the word line WL, the source select gate line SGS, and the drain select gate line SGD. The tungsten film 55 is an example of the conductive layer.

Then, a plurality of bit lines BL are formed on the stacked body 122 by a known process technique.

The memory cell array 300 of the semiconductor memory device according to the sixth embodiment is manufactured by the above-mentioned manufacturing method.

In addition, when the stacked body 122 is formed, the second layer may be a conductive layer.

Next, the function and effect of the semiconductor memory device and the semiconductor memory device manufacturing method according to the sixth embodiment will be described.

The three-dimensional NAND flash memory in which the memory cells are three-dimensionally disposed increases the degree of integration and reduces costs. The three-dimensional NAND flash memory may be manufactured, for example, by alternately stacking a plurality of insulating layers and a plurality of gate electrode layers to form a stacked body, forming memory holes penetrating through the stacked body, and forming charge accumulation layers and semiconductor layers in the memory holes to form memory strings in which a plurality of memory cells are connected in series to each other. The capacity of the three-dimensional NAND flash memory may be further increased by increasing the number of gate electrodes stacked in the stacked body or scaling-down the size of the memory hole.

When the number of gate electrodes stacked in the stacked body is increased or when the size of the memory hole is scaled-down, the aspect ratio (depth/width) of the memory hole increases. Therefore, it is difficult to form the memory hole using etching. When the aspect ratio of the memory hole increases, an etching rate may be reduced or etching may be stopped during an etching using the RIE method.

In the memory cell array 300 of the semiconductor memory device according to the sixth embodiment, the charge accumulation layers 18 corresponding to two adjacent channel layers 16 are provided so as to be continuous with each other. Two adjacent memory holes 61 are connected by the connection hole 62. Therefore, the pattern of the processing mask 45 when the memory hole 61 is formed becomes a large pattern in which the patterns of adjacent opening portions 50 are connected by the connection portion 51.

Therefore, when the memory hole 61 is formed by etching, the effective aspect ratio of the memory hole 61 (the aspect ratio of the hole including the memory hole 61 and the connection hole 62) is reduced. Therefore, when a memory hole having a small diameter and a high aspect ratio is formed, it is possible to reduce the possibility that the etching rate will be lowered or the etching will be stopped. As a result, it is possible to further increase the capacity of the three-dimensional NAND flash memory.

As illustrated in FIG. 62, the charge accumulation layers 18 between the word line WL and a plurality of channel layers 16 arranged in the x direction are continuous. In contrast, the charge accumulation layers 18 between the word line WL and a plurality of channel layers 16 arranged in the y direction are separated from each other. Therefore, the word line WL is not separated and isolated by the charge accumulation layer 18. As a result, it is possible to prevent the word line WL from changing to a floating state.

Further, in the memory cell array 300, the first distance (dx in FIG. 64) between the first channel layer 16a and the second channel layer 16b is less than the second distance (dy in FIG. 64) between the first channel layer 16a and the third channel layer 16c. That is, the distance between a plurality of channel layers 16 arranged in the y direction is greater than the distance between a plurality of channel layers 16 arranged in the x direction. This configuration makes it possible to sufficiently increase the width of the word line WL.

Therefore, in particular, when a manufacturing method that substitutes the second layer as an insulator with a conductive layer to form the word line WL, the source select gate line SGS, and the drain select gate line SGD is applied, it is easy to remove the insulator and to deposit the conductive layer. As a result, it is possible to stably form the word line WL, the source select gate line SGS, and the drain select gate line SGD.

It is preferable that the second distance (dy in FIG. 64) between the first channel layer 16a and the third channel layer 16c is equal to or greater than 1.2 times the first distance (dx in FIG. 64) between the first channel layer 16a and the second channel layer 16b and is equal to or less than two times the first distance. In a case where the second distance dy is equal to or greater than 1.2 times the first distance dx, it is possible to more stably form the word line WL. In a case where the second distance dy is equal to or less than two times the first distance dx, the density of the memory holes 61 increases and the capacity of the three-dimensional NAND flash memory further increases.

As described above, according to the semiconductor memory device and the semiconductor memory device manufacturing method of the sixth embodiment, it is possible to form a memory hole with a high aspect ratio. Therefore, it is possible to provide a semiconductor memory device and a semiconductor memory device manufacturing method that can increase capacity.

Seventh Embodiment

A semiconductor memory device according to a seventh embodiment is different from the semiconductor memory device according to the sixth embodiment in that the first charge accumulation layer includes a first tunnel insulating film, a first semiconductor film provided between the first tunnel insulating film and the gate electrode layer, and a first block insulating film provided between the first semiconductor film and the gate electrode layer; the second charge accumulation layer includes a second tunnel insulating film, a second semiconductor film provided between the second tunnel insulating film and the gate electrode layer, and a second block insulating film provided between the second semiconductor film and the gate electrode layer; the third charge accumulation layer includes a third tunnel insulating film, a third semiconductor film provided between the third tunnel insulating film and the gate electrode layer, and a third block insulating film provided between the third semiconductor film and the gate electrode layer; and the first semiconductor film is separated from the second semiconductor film and the first block insulating film is continuous with the second block insulating film in the first plane. Hereinafter, in some cases, a portion of the description of the same content as that in the sixth embodiment will be omitted.

Figure 81:
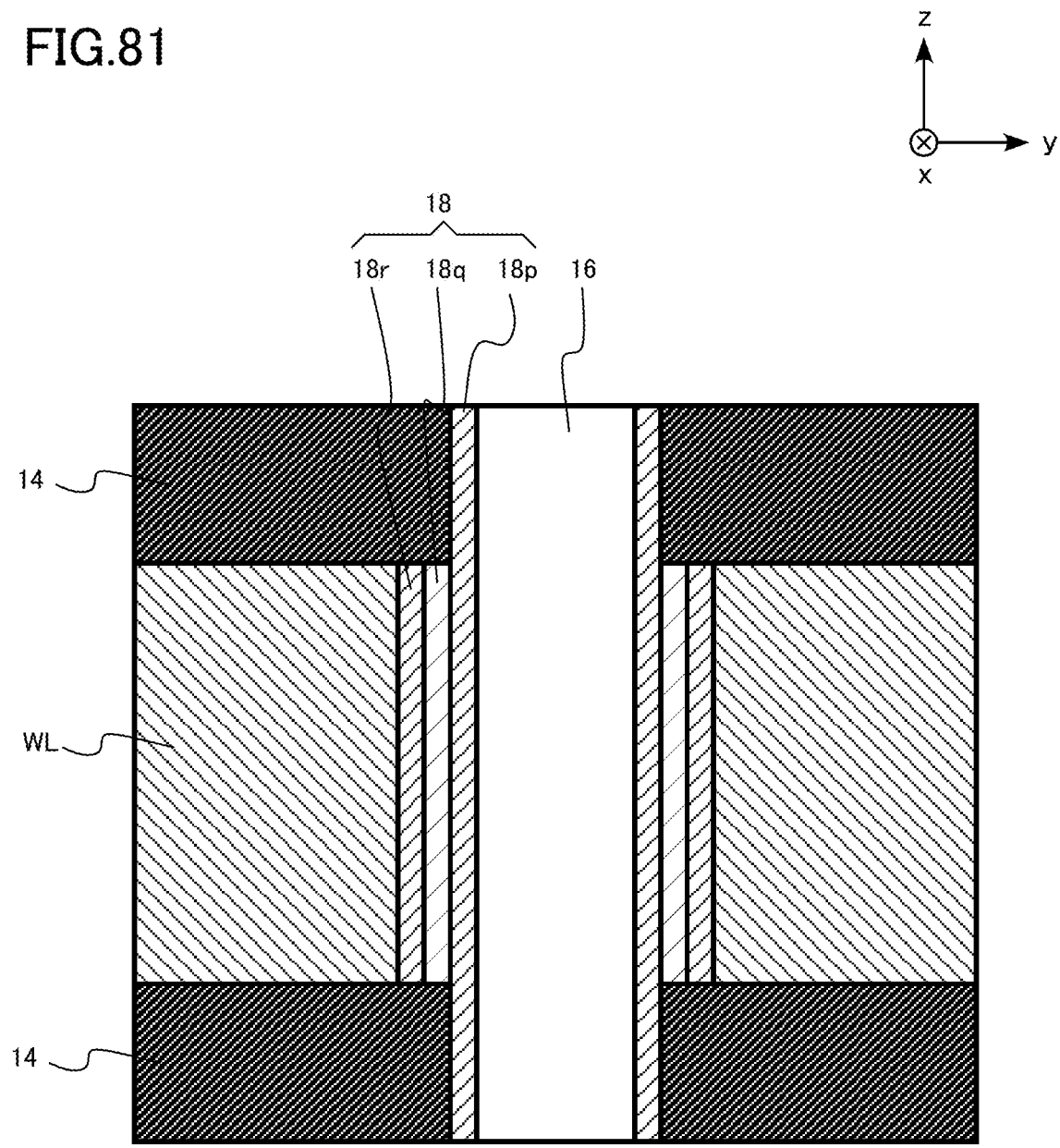
FIG. 81 is a cross-sectional view schematically illustrating a memory cell of a semiconductor memory device according to a seventh embodiment.

FIG. 81 is a cross-sectional view schematically illustrating a memory cell of the semiconductor memory device according to the seventh embodiment. FIG. 81 is a cross-sectional view illustrating a memory cell MC. FIG. 81 illustrates a cross section of the memory cell MC parallel to the z direction. FIG. 81 corresponds to the region (MC in FIG. 60) surrounded by the rectangle in FIG. 60.

As illustrated in FIG. 81, for example, a charge accumulation layer 18 includes a tunnel insulating film 18p, a semiconductor film 18q, and a block insulating film 18r. The semiconductor film 18q is located between the tunnel insulating film 18p and the block insulating film 18r. The block insulating film 18r is located between the semiconductor film 18q and the word line WL. For example, a silicon oxide film, a polysilicon film, and a silicon oxide film are used as the tunnel insulating film 18p, the semiconductor film 18q, and the block insulating film 18r, respectively.

The tunnel insulating film 18p has a function of selectively transmitting charge. The semiconductor film 18q has a function of accumulating charge. The block insulating film 18r has a function of blocking a current flowing between the semiconductor film 18q and the word line WL. The memory cell MC is a so-called floating-gate memory cell.

The channel layer 16 or the tunnel insulating film 18p comes into contact with the interlayer insulating layer 14. In other words, the semiconductor film 18q is divided between the memory cells MC adjacent to each other in the z direction.

Figure 82:
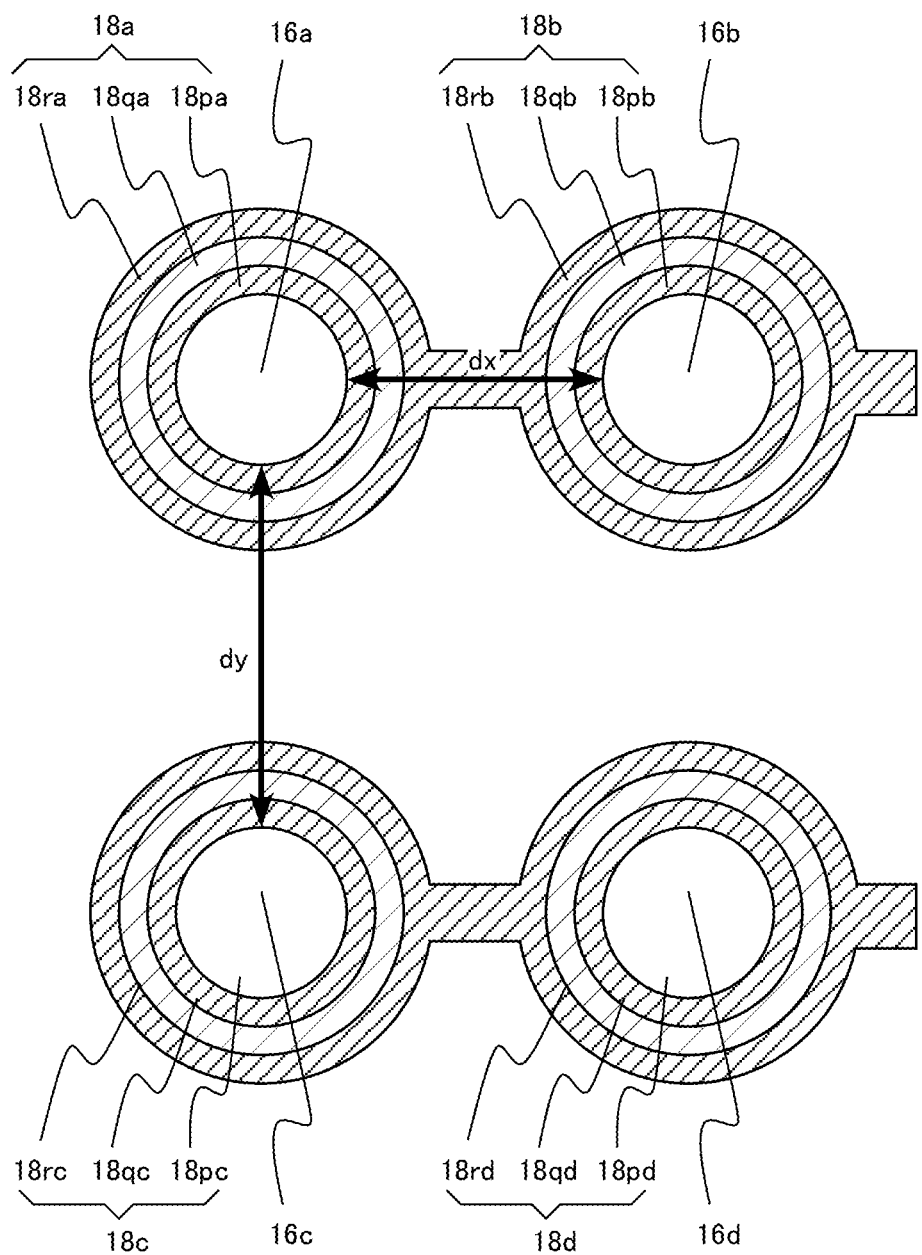
FIG. 82 is a cross-sectional view schematically illustrating a portion of a memory cell array of the semiconductor memory device according to the seventh embodiment.

FIG. 82 is a cross-sectional view schematically illustrating a portion of a memory cell array of the semiconductor memory device according to the seventh embodiment. FIG. 82 is a cross-sectional view corresponding to FIG. 64 in the sixth embodiment. In FIG. 82, the word line WL is not illustrated.

As illustrated in FIG. 82, at least a portion of a first charge accumulation layer 18a is continuous with at least a portion of a second charge accumulation layer 18b in the first plane perpendicular to the z direction, the first plane including the word line WL. Further, at least a portion of a third charge accumulation layer 18c is continuous with at least a portion of a fourth charge accumulation layer 18d.

For example, as illustrated in FIG. 82, a block insulating film 18ra of the first charge accumulation layer 18a is continuous with a block insulating film 18rb of the second charge accumulation layer 18b. A semiconductor film 18qa of the first charge accumulation layer 18a is separated from a semiconductor film 18qb of the second charge accumulation layer 18b. A tunnel insulating film 18pa of the first charge accumulation layer 18a is separated from a tunnel insulating film 18pb of the second charge accumulation layer 18b.

Further, a block insulating film 18rc of the third charge accumulation layer 18c is continuous with a block insulating film 18rd of the fourth charge accumulation layer 18d. A semiconductor film 18qc of the third charge accumulation layer 18c is separated from a semiconductor film 18qd of the fourth charge accumulation layer 18d. Furthermore, a tunnel insulating film 18pc of the third charge accumulation layer 18c is separated from a tunnel insulating film 18pd of the fourth charge accumulation layer 18d.

In contrast, in the first plane, the first charge accumulation layer 18a is separated from the third charge accumulation layer 18c. The second charge accumulation layer 18b is separated from the third charge accumulation layer 18c. Further, the first charge accumulation layer 18a is separated from the fourth charge accumulation layer 18d. In addition, the second charge accumulation layer 18b is separated from the fourth charge accumulation layer 18d.

The word line WL is located between the first charge accumulation layer 18a and the third charge accumulation layer 18c. The word line WL is located between the second charge accumulation layer 18b and the third charge accumulation layer 18c. The word line WL is located between the first charge accumulation layer 18a and the fourth charge accumulation layer 18d. The word line WL is located between the second charge accumulation layer 18b and the fourth charge accumulation layer 18d.

In the first plane, a first distance (dx in FIG. 82) between a first channel layer 16a and a second channel layer 16b is less than a second distance (dy in FIG. 82) between the first channel layer 16a and a third channel layer 16c. For example, the second distance dy is equal to or greater than 1.2 times the first distance dx and is equal to or less than two times the first distance dx.

As described above, according to the semiconductor memory device of the seventh embodiment, similarly to the sixth embodiment, it is possible to form a memory hole with a high aspect ratio. Therefore, it is possible to provide a semiconductor memory device capable of increasing capacity.

Eighth Embodiment

A semiconductor memory device according to an eighth embodiment is different from the semiconductor memory device according to the sixth embodiment in the arrangement of memory holes. Hereinafter, in some cases, a portion of the description of the same content as that in the sixth embodiment will be omitted.

Figure 83:
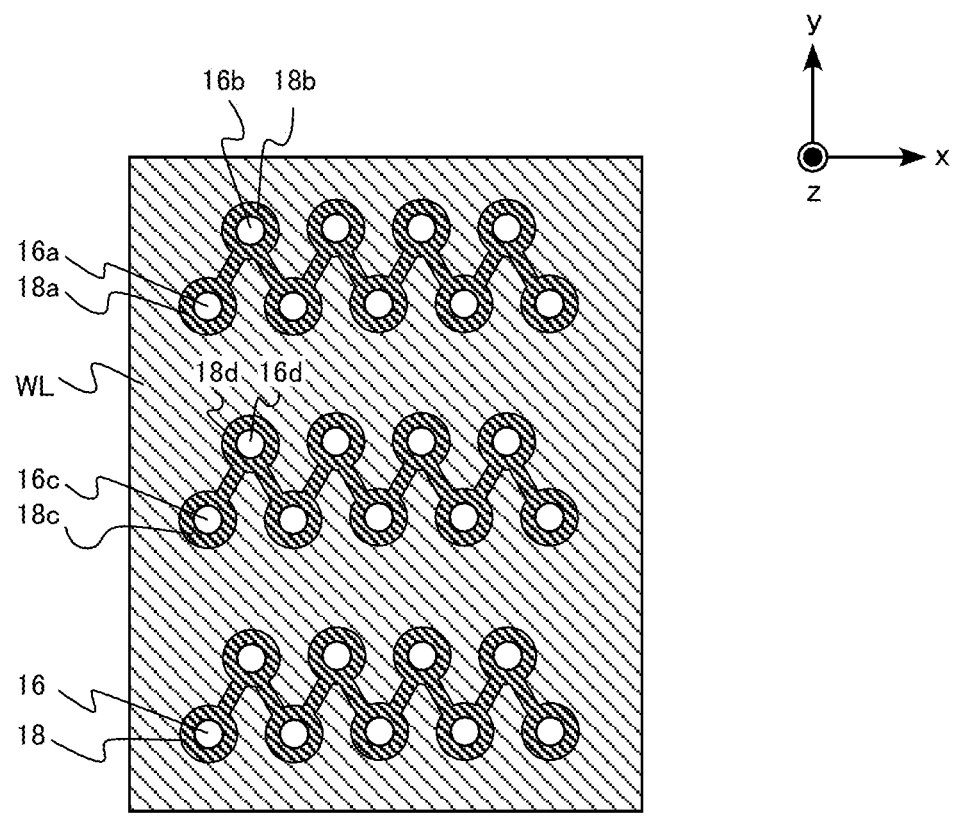
FIG. 83 is a cross-sectional view schematically illustrating a portion of a memory cell array of a semiconductor memory device according to an eighth embodiment.

FIG. 83 is a cross-sectional view schematically illustrating a portion of a memory cell array of the semiconductor memory device according to the eighth embodiment. FIG. 83 illustrates a cross section of the memory cell array parallel to the x direction and the y direction. FIG. 83 illustrates the cross section of the memory cell array perpendicular to the z direction. FIG. 83 illustrates a plane perpendicular to the z direction (first direction), the plane including the word line WL (gate electrode layer). FIG. 83 illustrates the cross section corresponding to FIG. 62 in the sixth embodiment.

The channel layers 16 are disposed in zigzag. As illustrated in FIG. 83, the charge accumulation layers 18 between the word line WL and a plurality of channel layers 16 arranged in zigzag in the x direction are continuous. In contrast, the charge accumulation layers 18 between the word line WL and a plurality of channel layers 16 arranged in the y direction are separated from each other.

As illustrated in FIG. 83, a first charge accumulation layer 18a is continuous with a second charge accumulation layer 18b in the first plane perpendicular to the z direction, the first plane including the word line WL. In addition, a third charge accumulation layer 18c is continuous with a fourth charge accumulation layer 18d.

In contrast, in the first plane, the first charge accumulation layer 18a is separated from the third charge accumulation layer 18c. In addition, the second charge accumulation layer 18b is separated from the third charge accumulation layer 18c. Further, the first charge accumulation layer 18a is separated from the fourth charge accumulation layer 18d. Furthermore, the second charge accumulation layer 18b is separated from the fourth charge accumulation layer 18d.

The word line WL is located between the first charge accumulation layer 18a and the third charge accumulation layer 18c. The word line WL is located between the second charge accumulation layer 18b and the third charge accumulation layer 18c. The word line WL is located between the first charge accumulation layer 18a and the fourth charge accumulation layer 18d. The word line WL is located between the second charge accumulation layer 18b and the fourth charge accumulation layer 18d.

In the first plane, a first distance between a first channel layer 16a and a second channel layer 16b is less than a second distance between the first channel layer 16a and a third channel layer 16c. For example, the second distance is equal to or greater than 1.2 times the first distance and is equal to or less than two times the first distance.

As described above, according to the semiconductor memory device of the eighth embodiment, similarly to the sixth embodiment, it is possible to form a memory hole with a high aspect ratio. Therefore, it is possible to provide a semiconductor memory device capable of increasing capacity.

Ninth Embodiment

A semiconductor memory device according to a ninth embodiment is different from the semiconductor memory device according to the sixth embodiment in the arrangement of memory holes. Hereinafter, in some cases, a portion of the description of the same content as that in the sixth embodiment will be omitted.

Figure 84:
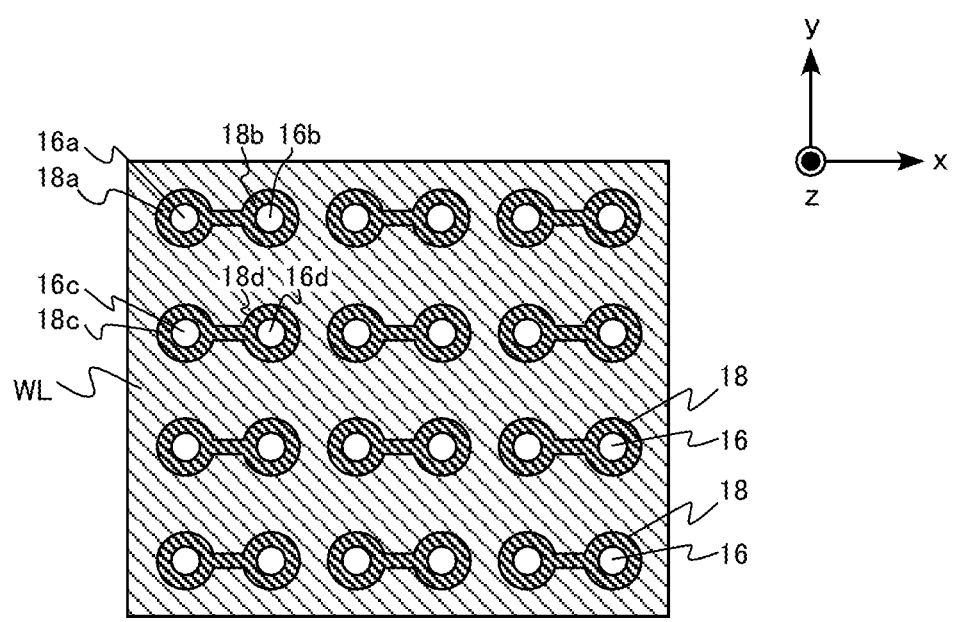
FIG. 84 is a cross-sectional view schematically illustrating a portion of a memory cell array of a semiconductor memory device according to a ninth embodiment.

FIG. 84 is a cross-sectional view schematically illustrating a portion of a memory cell array of the semiconductor memory device according to the ninth embodiment. FIG. 84 illustrates a cross section of the memory cell array parallel to the x direction and the y direction. FIG. 84 illustrates the cross section of the memory cell array perpendicular to the z direction. FIG. 84 illustrates a plane perpendicular to the z direction (first direction), the plane including the word line WL (gate electrode layer). FIG. 84 illustrates the cross section corresponding to FIG. 62 in the sixth embodiment.

As illustrated in FIG. 84, the charge accumulation layers 18 between the word line WL and two channel layers 16 arranged in the x direction are continuous. In contrast, the charge accumulation layers 18 between the word line WL and a plurality of channel layers 16 arranged in the y direction are separated from each other.

The charge accumulation layers 18 between two channel layers 16, which are arranged in the x direction and on which the charge accumulation layers 18 are formed so as to be continuous with each other, and the channel layers 16 adjacent in the x direction are separated from each other. For example, two channel layers 16, on which the charge accumulation layers 18 are formed so as to be continuous with each other, are repeatedly disposed in the x direction.

In the first plane, a first charge accumulation layer 18a is separated from a third charge accumulation layer 18c. In addition, a second charge accumulation layer 18b is separated from the third charge accumulation layer 18c. Further, the first charge accumulation layer 18a is separated from a fourth charge accumulation layer 18d. Furthermore, the second charge accumulation layer 18b is separated from the fourth charge accumulation layer 18d.

The word line WL is located between the first charge accumulation layer 18a and the third charge accumulation layer 18c. The word line WL is located between the second charge accumulation layer 18b and the third charge accumulation layer 18c. The word line WL is located between the first charge accumulation layer 18a and the fourth charge accumulation layer 18d. The word line WL is located between the second charge accumulation layer 18b and the fourth charge accumulation layer 18d.

In the first plane, a first distance between a first channel layer 16a and a second channel layer 16b is less than a second distance between the first channel layer 16a and a third channel layer 16c. For example, the second distance is equal to or greater than 1.2 times the first distance and is equal to or less than two times the first distance.

As described above, according to the semiconductor memory device of the ninth embodiment, similarly to the sixth embodiment, it is possible to form a memory hole with a high aspect ratio. Therefore, it is possible to provide a semiconductor memory device capable of increasing capacity.

In the first to ninth embodiments, the insulating layer between the word lines WL may be, for example, a cavity.

While certain embodiments have been described, these embodiments have been presented by way of example only, and are not intended to limit the scope of the inventions. Indeed, the semiconductor memory devices and the semiconductor memory device manufacturing methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a stacked body including a plurality of first insulating layers and a plurality of gate electrode layers alternately stacked in a first direction;
   a first semiconductor layer provided in the stacked body, the first semiconductor layer extending in the first direction;
   a second semiconductor layer provided in the stacked body, the second semiconductor layer extending in the first direction;
   a third semiconductor layer provided in the stacked body, the third semiconductor layer extending in the first direction;
   a first charge accumulation layer provided between the gate electrode layers and the first semiconductor layer;
   a second charge accumulation layer provided between the gate electrode layers and the second semiconductor layer;
   a third charge accumulation layer provided between the gate electrode layers and the third semiconductor layer; and
   a second insulating layer provided in the stacked body, the second insulating layer extending in the first direction, the second insulating layer being in contact with the first semiconductor layer or the first charge accumulation layer in a plane perpendicular to the first direction, the second insulating layer being in contact with the second semiconductor layer or the second charge accumulation layer in the plane, and the second insulating layer being in contact with the third semiconductor layer or the third charge accumulation layer in the plane, the plane including one of the gate electrode layers,
   wherein a first distance between two end surfaces of the gate electrode layers having the second insulating layer interposed therebetween monotonically increases from a first gate electrode layer among the gate electrode layers to a second gate electrode layer among the gate electrode layers in a first cross section parallel to the first direction, the second gate electrode layer being separated from the first gate electrode layer in the first direction, the first cross section including the second insulating layer, and
   a second distance between two end surfaces of the gate electrode layers having the second insulating layer interposed therebetween monotonically increases from the first gate electrode layer in the first direction, decreases, and monotonically increases toward the second gate electrode layer in a second cross section parallel to the first direction, the second cross section including the second insulating layer, the second cross section being different from the first cross section.

2. The semiconductor memory device according to claim 1,
wherein the first cross section includes at least one of the first semiconductor layer, the second semiconductor layer, and the third semiconductor layer, and
the second cross section does not include any of the first semiconductor layer, the second semiconductor layer, and the third semiconductor layer.

3. The semiconductor memory device according to claim 1, further comprising:
a fourth semiconductor layer provided in the stacked body, the fourth semiconductor layer extending in the first direction; and
a fourth charge accumulation layer provided between the gate electrode layers and the fourth semiconductor layer,
wherein the second insulating layer is in contact with the fourth semiconductor layer or the fourth charge accumulation layer.

4. The semiconductor memory device according to claim 1,
wherein each of the first charge accumulation layer, the second charge accumulation layer, and the third charge accumulation layer includes a tunnel insulating film, a semiconductor film provided between the tunnel insulating film and the gate electrode layers, and a block insulating film provided between the semiconductor film and the gate electrode layers.

5. A semiconductor memory device comprising:
a stacked body including a plurality of first insulating layers and a plurality of gate electrode layers alternately stacked in a first direction;
a first semiconductor layer provided in the stacked body, the first semiconductor layer extending in the first direction;
a second semiconductor layer provided in the stacked body, the second semiconductor layer extending in the first direction;
a third semiconductor layer provided in the stacked body, the third semiconductor layer extending in the first direction;
a first charge accumulation layer provided between the gate electrode layers and the first semiconductor layer;
a second charge accumulation layer provided between the gate electrode layers and the second semiconductor layer;
a third charge accumulation layer provided between the gate electrode layers and the third semiconductor layer; and
a second insulating layer provided in the stacked body, the second insulating layer extending in the first direction, the second insulating layer being in contact with the first semiconductor layer or the first charge accumulation layer in a plane perpendicular to the first direction, the second insulating layer being in contact with the second semiconductor layer or the second charge accumulation layer in the plane, and the second insulating layer being in contact with the third semiconductor layer or the third charge accumulation layer in the plane, the plane including the gate electrode layers,
wherein the second insulating layer is not included in a first plane perpendicular to the first direction, the first plane including the first semiconductor layer, and the second insulating layer is included in a second plane located in the first direction with respect to the first plane, the second plane being perpendicular to the first direction, the second plane including the first semiconductor layer.

6. The semiconductor memory device according to claim 5,
wherein one of the gate electrode layers is located in a region surrounded by a line segment connecting the first semiconductor layer and the second semiconductor layer, a line segment connecting the second semiconductor layer and the third semiconductor layer, and a line segment connecting the third semiconductor layer and the first semiconductor layer in the first plane.

7. The semiconductor memory device according to claim 5, further comprising:
a first conductive line extending in a second direction perpendicular to the first direction;
a second conductive line extending in the second direction;
a third conductive line located in the first direction with respect to the first conductive line and the second conductive line, the third conductive line extending in a third direction, the stacked body being interposed between the third conductive line and the first and second conductive lines, the third direction being perpendicular to the first direction, the third direction intersecting the second direction; and
a fourth conductive line located in the first direction with respect to the first conductive line and the second conductive line, the fourth conductive line extending in the third direction, the stacked body being interposed between the fourth conductive line and the first and second conductive lines,
wherein one end of the second semiconductor layer and one end of the third semiconductor layer are electrically connected to the first conductive line,
one end of the first semiconductor layer is electrically connected to the second conductive line,
another end of the first semiconductor layer and another end of the second semiconductor layer are electrically connected to the third conductive line, and
another end of the third semiconductor layer is electrically connected to the fourth conductive line.

8. The semiconductor memory device according to claim 7, further comprising:
a fourth semiconductor layer provided in the stacked body, the fourth semiconductor layer extending in the first direction; and
a fourth charge accumulation layer provided between the gate electrode layers and the fourth semiconductor layer,
wherein the second insulating layer is in contact with the fourth semiconductor layer or the fourth charge accumulation layer,
one end of the fourth semiconductor layer is electrically connected to the second conductive line, and
another end of the fourth semiconductor layer is electrically connected to the fourth conductive line.

9. The semiconductor memory device according to claim 5,
wherein each of the first charge accumulation layer, the second charge accumulation layer, and the third charge accumulation layer includes a tunnel insulating film, a semiconductor film provided between the tunnel insulating film and the gate electrode layers, and a block insulating film provided between the semiconductor film and the gate electrode layers.

\* \* \* \* \*